(12) United States Patent
Tateishi et al.

(10) Patent No.: US 7,537,953 B2
(45) Date of Patent: May 26, 2009

(54) MANUFACTURING METHOD OF MICROSTRUCTURE AND MICROELECTROMECHANICAL SYSTEM

(75) Inventors: Fuminori Tateishi, Kanagawa (JP); Konami Izumi, Kanagawa (JP); Mayumi Yamaguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 204 days.

(21) Appl. No.: 11/557,353

(22) Filed: Nov. 7, 2006

(65) Prior Publication Data

US 2007/0111365 A1 May 17, 2007

(30) Foreign Application Priority Data

Nov. 11, 2005 (JP) ............................. 2005-327538

(51) Int. Cl.
  *G01R 31/26* (2006.01)
(52) U.S. Cl. ........................................................ 438/53
(58) Field of Classification Search .................. 438/50, 438/51, 421, 53
  See application file for complete search history.

(56) References Cited

U.S. PATENT DOCUMENTS

| 6,566,041 | B2 | 5/2003 | Iwasaki et al. |
| 6,716,570 | B2 | 4/2004 | Nagarajan et al. |
| 6,767,694 | B2 | 7/2004 | Kido |
| 6,864,021 | B2 | 3/2005 | Iwasaki et al. |
| 7,074,634 | B2* | 7/2006 | Foglietti et al. ............... 438/50 |
| 7,303,934 | B2* | 12/2007 | Van Beek et al. ............. 438/48 |
| 7,368,378 | B2* | 5/2008 | Ahn et al. .................... 438/643 |
| 2001/0007732 | A1 | 7/2001 | Iwasaki et al. |
| 2002/0006682 | A1* | 1/2002 | Benzel et al. ................. 438/50 |
| 2002/0123241 | A1 | 9/2002 | Kido |
| 2003/0104289 | A1 | 6/2003 | Iwasaki et al. |
| 2003/0104290 | A1 | 6/2003 | Iwasaki et al. |
| 2003/0219683 | A1 | 11/2003 | Nagarajan et al. |
| 2004/0161869 | A1* | 8/2004 | Kang .......................... 438/50 |

FOREIGN PATENT DOCUMENTS

| JP | 07-163158 | 6/1995 |
| JP | 08-044038 | 2/1996 |
| JP | 3086003 | 7/2000 |
| JP | 2001-194769 | 7/2001 |
| JP | 2002-258486 | 9/2002 |

* cited by examiner

*Primary Examiner*—W. David Coleman
(74) *Attorney, Agent, or Firm*—Fish & Richardson P.C.

(57) ABSTRACT

To reduce the number of photomasks which are used to form sacrificial layers for producing spaces of a microstructure, thereby reducing the manufacturing cost. Sacrificial layers are formed by using resist masks which are patterned with the same photomask. Specifically, after forming a first sacrificial layer by etching using a resist mask, a second sacrificial layer is formed by etching using a resist mask which is pattered with same photomask as the resist mask of the first sacrificial layer. By deforming one of the resist masks before etching its corresponding sacrificial layer, for example by increasing or reducing the external dimension of the resist mask, sacrificial layers having different sizes from each other can be formed.

38 Claims, 31 Drawing Sheets

FIG. 1A
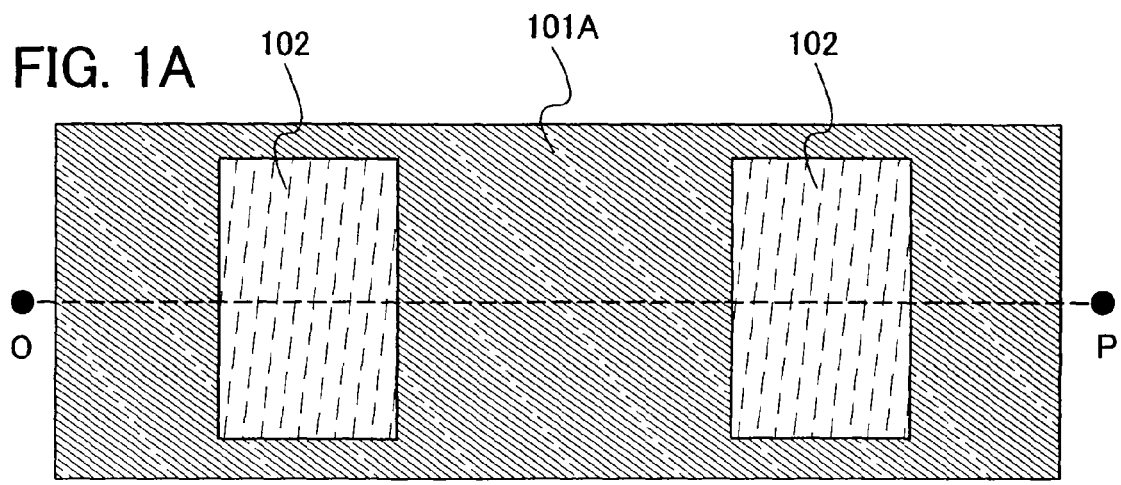
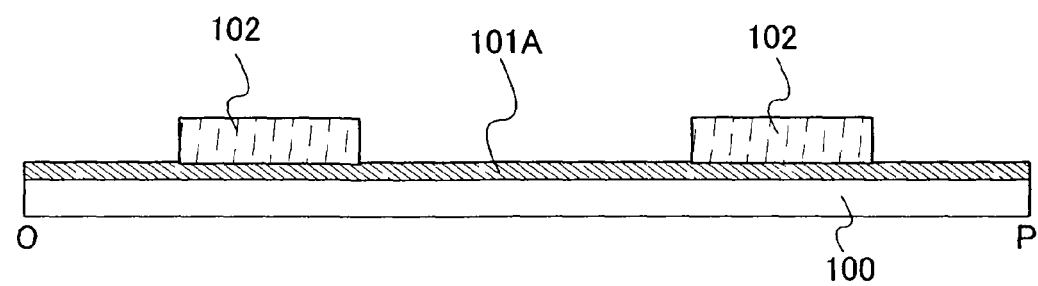
FIG. 1B
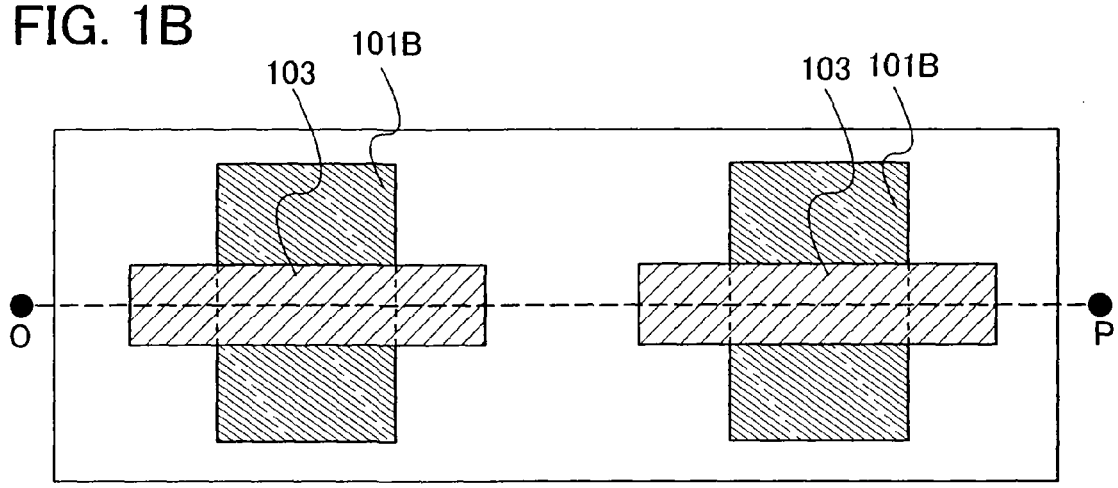
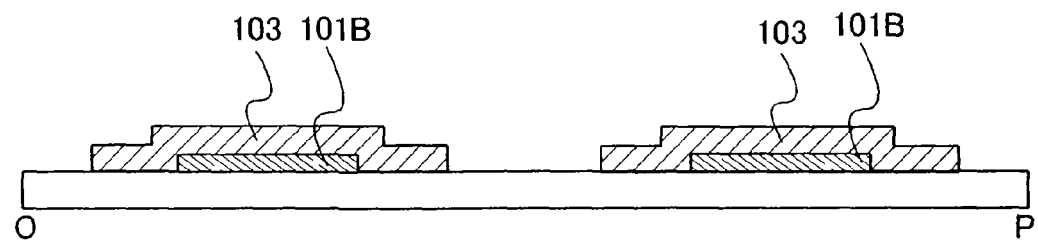

FIG. 5A
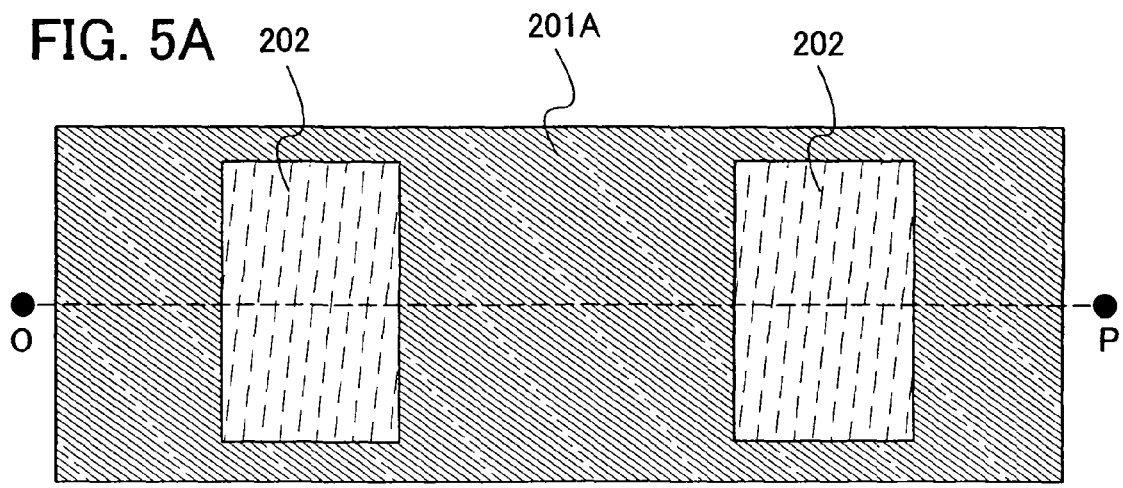
FIG. 5B
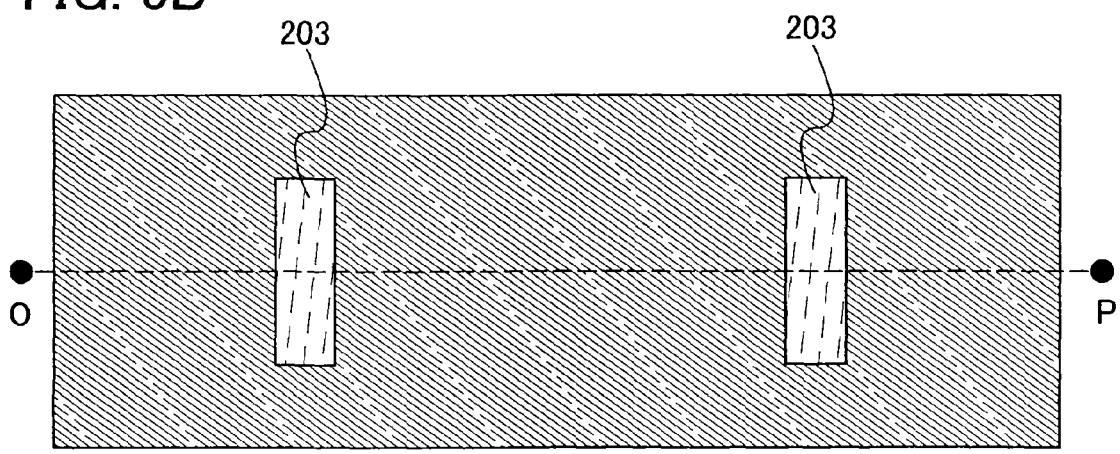
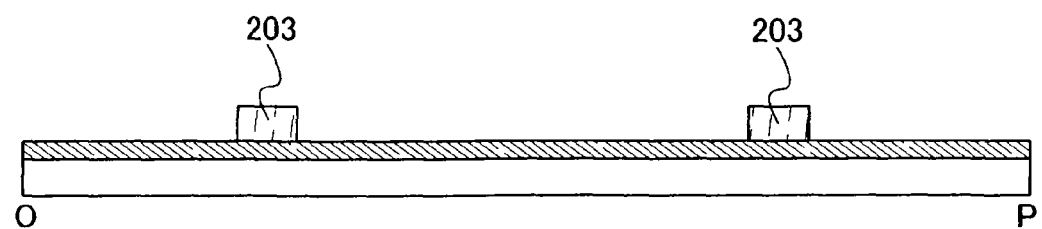

FIG. 9A
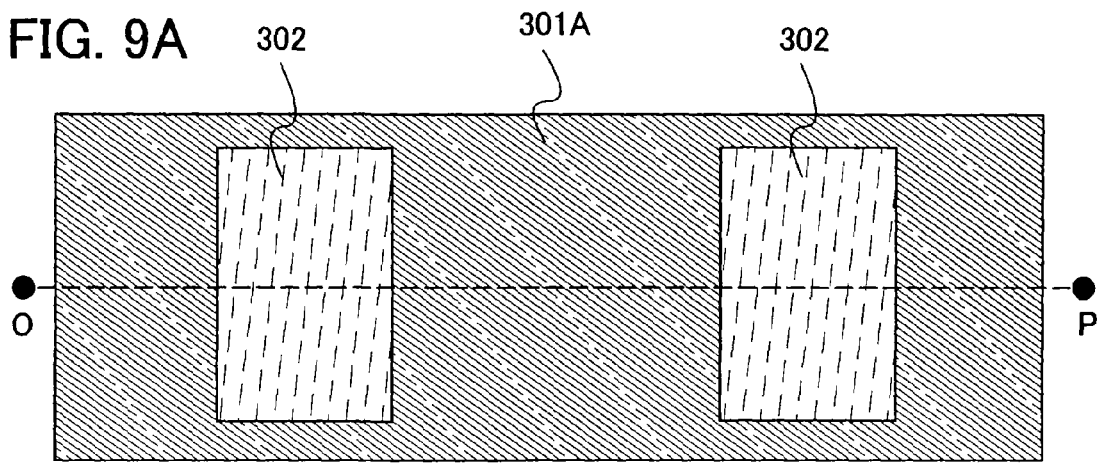
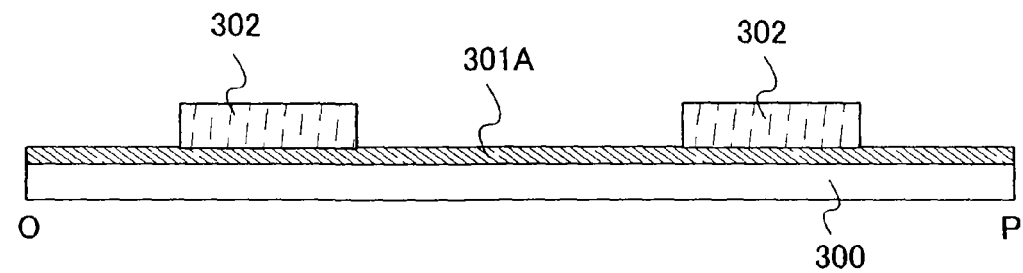
FIG. 9B
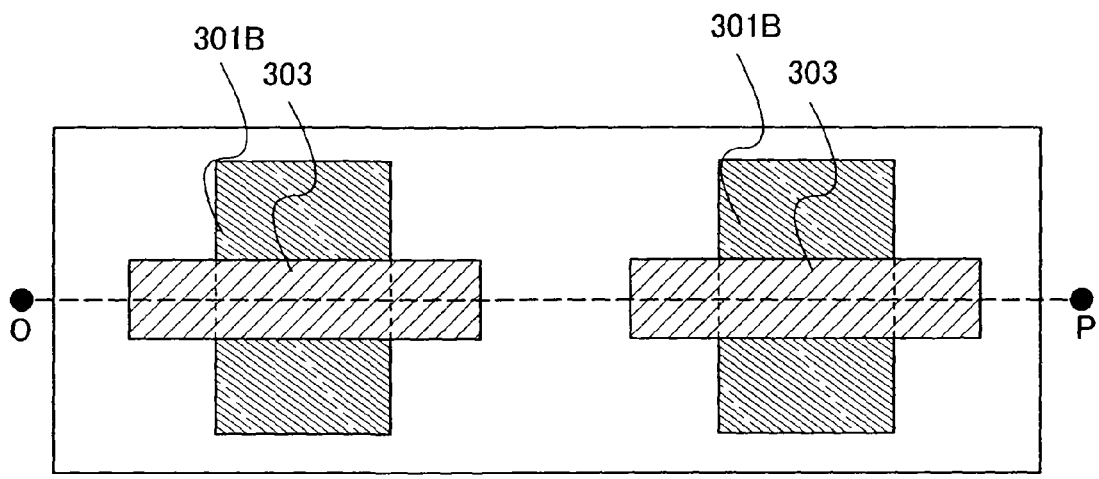
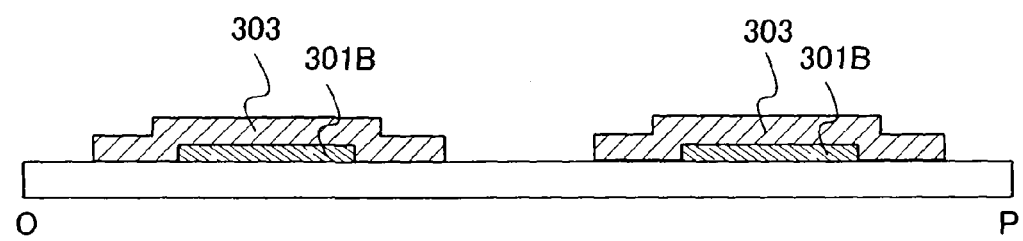

the first space
the second space
450
420
419

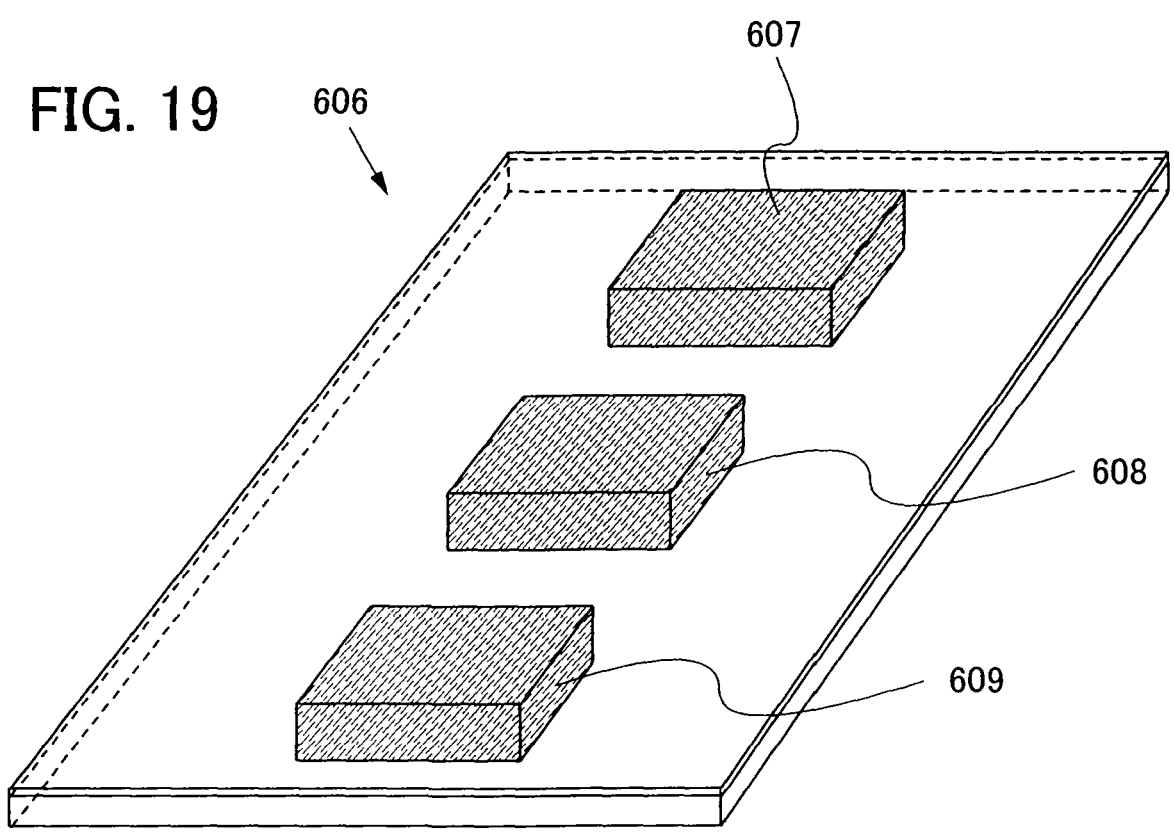

510
513

O · · · · · P 513    516

O    P

US 7,537,953 B2

MANUFACTURING METHOD OF MICROSTRUCTURE AND MICROELECTROMECHANICAL SYSTEM

BACKGROUND OF THE INVENTION

Field of the Invention

The present invention relates to a manufacturing method of a microstructure having a movable region and a microelectromechanical system having such a microstructure.

In recent years, research of micromechanical systems called MEMS (MicroElectroMechanical Systems) has been actively advanced. MEMS is an abbreviation of a microelectromechanical system, and is also simply called a micromachine. Although there is no clear definition of a micromachine, it generally means a microdevice formed by integrating a "movable microstructure having a three-dimensional structure" with an "electronic circuit having a semiconductor element" by using a semiconductor microfabrication technique. The microstructure has a three-dimensional structure, a movable portion, and spaces within which the movable portion can move.

A micromachine can control its microstructure with an electronic circuit. Therefore, it has been considered whether a distributed autonomous system that performs a sequence of operations can be constructed, such that data obtained by a sensor is processed with an electronic circuit and then a microstructure is activated with an actuator, unlike a central processing system such as a conventional device using a computer.

Various manufacturing methods of micromachines have been proposed. For example, a simplified manufacturing method of a micromachine utilizing a self-aligned patterning technique is proposed (See Reference 1: Japanese Published Patent Application No. 7-163158).

In addition, a manufacturing method of an optical scanner having electrostatic micromotors is proposed (see Reference 2: Japanese Patent No. 3086003).

A microstructure which constitutes a micromachine is provided with spaces within which a movable portion can move. As disclosed in References 1 and 2, the spaces within which a movable portion can move are produced by forming sacrificial layers.

The shape of a space, i.e., the volume of a space is determined by the structure and the operation of a microstructure. A microstructure is manufactured through a series of steps by using photomasks with different shapes in accordance with the shape of the microstructure. Thus, in order to form sacrificial layers for producing spaces, each sacrificial layer requires its corresponding photomask. However, since photomasks are expensive, it has been desired to reduce the number of photomasks as much as possible.

Mechanical properties of a microstructure are dependent on the shape and the dimension of spaces within which a movable portion can move. In other words, the mechanical properties to be obtained can be changed by changing the shape and the dimension of the spaces. However, in order to change the shape and the dimension between the spaces, it has been necessary to use different photomasks for forming each sacrificial layer.

SUMMARY OF THE INVENTION

In view of the foregoing, it is an object of the invention to manufacture a microstructure having a plurality of spaces with different shapes and dimensions from each other, by using the same photomask for forming each sacrificial layer.

Thus, the invention relates to the manufacture of a microstructure or a microelectromechanical system, and it is a gist of the invention to form a structural layer or a space through a process including the step of conducting a process for changing an external dimension of a resist mask which is formed by photolithography, so that a plurality of different resist masks are formed by using the same photomask.

Such a resist mask can be used as a mask for processing a sacrificial layer. For example, it is possible to form a mask used for processing a first sacrificial layer by using a photomask A, and then form a mask used for processing a second sacrificial layer by using the same photomask A.

Specific structures of the invention are described below.

A manufacturing method of a microstructure in accordance with one aspect of the invention includes the steps of: forming a first layer over an insulating substrate; forming a first resist mask over the first layer by using a photomask; processing the first layer by using the first resist mask to form a first sacrificial layer; forming a second layer over the first sacrificial layer; forming a second resist mask over the second layer by using the photomask; conducting a process for changing an external dimension of the second resist mask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; conducting a process for changing an external dimension of the first resist mask; processing the first layer by using the first resist mask to form a first sacrificial layer; forming a second layer over the first sacrificial layer; forming a second resist mask over the second layer by using the photomask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; processing the first layer by using the first resist mask to form a first sacrificial layer; forming a second layer over the first sacrificial layer; forming a second resist mask over the second layer by using the photomask; conducting a process for reducing an external dimension of the second resist mask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; conducting a process for reducing an external dimension of the first resist mask; processing the first layer by using the first resist mask to form a first sacrificial layer; forming a second layer over the first sacrificial layer; forming a second resist mask over the second layer by using the photomask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; processing the first layer by using the first resist mask to form a first sacrificial layer; forming a second layer over the first sacrificial layer; forming a second resist mask over the second layer by using the photomask; conducting a process for increasing an external dimension of the second resist mask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; conducting a process for increasing an external dimension of the first resist mask; processing the first layer by using the first resist mask to form a first sacrificial layer; forming a second layer over the first sacrificial layer; forming a second resist mask over the second layer by using the photomask; and processing the second layer by using the second resist mask to form a second sacrificial layer.

In the invention, the first sacrificial layer and the second sacrificial layer can be concurrently removed by forming an insulating layer so as to cover the second sacrificial layer, forming an opening in the insulating layer, and introducing an etchant into the opening.

A manufacturing method of a microstructure in accordance with one aspect of the invention includes the steps of: forming a first layer over an insulating substrate; forming a first resist mask over the first layer by using a photomask; processing the first layer by using the first resist mask to form a first sacrificial layer; forming a structural layer over the first sacrificial layer; forming a second layer over the structural layer; forming a second resist mask over the second layer by using the photomask; conducting a process for changing an external dimension of the second resist mask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; conducting a process for changing an external dimension of the first resist mask; processing the first layer by using the first resist mask to form a first sacrificial layer; forming a structural layer over the first sacrificial layer; forming a second layer over the structural layer; forming a second resist mask over the second layer by using the photomask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; processing the first layer by using the first resist mask to form a first sacrificial layer; forming a structural layer over the first sacrificial layer; forming a second layer over the structural layer; forming a second resist mask over the second layer by using the photomask; conducting a process for reducing an external dimension of the second resist mask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; conducting a process for reducing an external dimension of the first resist mask; processing the first layer by using the first resist mask to form a first sacrificial layer; forming a structural layer over the first sacrificial layer; forming a second layer over the structure layer; forming a second resist mask over the second layer by using the photomask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; processing the first layer by using the first resist mask to form a first sacrificial layer; forming a structural layer over the first sacrificial layer; forming a second layer over the structural layer; forming a second resist mask over the second layer by using the photomask; conducting a process for increasing an external dimension of the second resist mask; and processing the second layer by using the second resist mask to form a second sacrificial layer.

A manufacturing method of a microstructure in accordance with one aspect of the invention includes the steps of: forming a first layer over an insulating substrate; forming a first resist mask over the first layer by using a photomask; conducting a process for increasing an external dimension of the first resist mask; processing the first layer by using the first resist mask to form a first sacrificial layer; forming a structural layer over the first sacrificial layer; forming a second layer over the structural layer; forming a second resist mask over the second layer by using the photomask; and processing the second layer by using the second resist mask to form a second sacrificial layer.

In the invention, the first sacrificial layer and the second sacrificial layer can be concurrently removed by forming an insulating layer so as to cover the second sacrificial layer, forming an opening in the structural layer and the insulating layer, and introducing an etchant into the opening.

In the invention, another opening for forming a wire to be electrically connected to the structural layer can be formed in the insulating layer, concurrently with the formation of the aforementioned opening in the insulating layer.

In the invention, the structural layer is formed to contain one or more of titanium, aluminum, molybdenum, tungsten, tantalum, and silicon which can have etching selectivity with respect to the first sacrificial layer and the second sacrificial layer.

In the invention, oxygen plasma can be used for the process of reducing the external dimension of the first resist mask or the second resist mask.

In the invention, the external dimension of the first resist mask or the second resist mask can be increased by controlling the quantity of light for exposing a photoresist in the photolithography process for forming the first resist mask or the second resist mask.

In the invention, the external dimension of the first resist mask or the second resist mask can be increased by using a positive resist mask as the first resist mask or the second resist mask and reducing the quantity of light for exposing a photoresist (positive resist) or reducing the exposure time in the photolithography process.

In the invention, the external dimension of the first resist mask or the second resist mask can be increased by using a negative resist mask as the first resist mask or the second resist mask and increasing the quantity of light for exposing a photoresist (negative resist) or increasing the exposure time in the photolithography process.

In the invention, the first sacrificial layer or the second sacrificial layer is formed to contain one or more of titanium, aluminum, molybdenum, tungsten, tantalum, and silicon.

A microstructure manufactured by the method disclosed in the invention can be attached to a transistor over an insulating substrate in such a way that they are electrically connected to each other.

In this specification, the selection ratio means etching selectivity. "To have etching selectivity" means that, in conducting etching of a stacked structure having a layer A and a layer B, the etching rate of the layer A and the etching ratio of the layer B are varied from each other to a sufficient degree. In addition, the etching rate means the quantity of a layer etched per unit time.

Thus, in the invention, the same photomask is used for forming each sacrificial layer, and the number of photomasks can be reduced accordingly. As a result, cost can be reduced.

Further, in the invention, the shape and the dimension of a sacrificial layer can be changed by processing a resist mask. Therefore, the shape and the dimension of a space within which a microstructure can move can be changed. In this manner, the invention is preferably applied to a manufacturing process of a microstructure which is formed to have a plurality of spaces by stacking sacrificial layers. As a result of stacking spaces, microstructures having different properties from each other can be stacked over the same substrate, thereby the size of a microelectromechanical system can be reduced, while the performance thereof can be increased.

In addition, in the invention, a sacrificial layer can be provided with a tapered shape by processing a resist mask. As a result, coverage of the sacrificial layer with an upper layer can be improved.

Further, in the invention, a resist mask can be processed to be smaller down to the size exceeding the performance limit of an apparatus used in a photolithography process. As a result, a minute microstructure can be manufactured.

BRIEF DESCRIPTION OF THE DRAWINGS

In the accompanying drawings,

FIGS. 1A and 1B illustrate a manufacturing method of a microelectromechanical system of the invention;

FIGS. 5A and 5B illustrate a manufacturing method of a microelectromechanical system of the invention;

FIGS. 9A and 9B illustrate a manufacturing method of a microelectromechanical system of the invention;

FIG. 19 illustrates one aspect of a semiconductor device of the invention;

DETAILED DESCRIPTION OF THE INVENTION

Figure 2A:
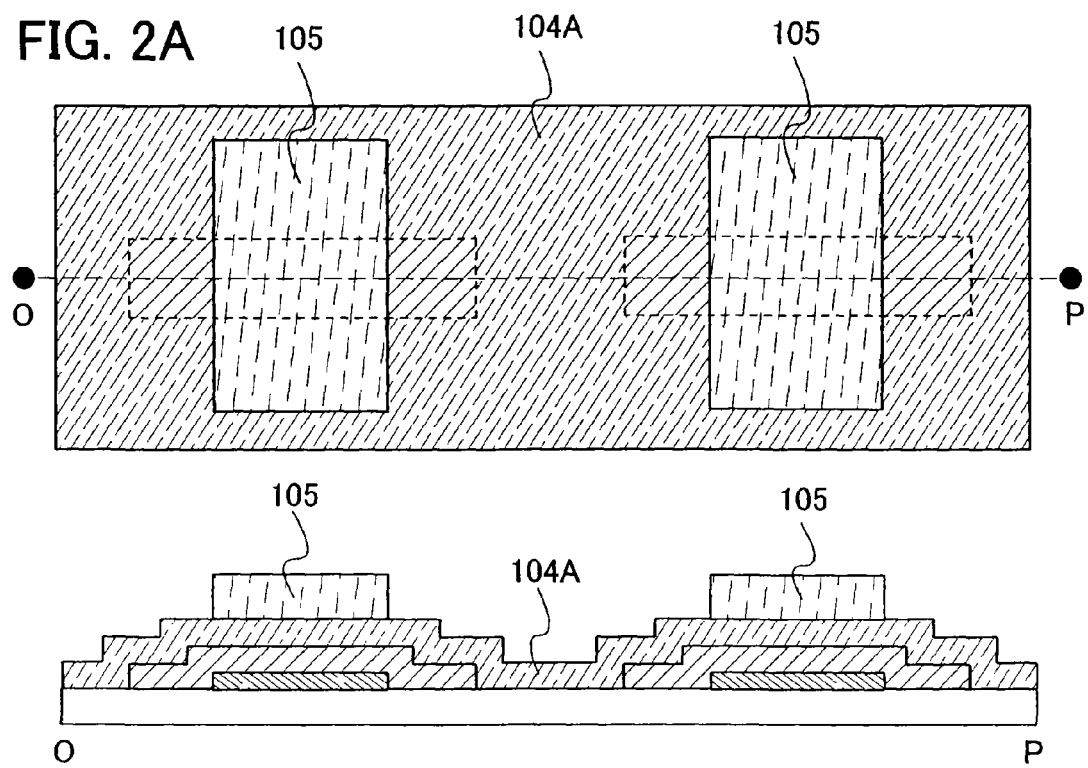
FIGS. 2A and 2B illustrate a manufacturing method of a microelectromechanical system of the invention.

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. In the following description, like reference numerals are used to designate identical portions or portions having a similar function in different drawings for illustrating embodiment modes, and thus their repetitive description will be omitted.

Embodiment Mode 1

In this embodiment mode, description is made of a method for manufacturing a microstructure by using the same photomask for forming each sacrificial layer, with reference to the drawings. In all the drawings, an upper diagram shows a top view while a lower diagram shows a cross-sectional view thereof along a line O-P or Q-R.

As shown in FIG. 1A, a substrate having an insulating surface (hereinafter referred to as an insulating substrate 100) is prepared. As the insulating substrate 100, a glass substrate, a quartz substrate, a plastic substrate, or the like can be used. When a plastic substrate is used, for example, a microstructure which is highly flexible and lightweight, and a microelectromechanical system having such a microstructure can be provided. Alternatively, when a glass substrate which is thinned by polishing or the like is used, a thin microstructure, and a microelectromechanical system having such a microstructure can be provided. Further, a conductive substrate made of metal or the like or a semiconductive substrate such as a silicon wafer, which has an insulating layer formed on its surface, can be used as well.

A first layer 101A is formed over the insulating substrate 100 (see FIG. 1A). Note that the first layer 101A is a layer to be processed into a first sacrificial layer 101B, and can be formed by sputtering or CVD, using a metal such as titanium (Ti), aluminum (Al), molybdenum (Mo), tungsten (W), or tantalum (Ta); oxide or nitride of such a metal; a semiconductor material containing silicon or germanium; oxide or nitride of such a semiconductor material; phosphor silicate glass (PSG); or the like.

The thickness of the first layer 101A is determined in consideration of various factors such as the material of the first sacrificial layer 101B, the structure and the operating method of the microstructure, and the method of etching the sacrificial layer. For example, if the first sacrificial layer 101B is formed to be too thin, a chemical liquid or a chemical gas (etchant) for removing the first sacrificial layer 101B cannot be diffused uniformly, and thus a phenomenon that a structural layer buckles (a structural layer adheres to a lower surface) after etching occurs. On the other hand, if the first sacrificial layer 101B is formed to be too thick, the microstructure cannot be driven electrostatically because of a long distance of a space which is produced after removing the first sacrificial layer 101B. Accordingly, in the case of providing a conductive layer below the sacrificial layer so that the microstructure is driven electrostatically in the space between the conductive layer and the structural layer (e.g., see FIGS. 27A to 28), the thickness of the first layer 101A is preferably in the range of 0.5 to 3 μm, inclusive, and more preferably in the range of 1 to 2.5 μm, inclusive. In addition, when a material having high internal stress is used for the sacrificial layer, it is impossible to form a sacrificial layer having a thickness of about several μm by one process. In that case, the first sacrificial layer 101B can be formed by repeating the formation and patterning of a sacrificial layer.

Next, the first layer 101A is coated with a resist mask material (photoresist) by a coating method such as spin coating, and the resist mask material is formed into a resist mask 102 by photolithography using a photomask for forming sacrificial layers (hereinafter referred to as a photomask A) (see FIG. 1A).

Then, the first layer 101A is processed into the first sacrificial layer 101B by dry etching using the resist mask 102 as a mask (see FIG. 1B). Then, the resist mask 102 is removed, and a film for forming a structural layer is formed over the first sacrificial layer 101B. Further, another resist mask is formed over the film for forming a structural layer by photolithography, and the film is processed into a structural layer 103 by dry etching (see FIG. 1B).

The structural layer 103 may be formed from a material which can have etching selectivity with respect to the first sacrificial layer 101B with the etchant used for etching sacrificial layers. For example, the structural layer 103 can be formed from a metal such as titanium (Ti), aluminum (Al), molybdenum (Mo), tungsten (W), or tantalum (Ta); oxide or nitride of such a metal; a semiconductor material containing silicon or germanium; or oxide or nitride of such a semiconductor material.

The thickness of the structural layer 103 is determined in consideration of various factors such as the thickness of the first sacrificial layer 101B, the material of the structural layer 103, the structure of the microstructure, and the method of etching the sacrificial layer. For example, when the structural layer 103 is formed to be thick, internal stress of the film becomes nonuniform, which would cause the structural layer 103 to be warped or buckled. On the other hand, when the structural layer 103 is formed to be thin, there is a fear that the structural layer 103 might be buckled due to the surface tension of a liquid solution which is used for etching the sacrificial layer. The thickness of the structural layer 103 can be determined in view of such circumstances. In addition, the structural layer 103 can have a stacked structure in order to obtain a necessary thickness.

When the structural layer 103 is formed using a substance having a nonuniform internal stress, the structural layer 103 is undesirably warped after the first sacrificial layer 101B is removed. However, it is possible to form a microstructure by utilizing such a warping effect of the structural layer 103. Specifically, the structural layer 103 can function as a switching element by utilizing such a warping effect.

Next, a second layer 104A is formed over the structural layer 103 (see FIG. 2A). The second layer 104A is a layer to be processed into a second sacrificial layer 104B, and can be formed by sputtering, CVD, or the like, using a metal such as tungsten or a compound of a metal, silicon or the like, such as silicon nitride.

The thickness of the second layer 104A is determined in consideration of various factors such as the material of the second sacrificial layer 104B, the structure and the operating method of the microstructure, and the method of etching the sacrificial layer, similarly to the first layer 101A.

Next, the second layer 104A is coated with a resist mask material (photoresist) by a coating method such as spin coating, and the resist mask material is formed into a resist mask 105 by photolithography using the photomask A again, which has already been used for forming the resist mask 102 (see FIG. 2A). Then, a resist mask having the same shape as the mask used for processing the first sacrificial layer 101B is formed.

Figure 2B:
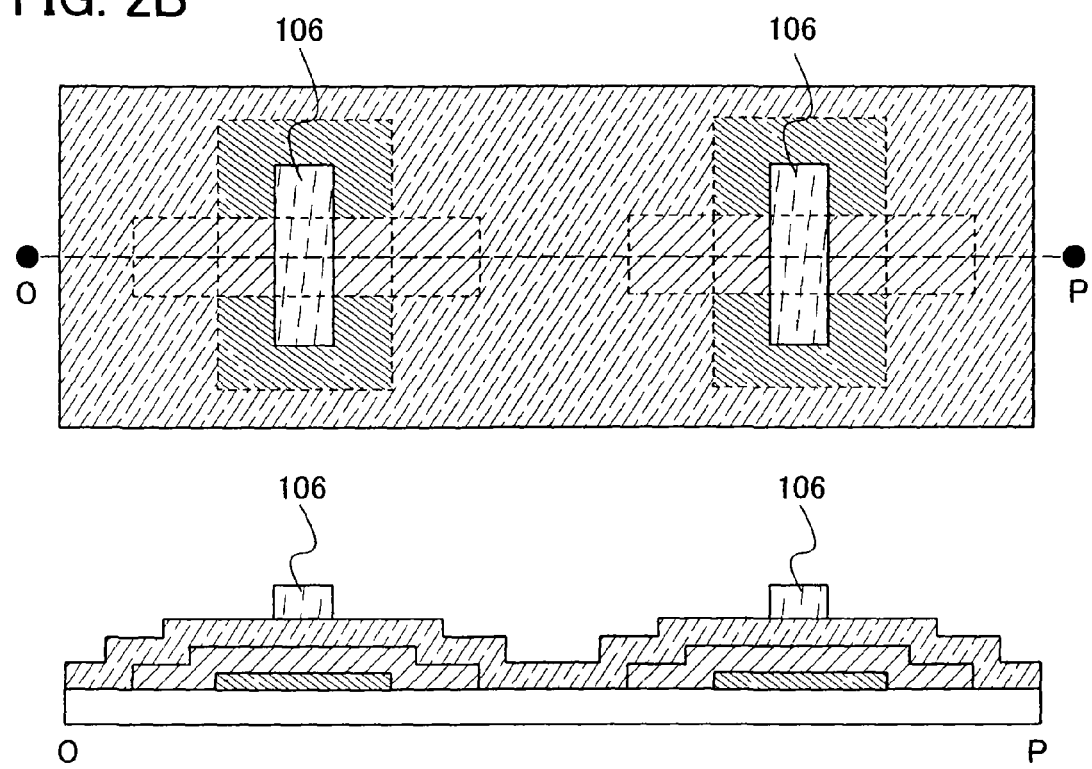

Then, a process for changing the external dimension of the resist mask 105 is conducted. For example, by applying etching treatment such as oxygen plasma treatment to the resist mask 105, the dimension of the resist mask 105 can be reduced. In this manner, a resist mask 106 with a reduced dimension is formed (see FIG. 2B).

As a method for reducing the external dimension of the resist mask, an etching apparatus utilizing inductively coupled plasma (ICP etching apparatus) can be also used instead of oxygen plasma treatment. An ICP etching apparatus has a coiled electrode which is a plasma generation source and an extraction electrode. The coiled electrode generates high-density plasma to be drawn toward the extraction electrode. That is, ions and radicals can be drawn to the surface of an object which is put on the surface of the extraction electrode. By controlling a voltage of this extraction electrode, the resist mask as well as the layer below the resist mask can be etched to be processed. In this embodiment mode, the resist mask 105 can be etched and thus reduced in size while at the same time etching the second layer 104A. When such an ICP etching apparatus is used, etching of a sacrificial layer and reduction in size of a resist mask can be conducted at the same time. Thus, the process time and the number of processes can be reduced.

Alternatively, the external dimension of the resist mask can be changed by controlling the quantity of light for exposing the mask in the photolithography process. For example, when a positive resist mask is used, the external dimension of the resist mask after undergoing a developing process can be reduced by increasing the quantity of light or increasing the exposure time. Meanwhile, when a negative resist mask is used, the external dimension of the resist mask after undergoing a developing process can be reduced by reducing the quantity of light or shortening the exposure time.

Figure 3A:
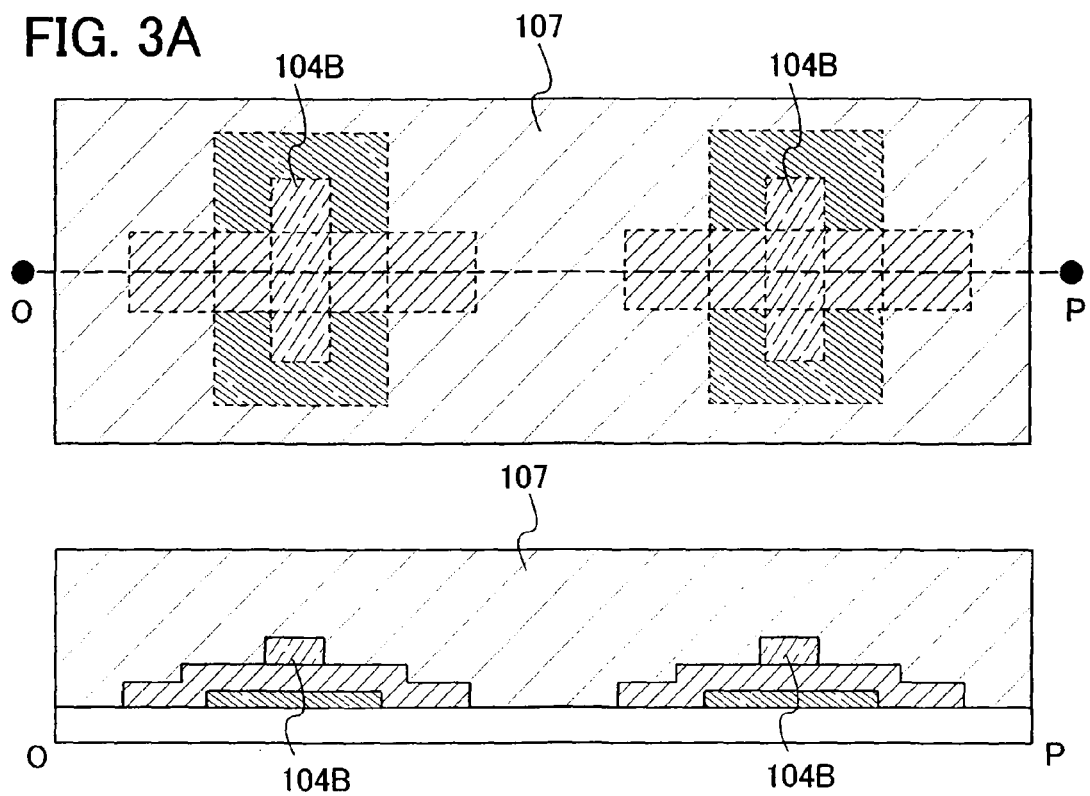
FIGS. 3A and 3B illustrate a manufacturing method of a microelectromechanical system of the invention.

Next, the second layer 104A is processed by etching using the resist mask 106 (see FIG. 3A). The method of etching may be either dry etching or wet etching.

Then, the resist mask 106 is removed and an insulating layer 107 is formed (see FIG. 3A). The insulating layer 107 can be formed with an inorganic material, an organic material, or the like which has an insulating property. As an inorganic material, silicon oxide or silicon nitride can be used. As an organic material, polyimide, acrylic, polyamide, polyimide amide, benzocyclobutene, siloxane, or polysilazane can be used. Alternatively, a material used for a resist mask can be used. Siloxane is a material having a skeletal structure with a bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. Polysilazane is formed by using a polymer material having a bond of silicon (Si) and nitrogen (Ni) as a starting material.

Figure 3B:
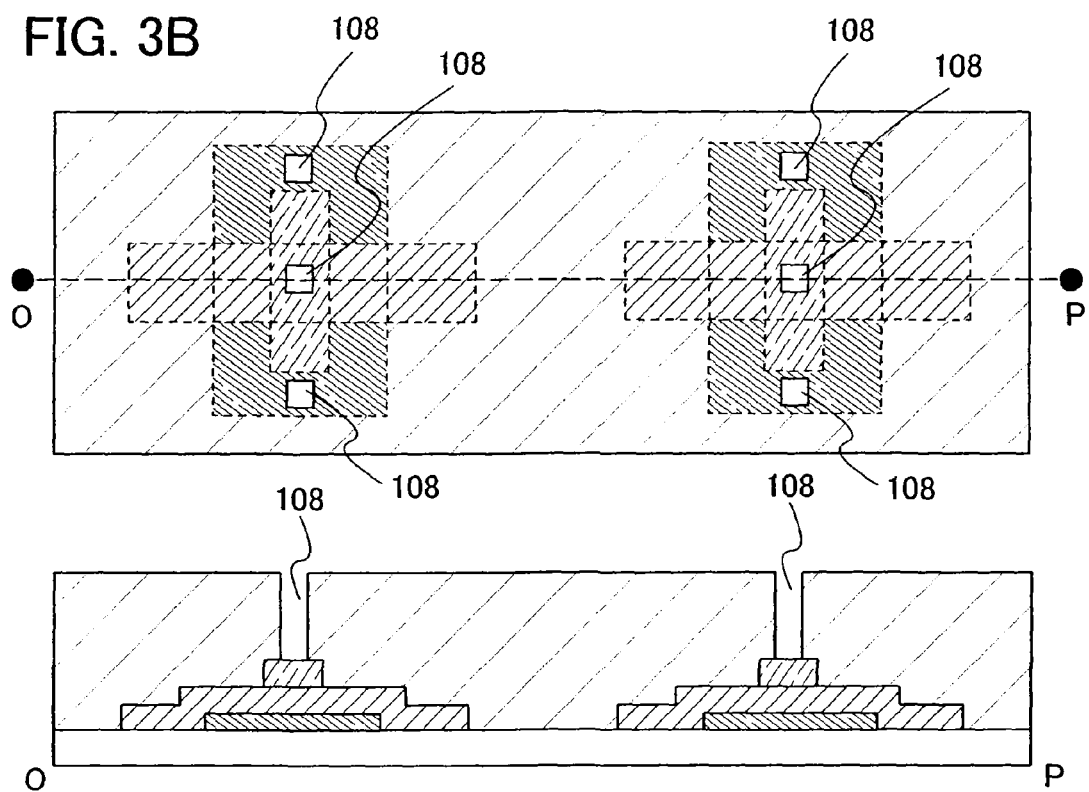

Next, the insulating layer 107 is etched by using a resist mask formed by photolithography, thereby forming contact holes (also called openings) 108 for exposing the first sacrificial layer 101B and the second sacrificial layer 104B. Then, the resist mask is removed (see FIG. 3B). The method of etching may be either dry etching or wet etching. This embodiment mode describes a case of forming the contact holes 108 by dry etching. The contact holes 108 are formed in order to etch-remove the first sacrificial layer 101B and the second sacrificial layer 104B. Thus, the diameter of each contact hole 108 is determined so as to allow an etchant to flow through. Therefore, the diameter of each contact hole 108 is preferably greater than or equal to 2 μm.

Figure 4A:
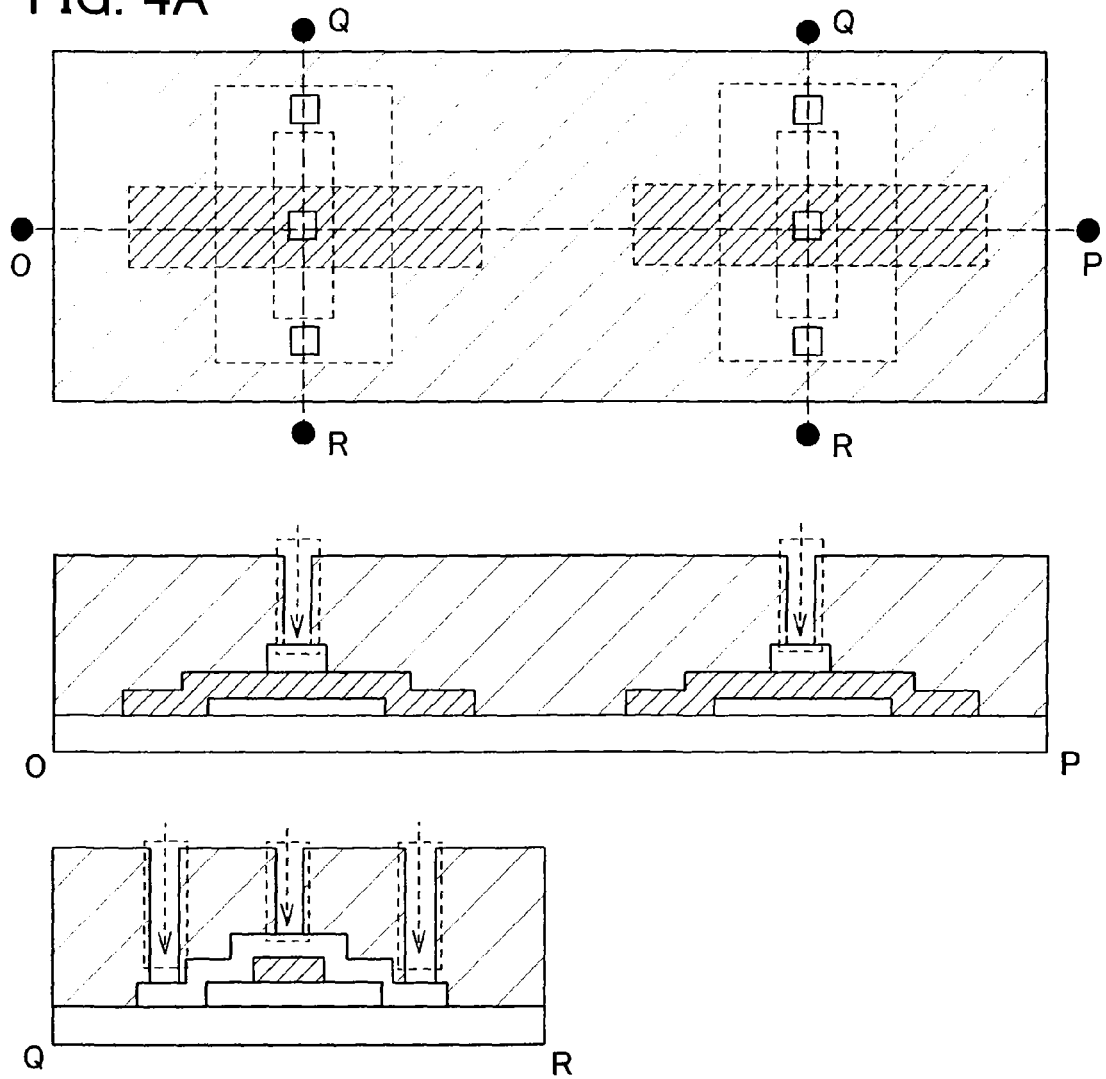
FIGS. 4A and 4B illustrate a manufacturing method of a microelectromechanical system of the invention.

Next, the first sacrificial layer 101B and the second sacrificial layer 104B are removed by etching (see FIG. 4A). The method of etching may be either dry etching or wet etching, and an etchant which is suitable for the material of the sacrificial layers flows through the contact holes 108, thereby etching the sacrificial layers. After the sacrificial layers are removed by etching, a space which is surrounded by the substrate on its bottom side, and the structural layer on its lateral sides and top side is produced.

For example, when the sacrificial layers are formed from tungsten (W), they can be etched by being soaked in a liquid solution in which 28% of ammonia and 31% of oxygenated water are mixed at a ratio of 1:2 for about 20 minutes. When the sacrificial layers are formed from silicon dioxide, they can be etched by using a buffered fluorinated acid in which a solution containing fluorinated acid by 49% is mixed with ammonium fluoride at a ratio of 1 to 7. When the sacrificial layers are formed from silicon, they can be etched by using hydroxide of alkaline metals (e.g., phosphoric acid, KOH, NaOH, or CsOH), $NH_4OH$, hydrazine, EPD (a mixture of ethylenediamine, pyrocatechol, and water), TMAH (tetramethyl ammonium hydroxide), IPA (isopropyl alcohol), a NMD3 solution (an aqueous solution containing tetramethyl ammonium hydroxide by 0.2 to 0.5%), or the like. For a drying process after the wet etching, rinsing is conducted using an organic solvent with low viscosity (e.g., cyclohexane), or drying is conducted with the conditions of a low temperature and low pressure, in order to prevent the microstructure from buckling due to a capillary phenomenon. Alternatively, the rising and drying processes can be conducted in combination. As a further alternative, the sacrificial layers can be removed by dry etching using $F_2$ or $XeF_2$ under a high-pressure condition such as the atmospheric pressure.

If the first sacrificial layer 101B and the second sacrificial layer 104B are formed from different materials from each other, and thus cannot be etched with the same etchant, it is necessary to etch the sacrificial layers through two processes. In that case, it is required to select an etchant with full consideration so that the sacrificial layers can have etching selectivity with respect to a layer in contact with the etchant, while at the same time the structural layer 103, the insulating layer 107, and the like can be prevented from being removed.

After removing the sacrificial layers, plasma treatment may be conducted so that the surface of the microstructure can have a water-repellent property, in order to prevent the microstructure from buckling due to a capillary phenomenon. For the plasma treatment, oxygen plasma, nitrogen plasma, or fluorine plasma can be used.

Figure 4B:
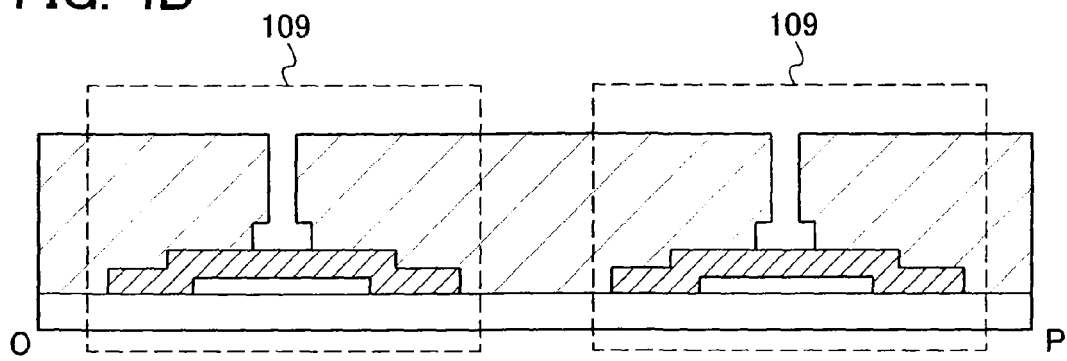

By removing the first sacrificial layer 101B and the second sacrificial layer 104B by the aforementioned etching process, a structure 109 can be manufactured (see FIG. 4B). Since such a structure is very small, it is to be called a microstructure.

In this embodiment mode, the second sacrificial layer 104B which is smaller than the first sacrificial layer 101B can be formed by processing the resist mask over the second layer 104A. By removing these sacrificial layers, a microstructure in which a space above the structural layer 103 is smaller than a space below the structural layer 103 can be manufactured.

Figure 30A:
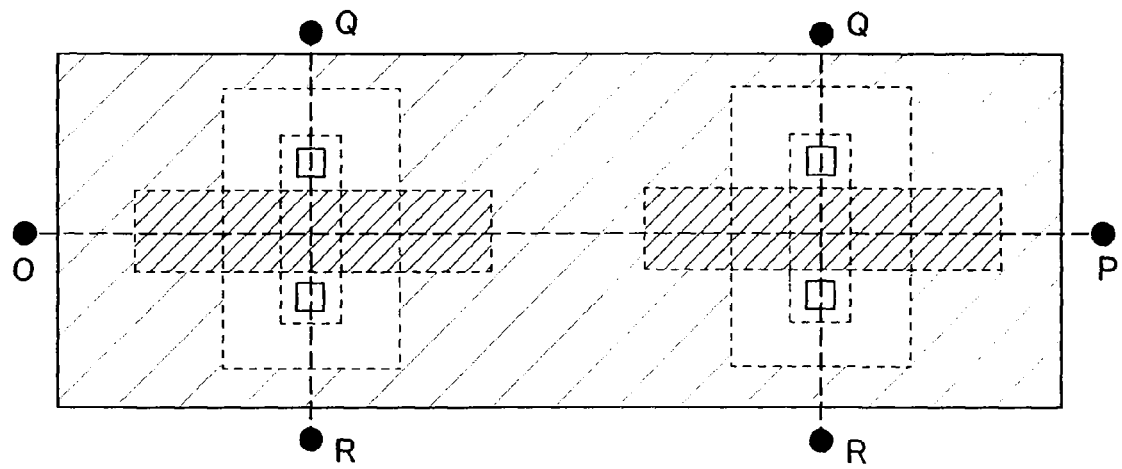
FIGS. 30A and 30B illustrate aspects of a semiconductor device of the invention.
Figure 30B:
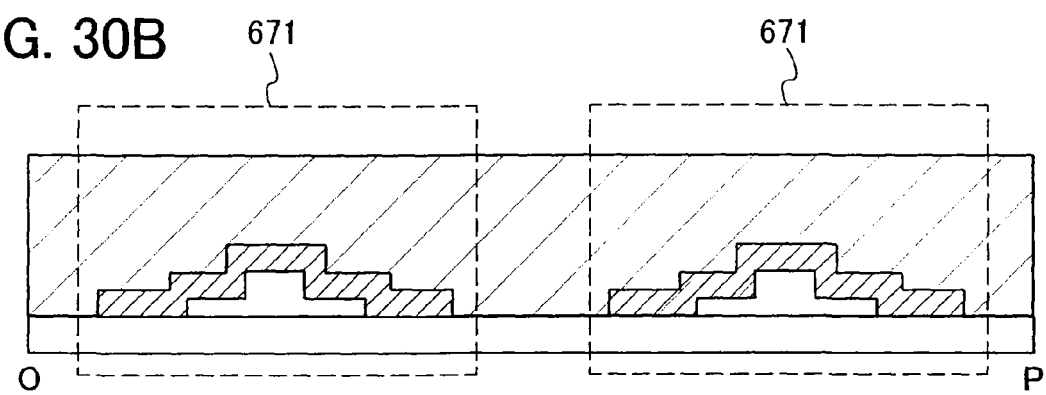

It is also possible to form the second sacrificial layer after forming the first sacrificial layer and before forming the structural layer. In that case, by processing the resist mask of the first sacrificial layer to be increased in size, or by processing the resist mask of the second sacrificial layer to be reduced in size, a microstructure 671 having two spaces with different sizes from each other below its structural layer can be manufactured, where the top space is smaller than the bottom space (see FIGS. 30A and 30B).

In this manner, the first sacrificial layer 101B and the second sacrificial layer 104B are formed by using the same photomask in this embodiment mode. Therefore, cost can be reduced. In addition, by processing one of the resist masks which are formed by using the same photomask, the resist mask can be made smaller down to the size exceeding the performance limit of an apparatus used for a photolithography process. As a result, a minute microstructure can be manufactured.

The thusly formed microstructure having spaces with different sizes from each other can be used as a sensor.

Embodiment Mode 2

In this embodiment mode, description is made with reference to the drawings, of a manufacturing method of a microstructure in which a first space is smaller than a second space, by using the same photomask for forming each sacrificial layer, which differs from Embodiment Mode 1. In all the drawings, an upper diagram shows a top view while a lower diagram shows a cross-sectional view thereof along a line O-P or Q-R.

As shown in FIG. 5A, an insulating substrate 200 is prepared. Then, a first layer 201A is formed over the insulating substrate 200 (see FIG. 5A). Note that the first layer 201A is a layer to be processed into a first sacrificial layer 201B, and can be formed by sputtering, CVD, or the like, using a similar material to the one in the aforementioned embodiment mode.

Next, the first layer 201A is coated with a resist mask material (photoresist) by a coating method such as spin coating, and the resist mask material is formed into a resist mask 202 by photolithography using a photomask A for forming sacrificial layers (see FIG. 5A).

Then, the resist mask 202 is reduced in size by etching treatment such as oxygen plasma treatment, thereby forming a resist mask 203 (see FIG. 5B).

As a method for reducing the size of the resist mask, an ICP etching apparatus can be used similarly to the aforementioned embodiment mode. Alternatively, the external dimension of the resist mask can be changed by controlling the quantity of light for exposing the mask in a photolithography process, similarly to the aforementioned embodiment mode.

Figure 6A:
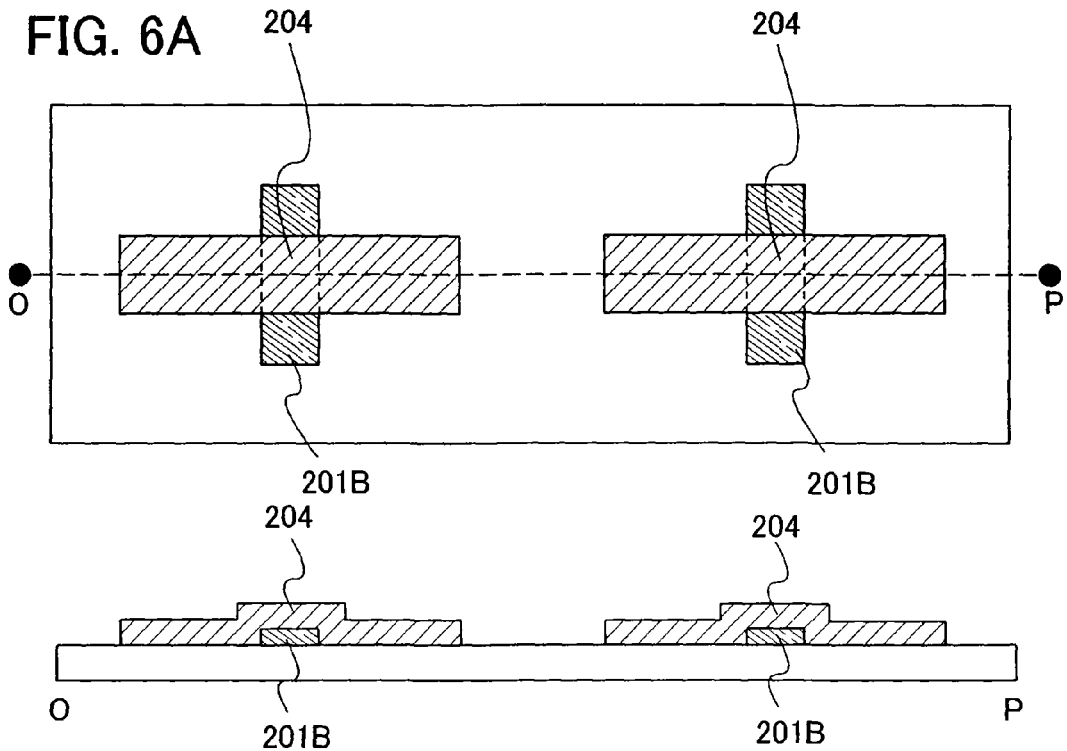
FIGS. 6A and 6B illustrate a manufacturing method of a microelectromechanical system of the invention.

Next, the first layer 201A is processed into the first sacrificial layer 201B by dry etching using the resist mask 203 as a mask (see FIG. 6A). Then, the resist mask 203 is removed, and a film for forming a structural layer is formed over the first sacrificial layer 201B. Further, another resist mask is formed over the film for forming a structural layer by photolithography, and the film is processed into a structural layer 204 by dry etching (see FIG. 6A).

The structural layer 204 can be formed by sputtering, CVD, or the like by using a similar material to the one in the aforementioned embodiment mode.

Figure 6B:
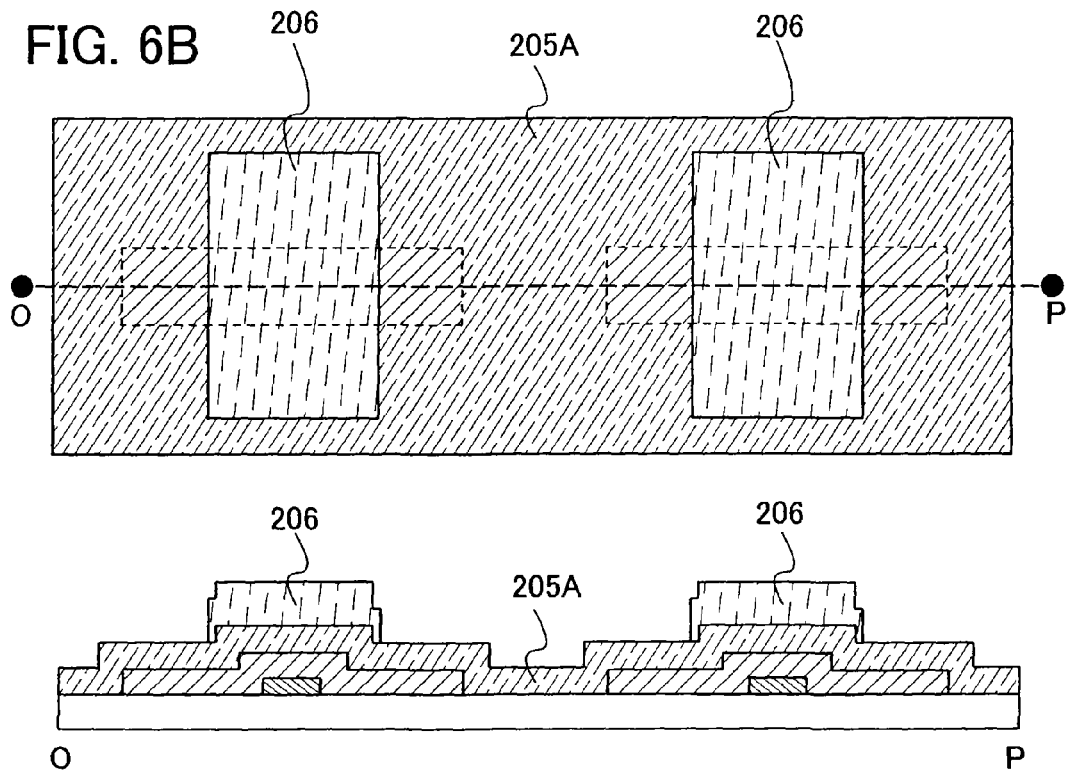

Next, a second layer 205A is formed over the structural layer 204 (see FIG. 6B). The second layer 205A can be formed in a similar manner to the first layer 201A.

Next, the second layer 205A is coated with a resist mask material (photoresist) by a coating method such as spin coating, and the resist mask material is formed into a resist mask 206 by photolithography using the photomask A again, which has already been used for forming the resist mask 202 (see FIG. 6B). The resist mask 206 is formed to have a larger external dimension than the resist mask used for processing the first layer 201A. In this manner, plurality of resist masks having different external dimensions from each other can be formed by utilizing the same photomask.

Figure 7A:
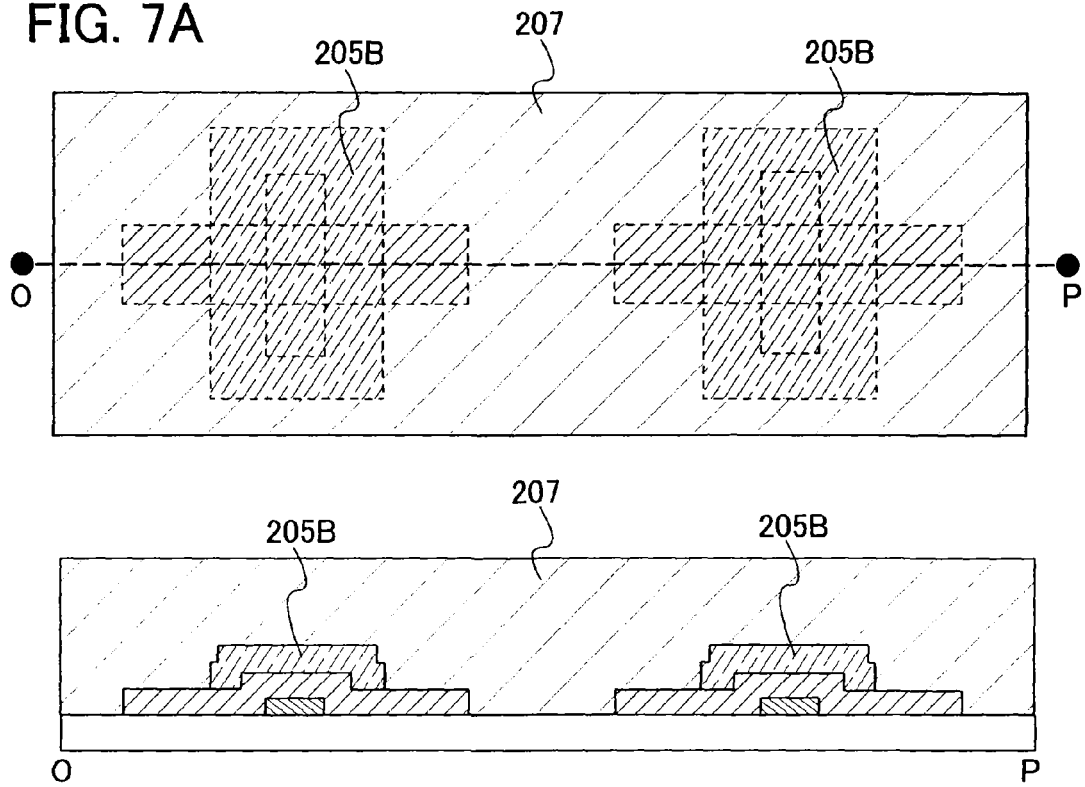
FIGS. 7A and 7B illustrate a method for assembling a microelectromechanical system of the invention.

Next, the second layer 205A is processed into a second sacrificial layer 205B by dry etching using the resist mask 206 as a mask, and then the resist mask 206 is removed and an insulating layer 207 is formed (see FIG. 7A). The insulating layer 207 can be formed in a similar manner to the insulating layer 107, by using an inorganic material, an organic material, or the like which has an insulating property.

Figure 7B:
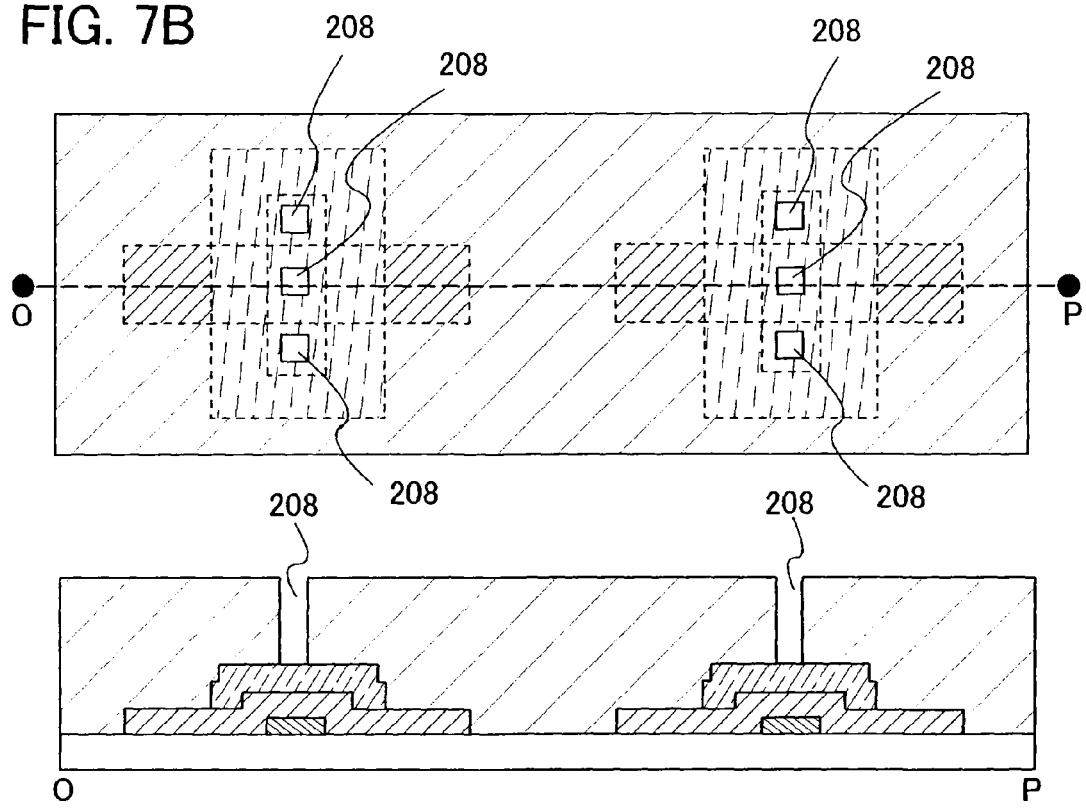

Next, the insulating layer 207 is etched by using a resist mask formed by photolithography, thereby forming contact holes 208 for exposing the first sacrificial layer 201A and the second sacrificial layer 205B. The diameter of each contact hole 208 has only to be determined so that an etchant can flow through the contact hole. Therefore, the diameter of each contact hole 208 is preferably greater than or equal to 2 μm. After that, the resist mask is removed (see FIG. 7B).

Figure 8A:
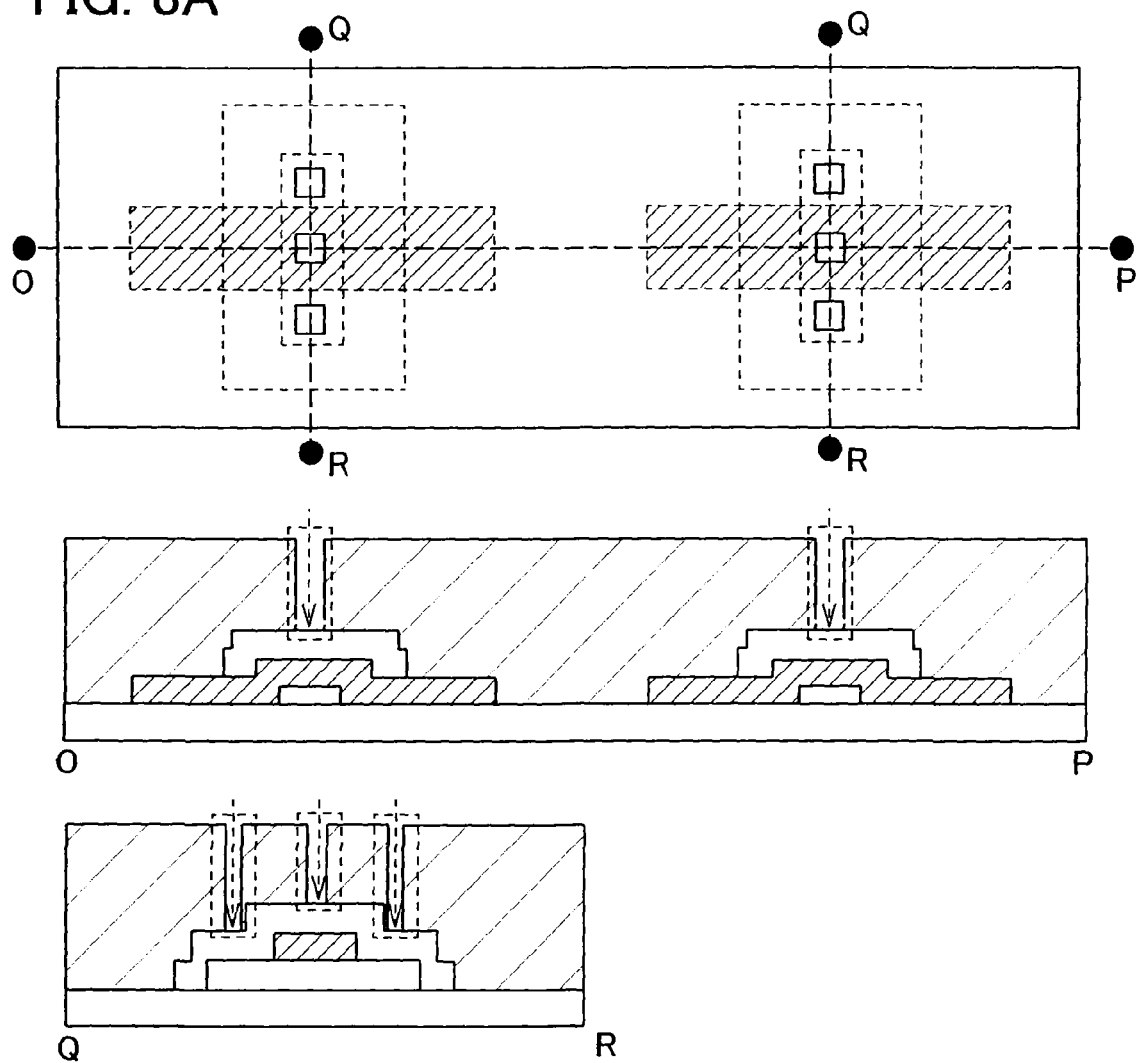
FIGS. 8A and 8B illustrate a method for assembling a microelectromechanical system of the invention.

Next, the first sacrificial layer 201B and the second sacrificial layer 205B are removed by etching (see FIG. 8A). The method of etching may be either dry etching or wet etching, and an etchant which is suitable for the material of the sacrificial layers flows through the contact holes 208, thereby etching the sacrificial layers. After the sacrificial layers are removed by etching, a first space which is surrounded by the substrate on its bottom side, and the structural layer on its lateral sides and top side is produced, while at the same time, a second space which is surrounded by the structural layer on its bottom side, and the insulating layer on its lateral sides and top side is produced.

Figure 8B:
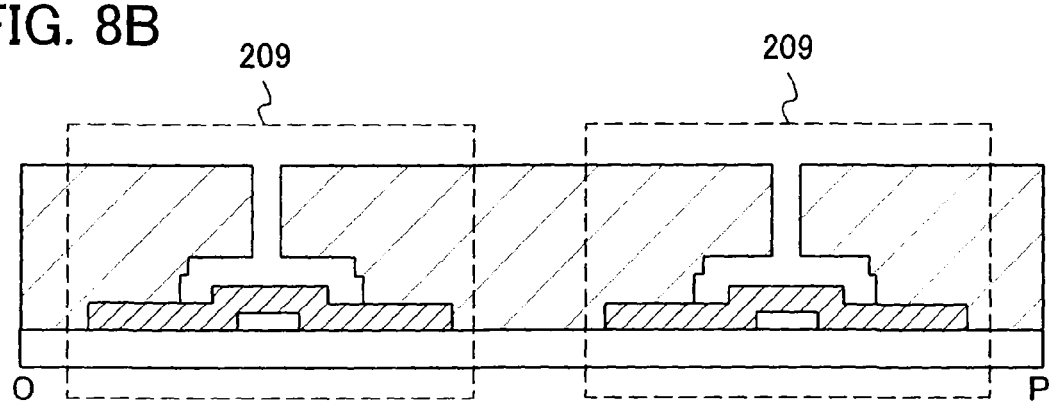

By removing the first sacrificial layer 201B and the second sacrificial layer 205B by the aforementioned etching process, a structure 209 can be manufactured (see FIG. 8B).

In this embodiment mode, the first sacrificial layer 201B which is smaller than the second sacrificial layer 205B can be formed by processing the resist mask over the first layer 201A. By removing these sacrificial layers, a microstructure in which a space below the structural layer 204 is smaller than a space above the structural layer 204 can be manufactured.

In this manner, the first sacrificial layer 201B and the second sacrificial layer 205B are formed by using the same photomask in this embodiment mode. Therefore, cost can be reduced. In addition, by processing one of the resist masks which are formed by using the same photomask, the resist mask can be made smaller down to the size exceeding the performance limit of an apparatus used for a photolithography process. As a result, a minute microstructure can be manufactured.

The thusly formed microstructure having spaces with different sizes from each other can be used as a sensor.

Embodiment Mode 3

In this embodiment mode, description is made with reference to the drawings, of a manufacturing method of a microstructure by using an enlarged resist mask, which differs from Embodiment Modes 1 and 2. In all the drawings, an upper diagram shows a top view while a lower diagram shows a cross-sectional view thereof along a line O-P or Q-R.

As shown in FIG. 9A, an insulating substrate 300 is prepared. Then, a first layer 301A is formed over the insulating substrate 300 (see FIG. 9A). The first layer 301A can be formed by sputtering, CVD, or the like by using a similar material to the one in the aforementioned embodiment mode.

Next, the first layer 301A is coated with a resist mask material by a coating method such as spin coating, and the resist mask material is formed into a resist mask 302 by photolithography using a photomask A for forming sacrificial layers (see FIG. 9A).

Next, the first layer 301A is processed into a first sacrificial layer 301B by dry etching using the resist mask 302 as a mask (see FIG. 9B). Then, the resist mask 302 is removed, and a film for forming a structural layer is formed over the first sacrificial layer 301B. Further, another resist mask is formed over the film for forming a structural layer by photolithography, and the film is processed into a structural layer 303 by dry etching (see FIG. 9B).

The structural layer 303 can be formed by sputtering, CVD, or the like by using a similar material to the one in the aforementioned embodiment mode.

Figure 10A:
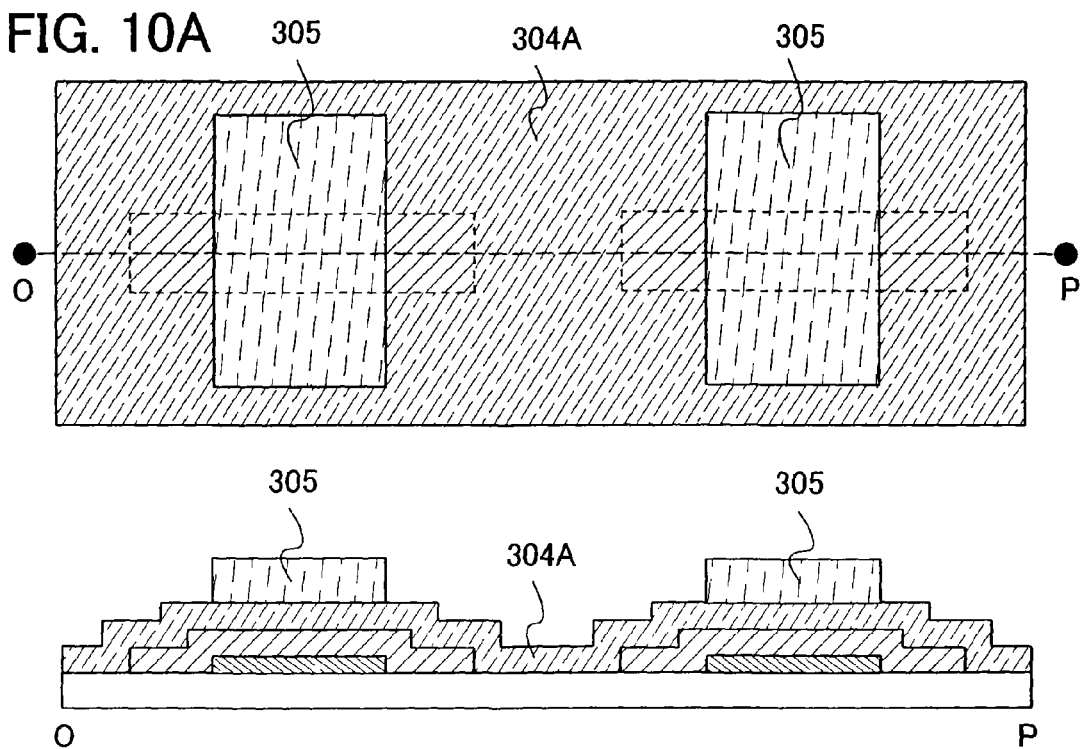
FIGS. 10A and 10B illustrate a manufacturing method of a microelectromechanical system of the invention.

Next, a second layer 304A is formed over the structural layer 303 (see FIG. 10A). The second layer 304A can be formed in a similar manner to the first layer 301A.

Next, the second layer 304A is coated with a resist mask material (photoresist) by a coating method such as spin coating, and the resist mask material is formed into a resist mask 305 by photolithography using the photomask A again, which has already been used for forming the resist mask 302 (see FIG. 10A).

Figure 10B:
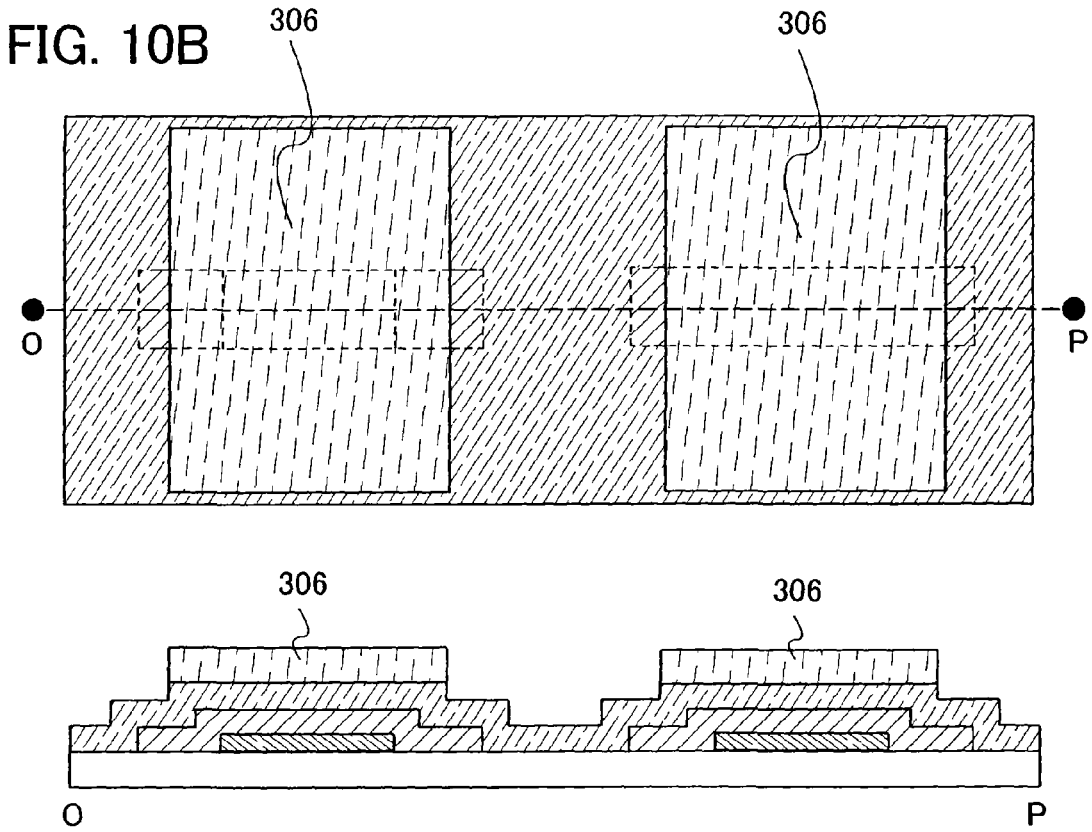
Figure 11A:
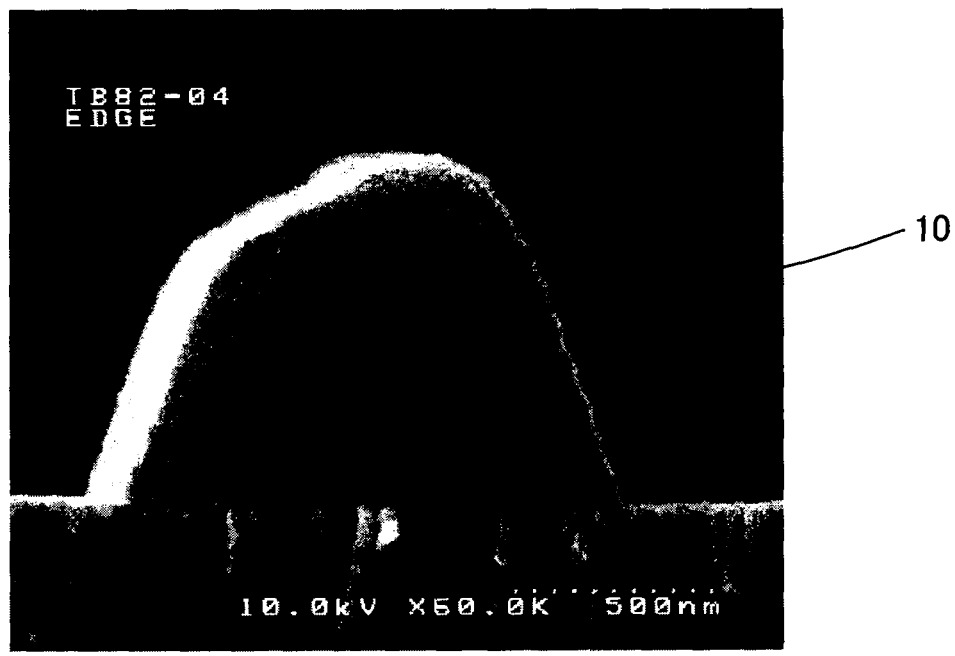
FIGS. 11A and 11B illustrate a manufacturing method of a microelectromechanical system of the invention.
Figure 11B:

Next, the resist mask 305 is expanded by thermal treatment, thereby forming a resist mask 306 (see FIG. 10B). For example, the resist mask can be expanded in the lateral direction by applying heat with a thermal treatment apparatus such as an oven after the photolithography process (see FIGS. 11A and 11B). FIG. 11A shows a resist mask 10 before undergoing the thermal treatment, while FIG. 11B shows a resist mask 20 after undergoing the thermal treatment at 200° C. for one hour. In this manner, the external dimension of the resist mask can be increased by applying thermal treatment.

As a method for expanding the resist mask, a method of controlling the quantity of light for exposing the photoresist in the photolithography process can be utilized. For example, when a positive resist mask is used, the external dimension of the resist mask after undergoing a developing process can be increased by reducing the quantity of light or reducing the exposure time. Meanwhile, when a negative resist mask is used, the external dimension of the resist mask after undergoing a developing process can be increased by increasing the quantity of light or increasing the exposure time.

Figure 12A:
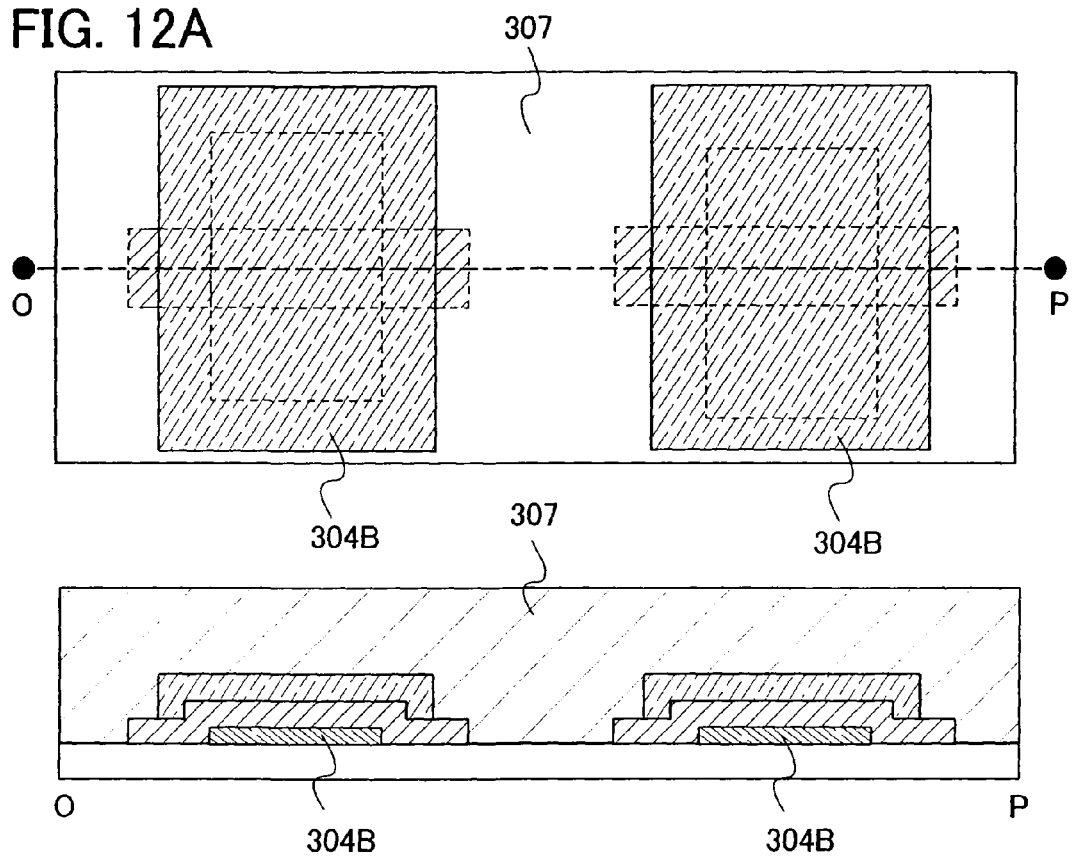
FIGS. 12A and 12B illustrate a manufacturing method of a microelectromechanical system of the invention.

Next, the second layer 304A is processed into a second sacrificial layer 304B by dry etching using the resist mask 306 as a mask, and then the resist mask 306 is removed and an insulating layer 307 is formed (see FIG. 12A). The insulating layer 307 can be formed in a similar manner to the insulating layer 107, by using an inorganic material, an organic material, or the like which has an insulating property.

Figure 12B:
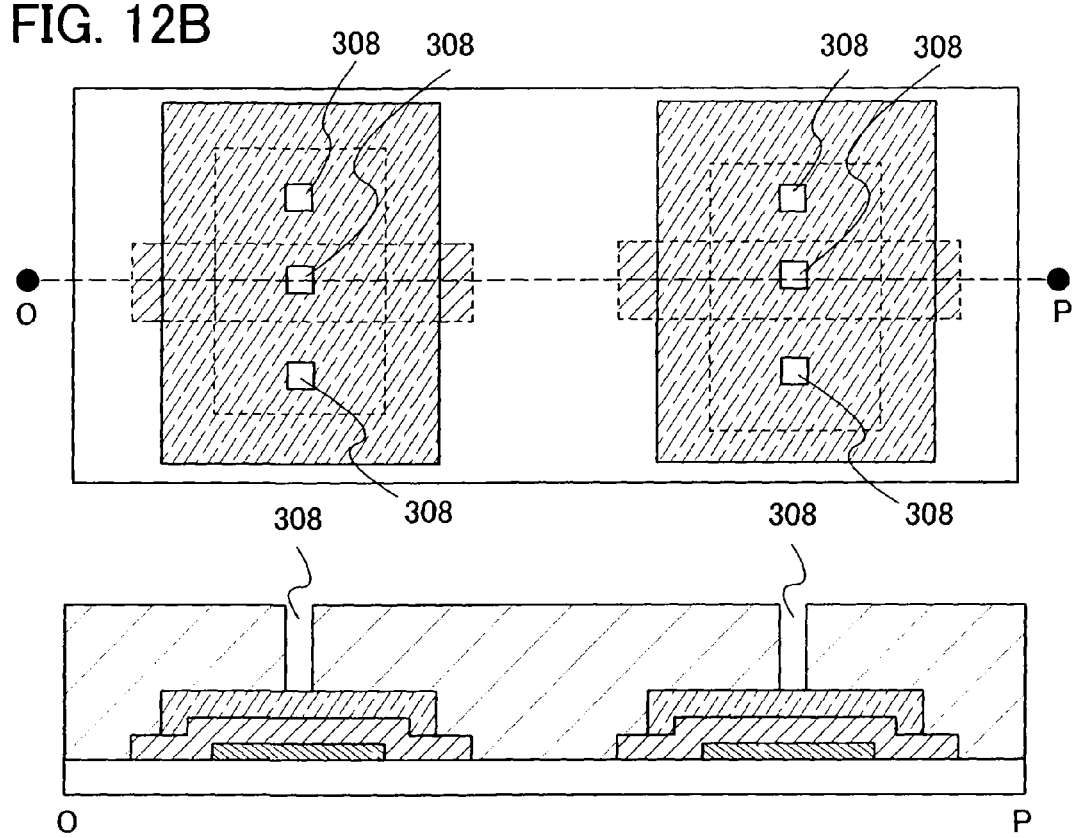

Next, the insulating layer 307 is etched by using a resist mask formed by photolithography, thereby forming contact holes 308 for exposing the first sacrificial layer 301B and the second sacrificial layer 304B. The diameter of each contact hole 308 has only to be determined so that an etchant can flow through the contact hole. Therefore, the diameter of each contact hole 308 is preferably greater than or equal to 2 μm. After that, the resist mask is removed (see FIG. 12B).

Figure 13A:
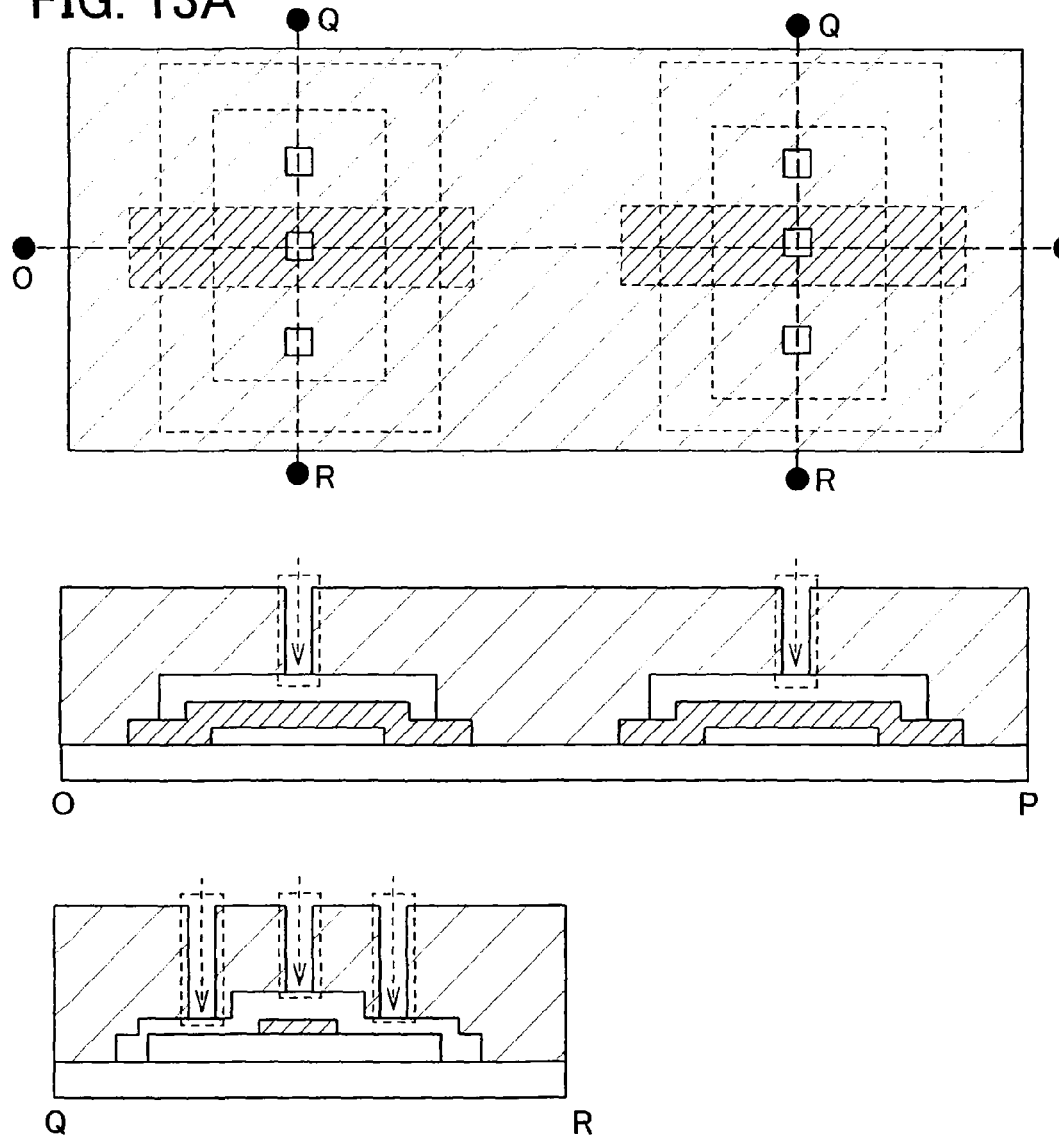
FIGS. 13A and 13B illustrate a manufacturing method of a microelectromechanical system of the invention.

Next, the first sacrificial layer 301B and the second sacrificial layer 304B are removed by etching (see FIG. 13A). The method of etching may be either dry etching or wet etching, and an etchant which is suitable for the material of the sacrificial layers flows through the contact holes 308, thereby etching the sacrificial layers. After the sacrificial layers are removed by etching, a first space which is surrounded by the substrate on its bottom side, and the structural layer on its lateral sides and top side is produced, while at the same time, a second space which is surrounded by the structural layer on its bottom side, and the insulating layer on its lateral sides and top side is produced.

Figure 13B:
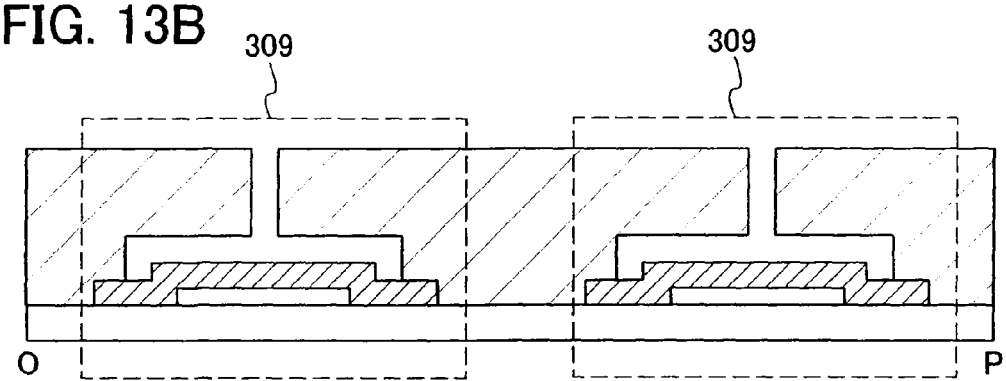

By removing the first sacrificial layer 301B and the second sacrificial layer 304B by the aforementioned etching process, a structure 309 can be manufactured (see FIG. 13B).

In this embodiment mode, the first sacrificial layer 301B and the second sacrificial layer 304B are formed by using the same photomask; therefore, cost can be reduced. In addition, by processing the resist mask for forming the second sacrificial layer 304B, the second sacrificial layer 304B which is larger than the first sacrificial layer 301B can be formed, thereby a microstructure in which a space above the structural layer 303 is larger than a space below the structural layer 303 can be manufactured.

Although the resist mask for forming the second sacrificial layer is expanded in this embodiment mode, the resist mask for forming the first sacrificial layer can be expanded instead. In that case, the first sacrificial layer can be formed to be larger than the second sacrificial layer, and thus a microstructure in which a space below the structural layer is larger than a space above the structural layer can be manufactured.

Figure 31A:
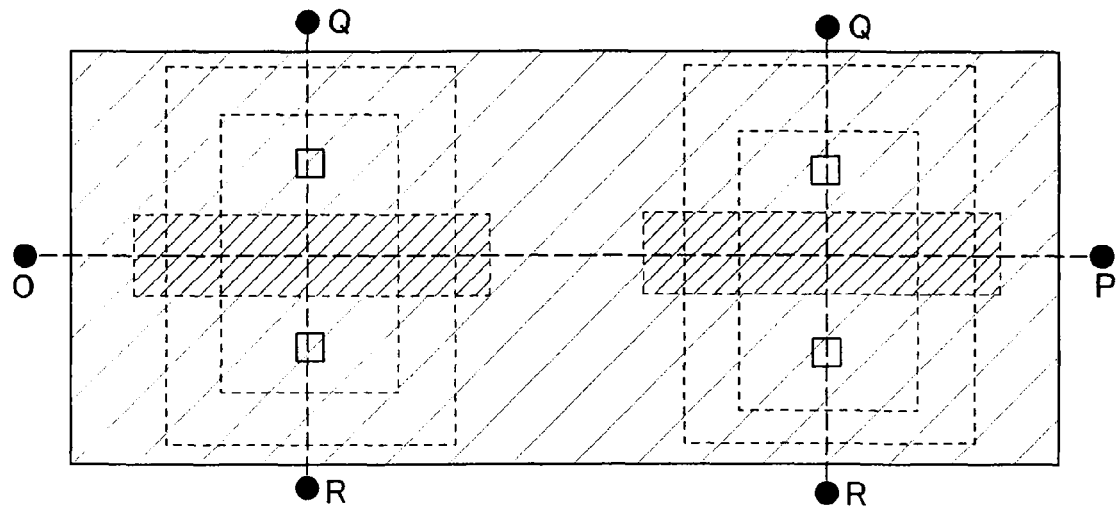
FIGS. 31A to 31C illustrate aspects of a semiconductor device of the invention.
Figure 31B:
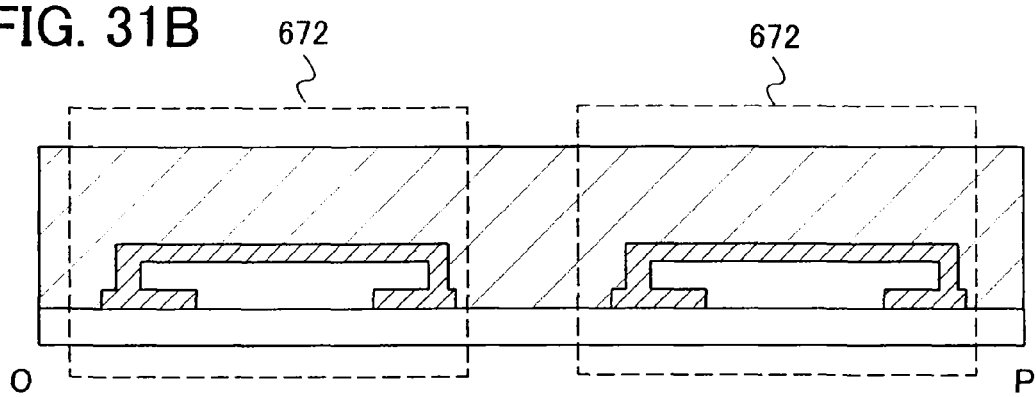
Figure 31C:
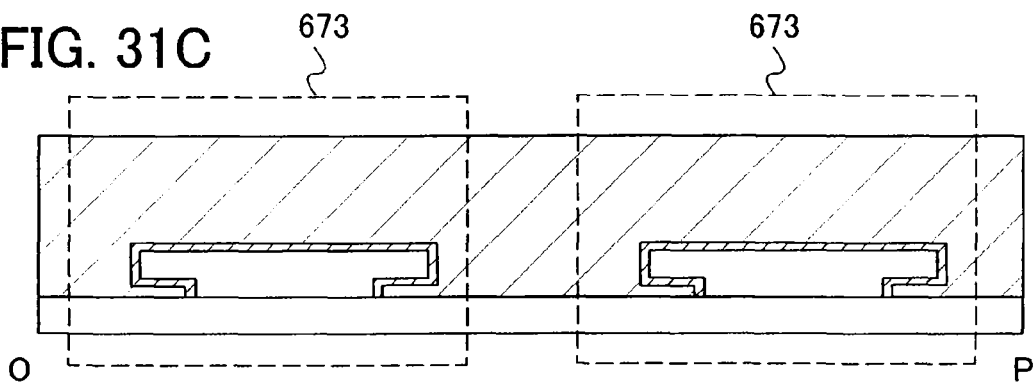

It is also possible to form the second sacrificial layer after forming the first sacrificial layer and before forming the structural layer. In that case, by processing the resist mask of the first sacrificial layer to be reduced in size, or by processing the resist mask of the second sacrificial layer to be increased in size, a microstructure 672 having two spaces with different sizes from each other below its structural layer can be manufactured, where the bottom space is smaller than the top space (see FIGS. 31A and 31B). Note that the structure may have a different mode as shown by a structure 673 in FIG. 31C, depending on the method for forming the structural layer.

The thusly formed microstructure having spaces with different sizes from each other can be used as a sensor.

Embodiment Mode 4

Although either one of the resist mask for forming the first sacrificial layer or the resist mask for forming the second sacrificial layer is reduced or increased in size, both of them can be processed as well.

It is a feature of the invention that a single photomask is used for forming a microstructure having spaces with a stacked structure. Therefore, the invention is also applicable to a structure where more than two spaces are stacked.

In this manner, a microstructure having a plurality of different mechanical properties can be manufactured by using a resist mask which is reduced or increased in size.

Embodiment Mode 5

In this embodiment mode, a structure of a semiconductor layer used as a structural layer is described.

A layer containing silicon which is used as a structural layer may have any of a crystalline state, a microcrystalline state, or an amorphous state. This embodiment mode describes a case of using polysilicon for a structural layer. Note that the structural layer may also have a stacked structure, and in that case, one layer among the stacked layers contains polysilicon.

Figure 21A:
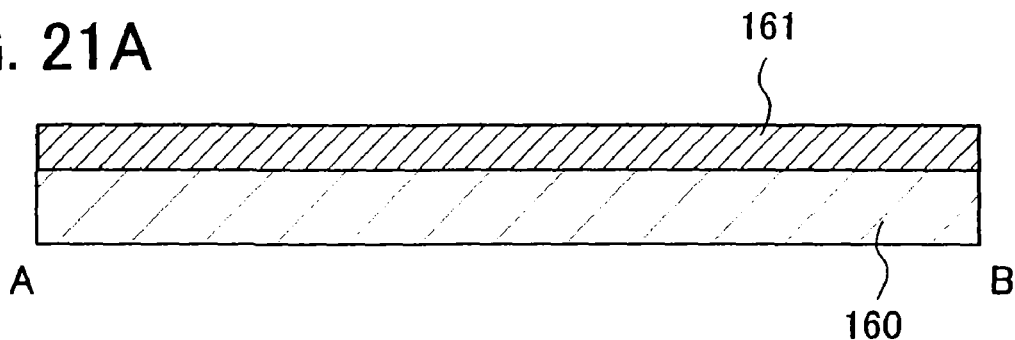
FIGS. 21A to 21D illustrate aspects of a semiconductor device of the invention.

First, as shown in FIG. 21A, a layer containing amorphous silicon (referred to as an amorphous silicon layer) 161 is formed over an insulating substrate 160 which is a subject surface to be formed with a structural layer. By applying thermal treatment to the amorphous silicon layer 161, a polysilicon layer which is crystallized can be obtained. Thermal treatment may be conducted by using a heating oven, laser irradiation, irradiation with light emitted from a lamp source (hereinafter referred to as lamp annealing), or a combination of these.

In the case of using laser irradiation, a continuous wave laser beam (hereinafter referred to as a CW laser beam) or a pulsed laser beam may be used. As a laser beam, a laser beam emitted from one or more of the following can be used: an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser. When the fundamental wave or the second to fourth harmonics of such laser beams are used, crystals with a large grain size can be obtained. For example, the second harmonic (532 nm) or the third harmonic (355 nm) of an Nd:$YVO_4$ laser (fundamental wave of 1064 nm) can be used. In this case, energy density of the laser beams is required to be about 0.01 to 100 $MW/cm^2$ (preferably, 0.1 to 10 $MW/cm^2$). The scanning rate is set to be about 10 to 2000 cm/sec to irradiate the amorphous silicon layer.

Note that a fundamental wave of a CW laser beam and a high harmonic of a CW laser beam may be used in combination, or a fundamental wave of a CW laser beam and a high harmonic of a pulsed laser beam may be used in combination. By using a plurality of laser beams in combination in this manner, energy can be compensated.

It is also possible to use a pulsed laser beam which oscillates at a repetition rate that allows a laser beam of a next pulse to be delivered before a silicon layer is melted and solidified by a previous laser beam. By oscillating a laser beam at such a repetition rate, crystal grains which have grown continuously in the scan direction can be obtained. As a specific repetition rate of a laser beam, a repetition rate of greater than or equal to 10 MHz, which is much higher than the normally used frequency band ranging from several tens of Hz to several hundred Hz, is used.

In the case of using a heating oven as alternative thermal treatment, the amorphous silicon layer is heated at 400 to 550° C. for 2 to 20 hours. At this time, it is preferable to set temperatures at multiple stages in the range of 400 to 550° C. so that the temperature becomes gradually higher. By a low-temperature thermal process at about 400° C. at the initial stage, hydrogen or the like comes out of the amorphous silicon layer. Therefore, a surface roughness of the film due to crystallization can be reduced.

Figure 21B:
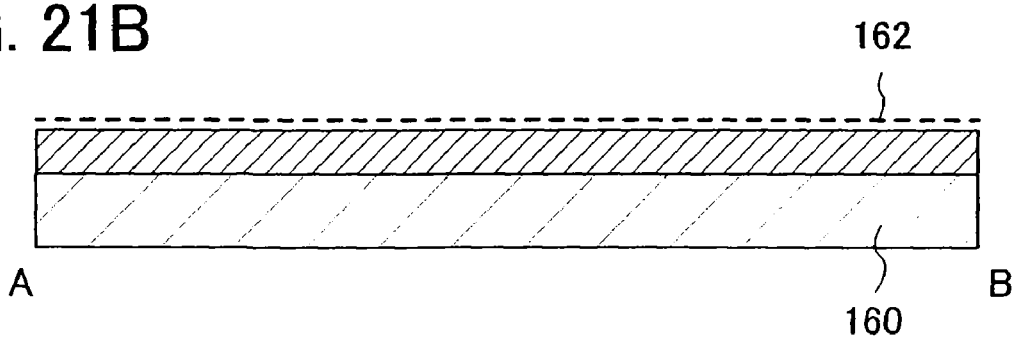

Further, as shown in FIG. 21B, when a layer 162 containing metal elements which promote crystallization such as Ni is formed over the amorphous silicon layer, the heating temperature can be lowered, which is preferable. As the metal elements, metals such as Fe, Ru, Rh, Pd, Os, Ir, Pt, Cu, and Au can be used.

Figure 21C:
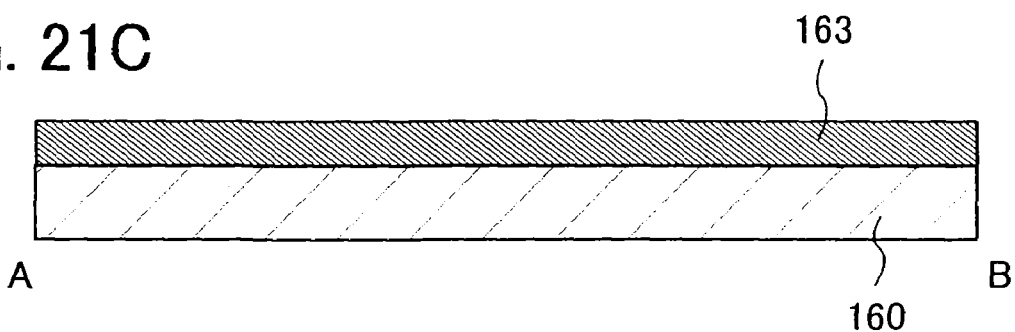

Thus, a polysilicon layer 163 can be formed as shown in FIG. 21C.

It is also possible to form the polysilicon layer by irradiation with the aforementioned laser in addition to the thermal treatment. Further, by selectively irradiating the amorphous silicon layer with laser while changing the laser conditions, the amorphous silicon can be partially crystallized.

Polysilicon obtained by the aforementioned crystallization is harder than amorphous silicon, and hardly has plastic deformation. This is because polysilicon having continuous crystal grain boundaries can be formed by crystallization, particularly by crystallization using the aforementioned metal elements. Since the electron mobility is increased with the continuous crystal grain boundaries, polysilicon is suitable for the material of a structural layer in the case where a microstructure is controlled with electrostatic force (electrostatic attraction). Further, since the structural layer includes metal elements which promote crystallization and thus has conductivity, the structural layer is suitable for a microelectromechanical system whose structural layer is controlled with an electrostatic force like the invention. Needless to say, the polysilicon layer is also applicable to a microelectromechanical system whose structural layer is controlled with electromagnetic force.

In the case of using nickel for the metal, nickel silicide is formed on the silicon layer depending on the concentration of the nickel. In general, a silicon alloy such as nickel silicide is known for its high strength. Therefore, by allowing the metal used for the thermal treatment to remain in a part of or the whole silicon layer, and further applying appropriate thermal treatment thereto, a microelectromechanical system which is harder and highly conductive can be manufactured.

By stacking the polysilicon layer and the layer containing nickel silicide (nickel silicide layer) in which the metal used for the thermal treatment remains, a highly conductive structural layer can be obtained. Such a nickel silicide layer can be applied to a stacked structure with a polycrystalline silicon layer, and conductivity is increased by the nickel silicide layer. Further, the structural layer can be partially or entirely hardened.

Such a silicide layer can be formed by using not only nickel but also tungsten, titanium, molybdenum, tantalum, cobalt, or platinum. In the case of using such metals, a tungsten silicide layer, a titanium silicide layer, a molybdenum silicide layer, a tantalum silicide layer, a cobalt silicide layer, or a platinum silicide layer is formed. Among such metals, cobalt and platinum can also be used as the metal for lowering the heating temperature of crystallization.

In the case of conducting crystallization using metals in the aforementioned manner, the selection range of materials used for a substrate over which a microstructure is to be formed can be widened since crystallization can be conducted at a lower temperature than the crystallization without using metals. For example, when a semiconductor layer is crystallized only by heating, heating is required to be conducted at a temperature of about 1000° C. for about one hour, and thus a glass substrate which is weak against heat cannot be used. However, when crystallization is conducted by using the aforementioned metals as in this embodiment mode, a glass substrate which has a strain point of about 600° C. or the like can be used.

Crystallization using metals like the aforementioned process can also be conducted partially, by selectively applying metals onto a semiconductor layer.

Metals used for promoting crystallization will become a contamination source of a microelectromechanical system or the like; therefore, the metals may be removed after crystallization. In that case, by forming a layer to serve as a gettering site on the silicon layer after the silicon layer is crystallized by thermal treatment or laser irradiation, and then heating the layer to serve as a gettering site, the metal elements can be moved toward the gettering site. As the gettering site, a polycrystalline semiconductor layer or a semiconductor layer doped with impurities can be used. For example, by forming a polycrystalline semiconductor layer doped with inactive elements such as argon over the semiconductor layer, the polycrystalline semiconductor layer can be used as a gettering site. By doping a polycrystalline semiconductor layer with inactive elements, the polycrystalline semiconductor layer can be distorted, thereby metal elements can be effectively trapped therein by utilizing the distortion. It is also possible to trap metals by forming a semiconductor layer doped with elements such as phosphorus.

The metals are not necessarily required to be removed, and they may be kept remained in the structural layer. When the structural layer contains metals, it can have conductivity.

In particular, when the structural layer is required to have conductivity, for example, the structural layer can be doped with impurity elements such as phosphorus, arsenic, or boron after removing the metals. A microstructure having conductivity can be effectively applied to the microelectromechanical system of the invention which is controlled with electrostatic force.

Figure 21D:
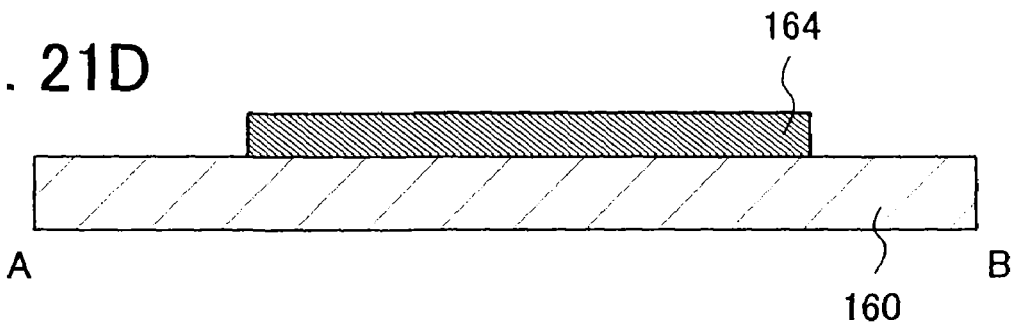

Next, the polysilicon layer is formed into a predetermined shape as shown in FIG. 21D, thereby forming an island-shaped polysilicon layer 164.

In addition, the structural layer may have a stacked structure in order to obtain the thickness thereof. For example, a polysilicon layer with a stacked structure can be formed by repeating the formation of an amorphous silicon layer and crystallization of the layer by thermal treatment. By such thermal treatment, internal stress of a polysilicon layer which is already formed can be alleviated, and thus it can be prevented that a film will come off or the substrate will be distorted. In addition, in order to alleviate the internal stress of the films, the aforementioned process may include repetitive etching of silicon layers. A manufacturing method including such etching is also suitable for a structural layer in the case of using a material having high internal stress.

Note that this embodiment mode can be freely combined with the aforementioned embodiment modes.

Embodiment Mode 6

In this embodiment mode, description is made of a sensor device as an exemplary microelectromechanical system having a microstructure which can be manufactured by the method described in Embodiment Mode 3.

Figure 14A:
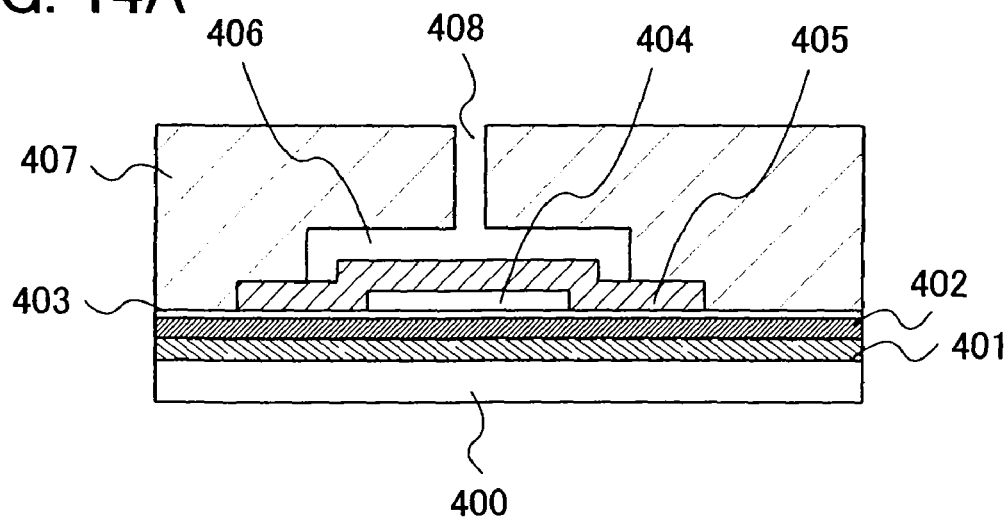
FIGS. 14A to 14C illustrate aspects of a semiconductor device of the invention.

A microstructure in this embodiment mode includes a separation layer 401 over an insulating substrate 400, and a bottom electrode 402 over the separation layer 401 (see FIG. 14A). The separation layer 401 is provided in order to peel an element layer including thin film transistors and the like off from the insulating substrate 400.

The separation layer 401 is formed of a metal layer or a semiconductor layer, which has a single-layered film made of a metal selected from among tungsten (W), molybdenum (Mo), titanium (Ti), tantalum (Ta), neodymium (Nd), palladium (Pd), niobium (Nb), nickel (Ni), cobalt (Co), zirconium (Zr), zinc (Zn), ruthenium (Ru), rhodium (Rh), lead (Pb), osmium (Os), iridium (Ir), and silicon (Si), or an alloy material or a compound material containing such an element as a main component. Alternatively, the separation layer 401 has a stacked structure of such single-layered films. As a method for forming a thin film to serve as the separation layer 401, any of sputtering, plasma CVD, droplet discharge method (typically, inkjet deposition), or printing may be used. Such a metal layer can be also formed by sputtering using a metal as a target. The thickness of the metal film formed as the separation layer is in the range of 10 to 200 nm, inclusive, or preferably in the range of 50 to 75 nm, inclusive. In the case of using a semiconductor layer as the separation layer 401, the thickness thereof may be 30 nm to 1 μm, or can be less than or equal to 30 nm within the allowable limits of a film formation apparatus. In addition, the layer containing silicon may have any of an amorphous, microcrystalline, or polycrystalline structure.

An insulating layer 403 is formed over the bottom electrode 402. Then, a first space 404, a structural layer 405, a second space 406, and an insulating layer 407 are sequentially formed over the insulating layer 403. The first space 404 is surrounded by the insulating layer 403 on its bottom side, and the structural layer 405 on its lateral sides and top side. The second space 406 is surrounded by the structural layer 405 on its bottom side, and the insulating layer 407 on its lateral sides and top side. Contact holes 408 for etching sacrificial layers are formed in the insulating layer 407 (see FIG. 14A). The first space 404 and the second space 406 can be produced by removing the sacrificial layers through the contact holes 408 and the like by one etching process. Therefore, the sacrificial layers are formed from the same material or materials which can be removed by the same etchant. Needless to say, the first space 404 and the second space 406 can be produced by removing the respective sacrificial layers by different etching processes.

Sacrificial layers for producing the first space 404 and the second space 406 which sandwich the structural layer 405 therebetween can be formed by photolithography using the same photomask. That is, sacrificial layers which correspond to the first space 404 and the second space 406 can be formed by using the same photomask. The width of the first space 404 is narrower than the width of the second space 406; therefore, each of the first sacrificial layer and the second sacrificial layer is formed by the method shown in the aforementioned embodiment modes, in such a way that the first sacrificial layer is processed to have a smaller external dimension than the second sacrificial layer by increasing or reducing the size of one or both of the resist masks. On the other hand, when the width of the first space 404 is wider than the width of the second space 406, each of the first sacrificial layer and the second sacrificial layer is formed in such a way that the first sacrificial layer is processed to have a larger external dimension than the second sacrificial layer by increasing or reducing the size of one or both of the resist masks.

Figure 14B:
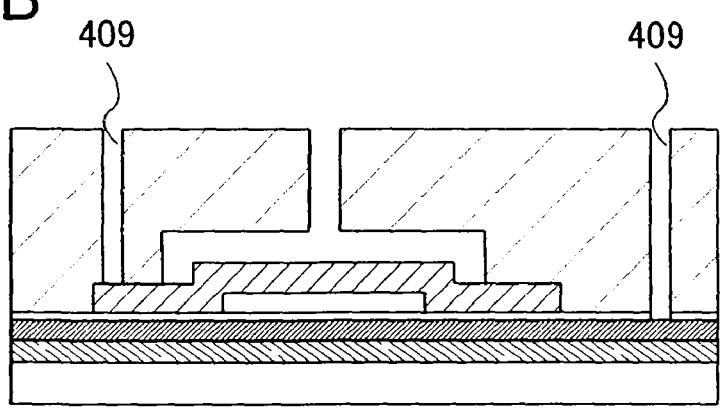

Next, the insulating layer 407 is etched by using a resist mask formed by photolithography, thereby forming contact holes 409 (see FIG. 14B). The contact holes 409 are preferably formed concurrently with the contact hole 408 in order to reduce the number of processes.

Figure 14C:
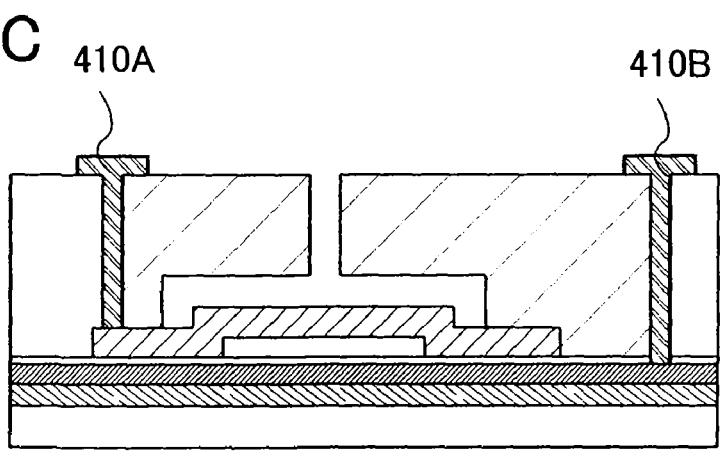

Next, conductive layers 410A and 410B are formed so as to fill the contact holes 409, such that the conductive layer 410A is electrically connected to the structural layer 405 (see FIG. 14C). The conductive layers 410A and 410B can be formed by using a film made of a metal element such as aluminum (Al), titanium (Ti), molybdenum (Mo), tungsten (W), or silicon, or an alloy film containing such an element.

Figure 15A:
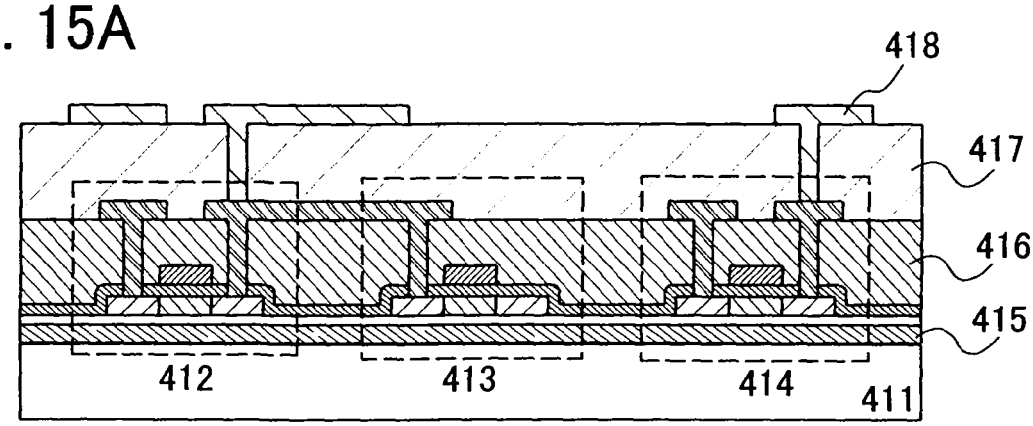
FIGS. 15A to 15C illustrate structures of a sensor.

Next, a control circuit for controlling the microstructure is formed using thin film transistors (see FIG. 15A). Each thin film transistor includes a semiconductor film, a gate electrode, a gate insulating film, a source electrode, and a drain electrode, and can be formed over an insulating substrate by a known method. The semiconductor film may have any of an amorphous, microcrystalline, or crystalline structure. When a semiconductor film with high crystallinity is used, electrical properties of the thin film transistor can be increased, which is preferable as a control circuit.

In this embodiment mode, thin film transistors 412, 413, and 414 are formed over an insulating substrate 411. The thin film transistors 412, 413, and 414 are formed over the insulating substrate 411 with a separation layer 415 interposed therebetween in order to later peel the thin film transistors off from the insulating substrate 411. The separation layer 415 can be formed in a similar manner to the separation layer 401.

An insulating layer 416 is formed to planarize the surfaces of the thin film transistors. Openings are provided in the insulating layer 416 to form source electrodes and drain electrodes. The source electrodes and the drain electrodes also function as source wires and drain wires respectively. Then, a planarization insulating layer 417 is formed on the source wires and the drain wires. After that, connecting terminals 418 which are connected to the source wire and the drain wire are formed over the insulating layer 417. Although the insulating layers 416 and 417 can be formed from either an inorganic material or an organic material, the planarity can be easily increased by selecting an organic material. The connecting terminals 418 are preferably pads with a large area in order to enable a simple connection. In this manner, a control circuit having thin film transistors over an insulating substrate can be formed.

Needless to say, the control circuit can be formed by using a chip formed from a silicon wafer. However, by forming the control circuit with thin film transistors over an insulating substrate, cost reduction can be achieved. In the case of forming a control circuit on a silicon wafer, the control circuit may be thinned by polishing the silicon wafer. As a result, thin film transistors can be easily stacked, which leads to a higher function of the control circuit.

Figure 15B:
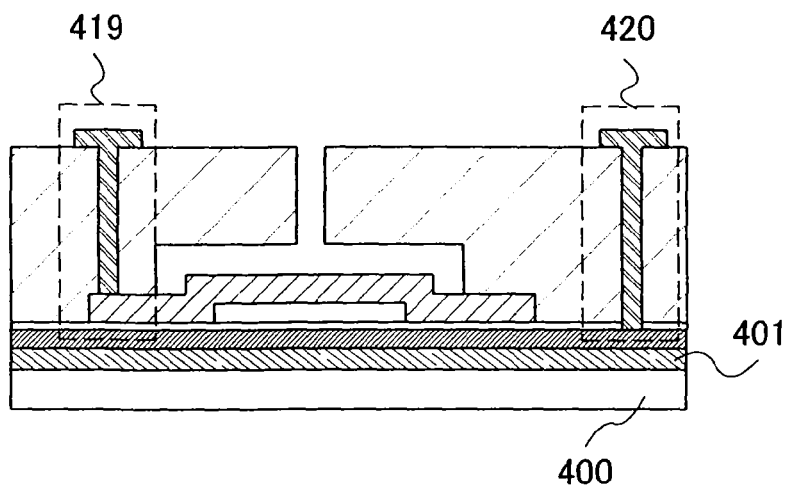

Next, the control circuit and the microstructure are connected to each other. Note that in the microstructure, a portion where the structural layer 405 is connected to the conductive layer 410A is called a first electrode 419, while a portion where the bottom electrode 402 is connected to the conductive layer 410B is called a second electrode 420 (see FIG. 15B).

Figure 15C:
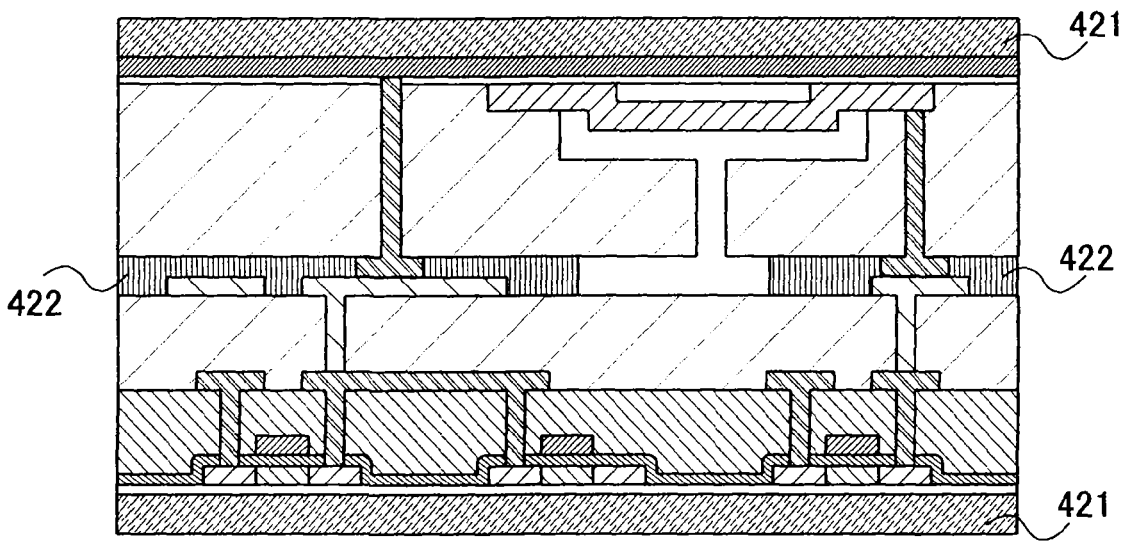

By attaching such a microstructure to the control circuit, the connecting terminals 418 are connected to the first electrode 419 and the second electrode 420 respectively as shown in FIG. 15C.

After that, the insulating substrate 400 of the microstructure and the insulating substrate 411 of the control circuit are peeled off. The insulating substrates 400 and 411 can be peeled off by changing the physical or chemical properties of the separation layers 401 and 415 and thus lowering the adhesion thereof. For example, when the separation layers 401 and 415 are formed using tungsten, crystal structures of the separation layers 401 and 415 are changed by applying thermal treatment thereto, thereby the adhesion thereof becomes lower. As a result, the insulating substrates 400 and 411 can be peeled off at the interface or at the inside of the separation layers 401 and 415. Alternatively, in the case where a layer containing silicon is used for each of the separation layers 401 and 415, openings may be formed in the insulating substrates 400 and 411 to the depth of the surfaces of the separation layers 401 and 415 respectively, so that the separation layers 401 and 415 can be removed with an etchant introduced from the openings. As a result, the insulating substrates 400 and 411 can be peeled off. Although the etchant may be either gas or liquid, it is necessary to use an etchant which selectively reacts only with the separation layers. For example, halogen fluoride can be given as an exemplary etchant which selectively reacts only with a layer containing silicon. As halogen fluoride, chlorine trifluoride ($ClF_3$) or hydrogen fluoride (HF) can be used.

In this manner, after peeling the microstructure and the control circuit off from the insulating substrates 400 and 411 respectively, plastic substrates or plastic film substrates (hereinafter called film substrates 421) can be provided on the control circuit and the microstructure. By providing film substrates, reduction in thickness and weight of the microstructure can be achieved. With the microstructure having film substrates, a microelectromechanical system which is highly flexible and reduced in weight and thickness can be provided.

Then, the control circuit and the microstructure are connected to each other using anisotropic conductive films (ACF) 422 (see FIG. 15C). Since an ACF can conduct electricity only in one direction, the connecting terminals 418 can be connected to the first electrode 419 and the second electrode 420 respectively. It is also possible to electrically connect the connecting terminals 418 to the electrodes 419 and 420 respectively using a conductive adhesive such as silver paste, copper paste, or carbon paste, an NCP (Non Conductive Paste), a solder, or the like.

Although this embodiment mode has illustrated an example where a control circuit and a microstructure are electrically connected to each other after being peeled off from their insulating substrates and then providing film substrates thereon, the invention is not limited to this. For example, the control circuit and the microstructure may be electrically connected to each other after peeling either one of the control circuit or the microstructure off from its insulating substrate and providing a film substrate thereon. Alternatively, the control circuit and the microstructure may be electrically connected to each other before peeling them off from their insulating substrates.

In this manner, a highly flexible microelectromechanical system can be formed, which can be used as a sensor.

Embodiment Mode 7

In this embodiment mode, a sensing element is described as an example of a sensor device.

Figure 16A:
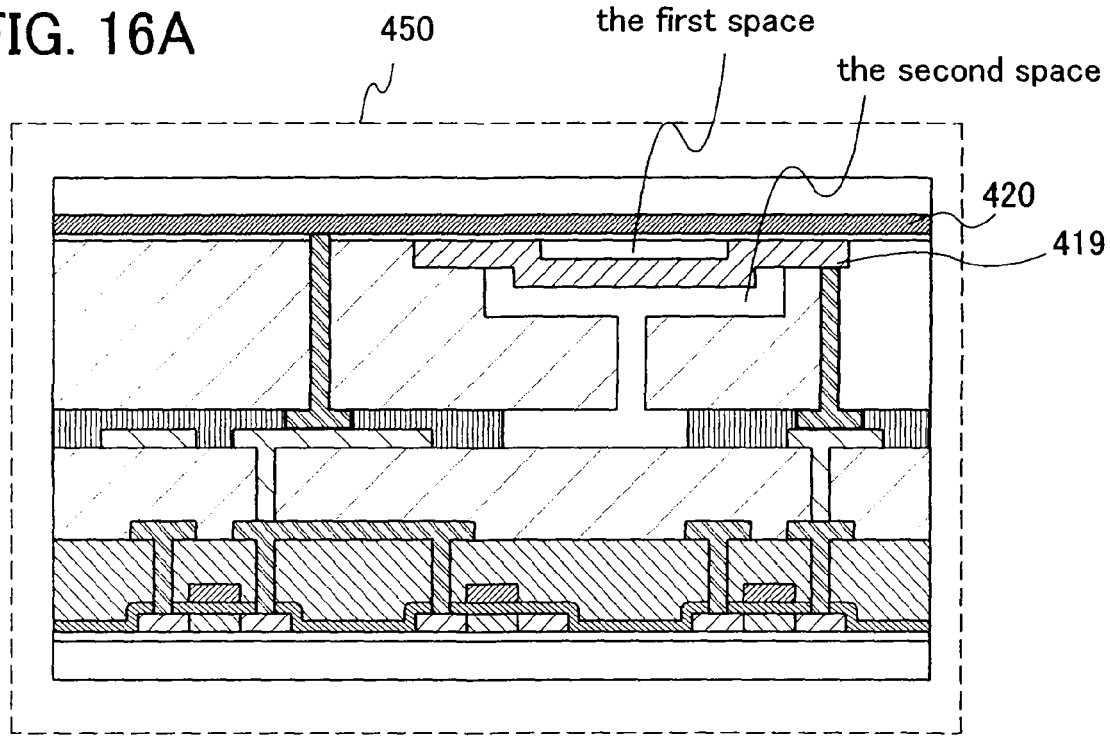
FIGS. 16A and 16B illustrate structures of a memory cell.

In a sensing element 450 shown in FIG. 16A, a capacitor is formed with the first electrode 419 (which corresponds to the structural layer 405) and the second electrode 420 (which corresponds to the bottom electrode 402). When the distance between the first electrode 419 and the second electrode 420 changes by external gravity, pressure, or the like, capacitance of the sensing element 450 changes; therefore, the external gravity, pressure, or the like can be sensed from changes in the capacitance.

Figure 16B:
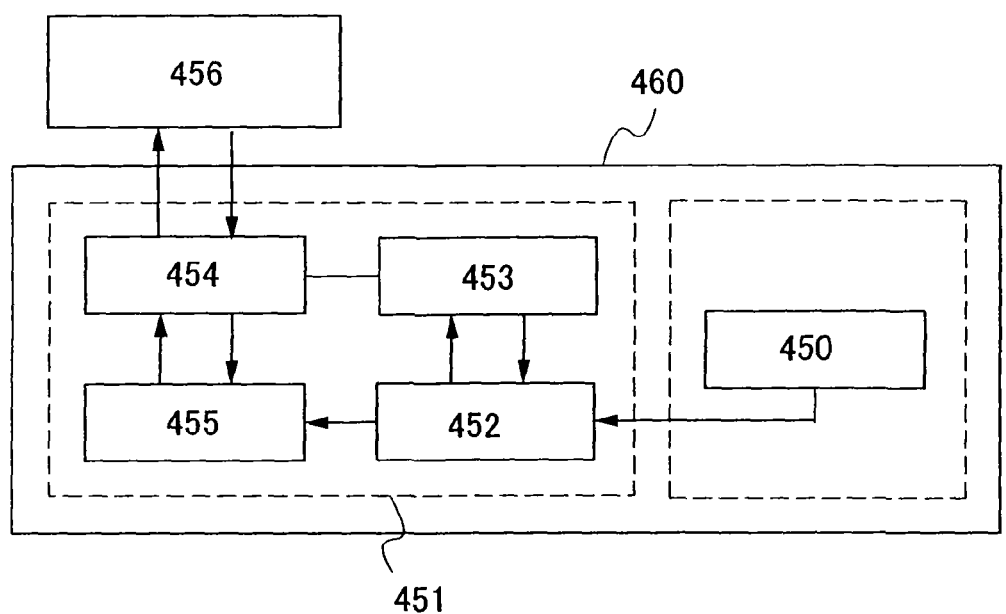

As shown in FIG. 16B, a sensor device 460 can be formed by providing an electric circuit portion 451 which includes a control circuit 453 having thin film transistors, an A/D converter circuit 452, an interface 454, and a memory 455 in addition to the sensing element 450.

The A/D converter circuit 452 can convert data obtained by the sensing element 450 into a digital signal. The control circuit 453 can control the A/D converter circuit 452, for example by storing the digital signal in the memory 455 or the like. The interface 454 can perform operation of receiving driving power and control signals from an external control device 456, transmitting sensing data to the external control device 456, and the like. The memory 455 can store sensing data, data specific to the sensor device, and the like.

The electric circuit portion 451 may further include an amplifier circuit for amplifying signals received by the sensing element 450, a central processing unit for processing data obtained by the sensing element 450, and the like.

The external control device 456 can perform operation of transmitting signals for controlling the sensing element 450, receiving data obtained by the sensing element 450, supplying driving power to the sensing element 450, and the like.

With a sensor device having such a configuration, external gravity, pressure, and the like can be sensed.

In addition, when the sensor device has a central processing unit, a sensor device which can internally process the data obtained, and can generate and output control signals for controlling other devices can be realized.

The first electrode 419 (the structural layer 405) may be formed by stacking two substances having different thermal expansion coefficients from each other. In that case, the sensing element 450 can be utilized as a temperature sensing element because the first electrode 419 (the structural layer 405) moves in accordance with changes in the temperature.

It is also possible to apply the block diagram shown in FIG. 16B to other sensor devices.

Note that this embodiment mode can be freely combined with the aforementioned embodiment modes.

Embodiment Mode 8

In this embodiment mode, description is made of a sensor device having a plurality of microstructures which can be manufactured in accordance with any one of the aforementioned embodiment modes.

Figure 18A:
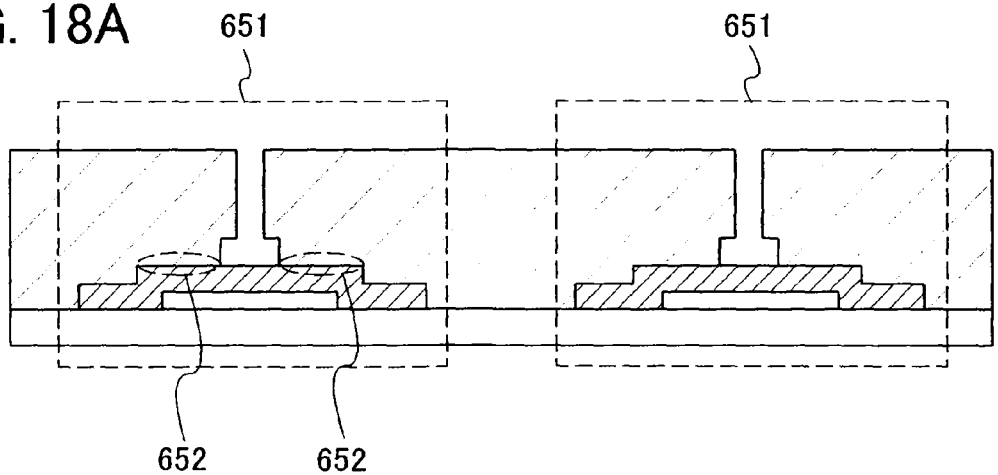
FIGS. 18A to 18C illustrate aspects of a semiconductor device of the invention.

For example, a microstructure 651 in which a space above a structural layer is smaller than a space below the structural layer can be manufactured by conducting a process of reducing the size of a resist mask which is used for forming a second sacrificial layer as in Embodiment Mode 1, where the first sacrificial layer and the second sacrificial layer are formed by using the same photomask (see FIG. 18A).

In the microstructure 651, the space above the structural layer is smaller than the space below the structural layer; therefore, contact portions 652 between an upper portion of the structural layer and an insulating layer have a large area (see FIG. 18A). Thus, the insulating layer functioning as a support has a large influence on the structural layer and, therefore, in the case of using this microstructure as a sensing element as in the aforementioned embodiment mode, a highly stable structure can be obtained.

Figure 18B:
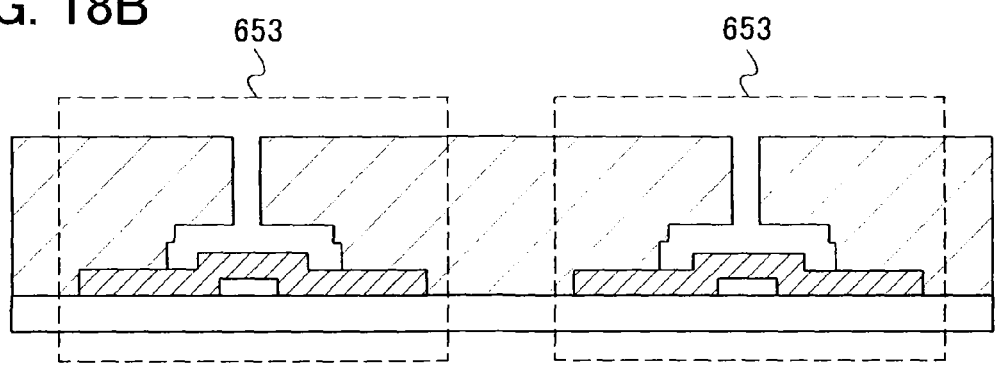

In addition, when a resist mask for forming a first sacrificial layer is processed to have a smaller size as in Embodiment Mode 2, where the first sacrificial layer and the second sacrificial layer are formed by using the same photomask, a microstructure 653 in which a space below a structural layer is smaller than a space above the structural layer can be manufactured (see FIG. 18B).

In the microstructure 653, the space below the structural layer is smaller than the space above the structural layer; therefore, there is no contact portion between an upper portion of the structural layer and an insulating layer, or if any, the contact portion between the upper portion of the structural layer and the insulating layer has a very small area (see FIG. 18B). Thus, the insulating layer functioning as a support has no influence on the structural layer, or has very little influence on the structural layer. Therefore, in the case of using this microstructure as a sensing element as in the aforementioned embodiment mode, the microstructure can be easily deformed in response to the external gravity, pressure, and the like. That is, high sensitivity can be ensured.

Figure 18C:
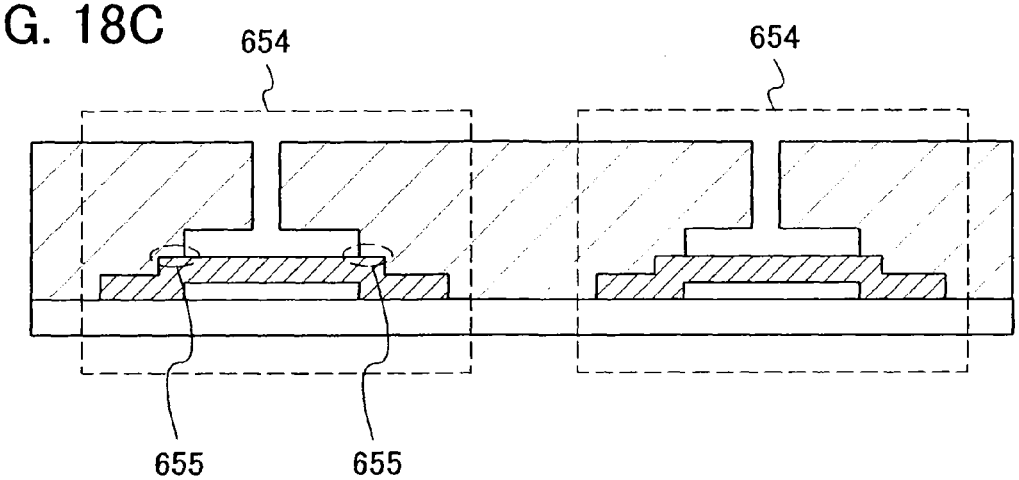

Further, a microstructure 654 in which a space below a structural layer and a space above the structural layer have the same width can be manufactured without processing any resist masks, in the process of forming the first sacrificial layer and the second sacrificial layer by using the same photomask (see FIG. 18C).

In the microstructure 654, the space below the structural layer has the same width as the space above the structural layer; therefore, contact portions 655 between an upper portion of the structural layer and an insulating layer has a relatively small area (see FIG. 18C). Thus, the insulating layer functioning as a support does not have a big influence on the structural layer and, therefore, in the case of using this microstructure as a sensing element as in the aforementioned embodiment mode, the stability of the structure can keep a balance with the deformability (sensitivity) in response to the external gravity, pressure, and the like, which is preferable.

Then, a sensor device 606 in which a sensing element 607 having the microstructure 651 with low sensitivity, a sensing element 608 having the microstructure 653 with high sensitivity, and a sensing element 609 having the microstructure 654 with higher sensitivity than the microstructure 651 and lower sensitivity than the microstructure 653 are packaged together is completed (see FIG. 19). In this manner, by packaging a plurality of sensing elements with different sensitivity from one another, a sensor device with high sensitivity can be provided.

Figure 20A:
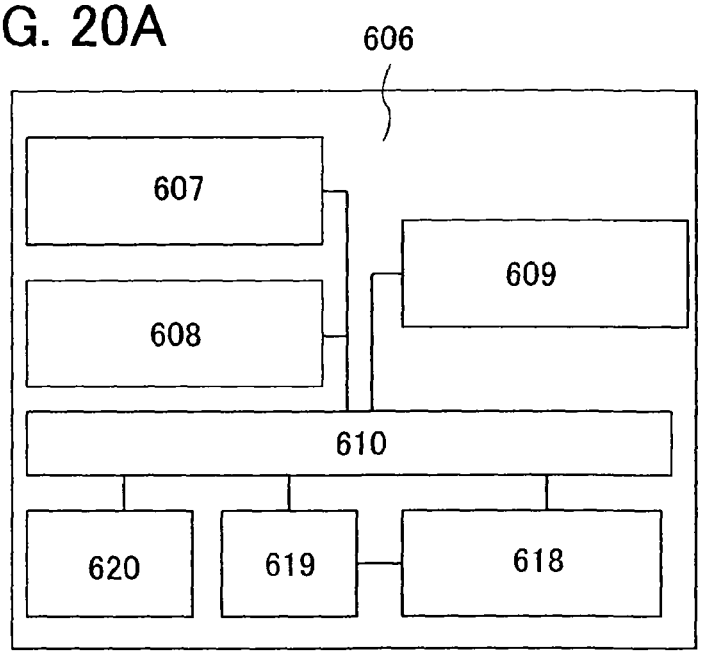
FIGS. 20A to 20C illustrate aspects of a semiconductor device of the invention.

The sensor device 606 includes a plurality of sensing elements and a control circuit for controlling them. In this embodiment mode, the sensor device 606 includes three sensing elements 607 to 609 having different sensitivity from one another, and a control circuit 610 for controlling them. Note that the number of sensing elements is not limited to three, and thus more than three sensing elements can be provided (see FIG. 20A).

Further, the sensor device 606 may include an electric circuit for wireless communication as described below. In that case, the sensor device 606 obtains driving power from electromagnetic waves which are emitted from a reader/writer, so that it can transmit data to and receive data from the reader/writer with electromagnetic waves. For example, the sensor device 606 includes an antenna 620, a memory 619, and a CPU (Central Processing Unit) 618 (see FIG. 20A). Needless to say, the sensor device 606 may have a built-in battery.

Figure 20B:
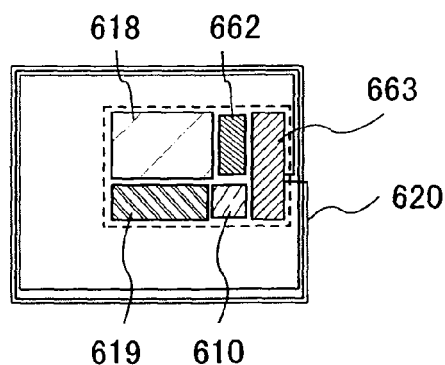

Next, FIG. 20B shows a specific mode of a sensor device. The sensor device includes the CPU 618 which occupies the largest area, a sensing element group 662 having a plurality of sensing elements, the memory 619 having a ROM or a RAM, the control circuit 610 for controlling their operation, an RF circuit 663, and the antenna 620 connected to the RF circuit 663. The antenna 620 has a spiral shape, and can be applied to communication with a frequency of 13.56 MHz, for example.

Figure 20C:
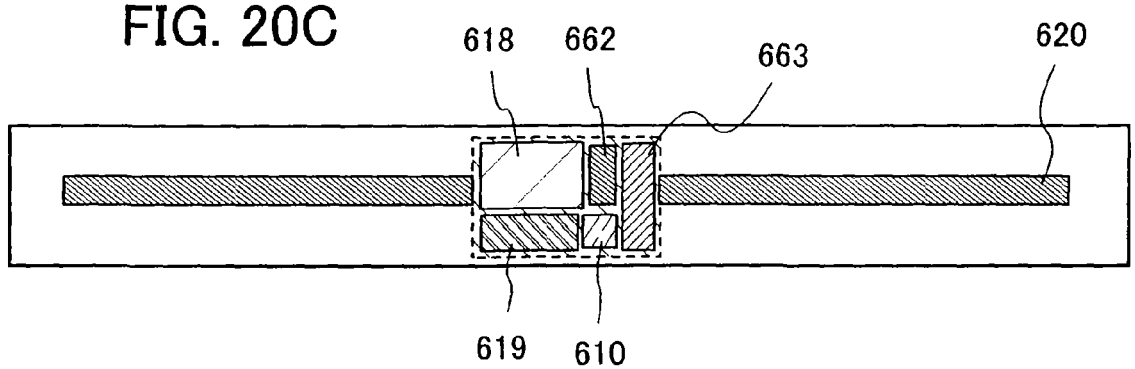

FIG. 20C shows another mode of a sensor device with an antenna having a different shape, which includes the CPU 618, the sensing element group 662, the memory 619, the control circuit 610, the RF circuit 663, and the antenna 620, similarly to FIG. 20B. The antenna 620 has a linear shape, and can be applied to communication with a frequency of UHF band (860 to 960 MHz), for example. The UHF band has a feature in its long communication distance. Depending on the communication distance, an antenna with a complex shape is used.

The antenna is formed from a conductive material by using CVD, sputtering, printing, a droplet discharge method (typically, inkjet deposition), a dispenser method, plating, or the like. As a conductive material, an element selected from among aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as a main component can be used, which may be stacked either in a single layer or a plurality of layers.

For example, when a conductive layer functioning as an antenna is formed by screen printing, conductive paste in which conductive particles with a diameter of several nm to several tens of μm are dissolved or dispersed in an organic resin can be selectively printed. In addition to the aforementioned materials, ceramic, ferrite, and the like can be used for the antenna as well.

By obtaining electric waves or signals from such an antenna, a sensor device having a wireless communication function can be provided.

A sensing element has both advantages and disadvantages because it has a tradeoff between the structural stability (operating life) and sensitivity. In addition, when there is a wide range of area to be sensed, the area might not be sensed with one sensing element. Meanwhile, when plural kinds of sensing elements are manufactured in order to sense a wide range of area, the number of photomasks is increased correspondingly, which in turn increases the cost. However, in the invention, sacrificial layers with various shapes which dominate the structural stability (operating life) and the sensitivity of a sensing element can be formed by using a single photomask; therefore, plural kinds of sensing elements can be manufactured without increasing the cost.

In this manner, a sensor device with a wide sensing range can be provided without increasing the cost.

Note that this embodiment mode can be freely combined with the aforementioned embodiment modes.

Embodiment Mode 9

In this embodiment mode, description is made of a semiconductor device which includes a microelectromechanical system having a microstructure, and which can perform wireless communication.

Figure 17:
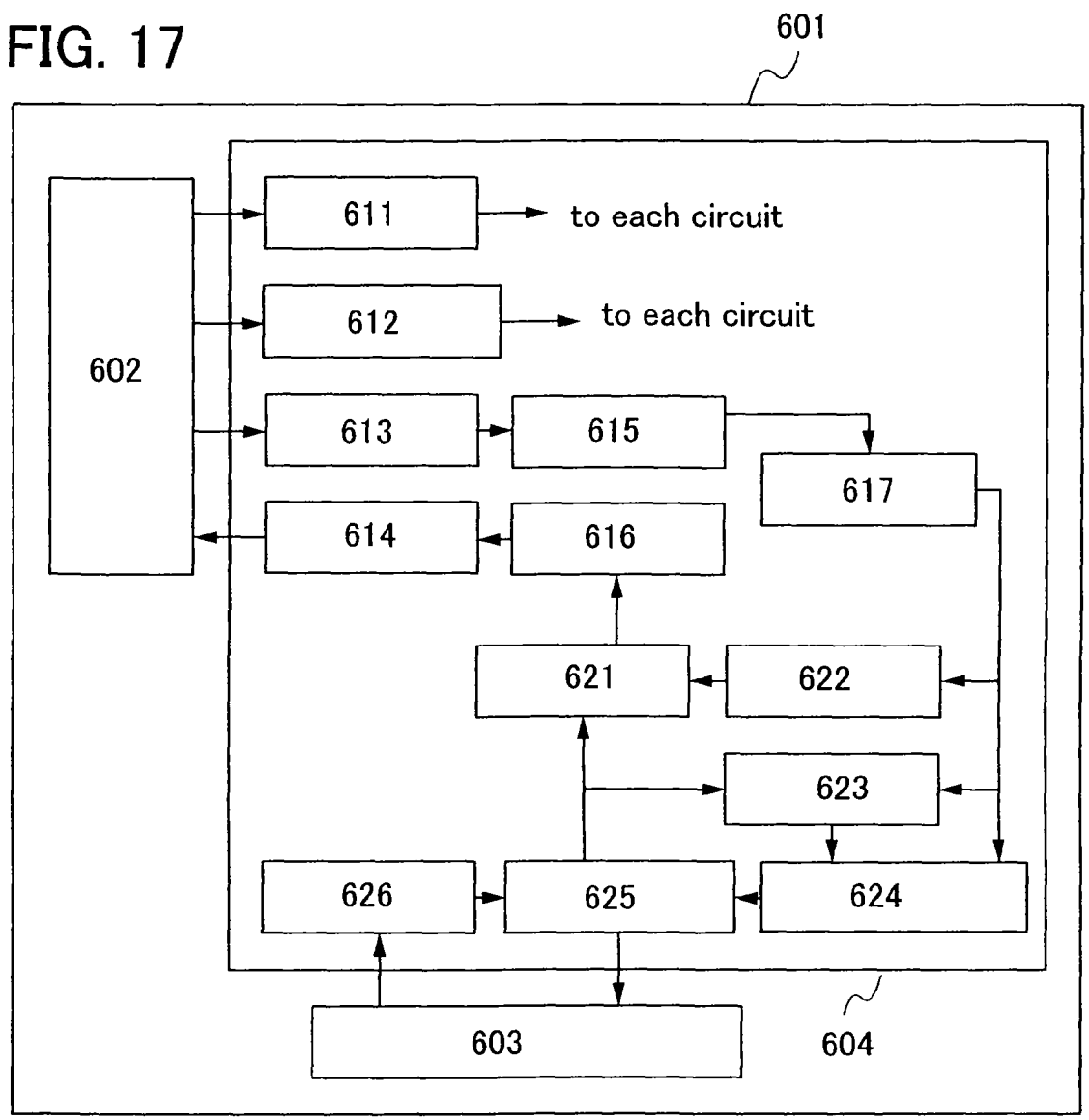
FIG. 17 illustrates a configuration of a memory cell.

FIG. 17 illustrates a specific configuration of an electric circuit 604 included in a semiconductor device 601. The electric circuit 604 generates power for driving the semiconductor device 601 by utilizing electromagnetic waves received from outside (which corresponds to a reader/writer), and further has a function of wireless communication with outside. Therefore, the electric circuit 604 includes circuits necessary for wireless communication, such as a power supply circuit 611, a clock generation circuit 612, a demodulation circuit 613, a modulation circuit 614, a decoding circuit 615, an encoding circuit 616, and a data determination circuit 617. Depending on the frequency or the communication method to be used for wireless communication, the semiconductor device 601 may have a different configuration.

The electric circuit 604 has a function of controlling a microelectromechanical system 603, processing data from a reader/writer, and the like. Therefore, the electric circuit 604 includes a memory, a memory control circuit, an arithmetic circuit, and the like. In the shown drawing, the electric circuit 604 includes a memory 621, a memory control circuit 622, an arithmetic circuit 623, a structure control circuit 624, an A/D converter circuit 625, and a signal amplifier circuit 626.

The power supply circuit 611 includes a diode and a capacitor, and is capable of rectifying an AC (Alternating Current) voltage generated in an antenna 602, holding a constant voltage, and supplying the constant voltage to each circuit. The clock generation circuit 612 includes a filter and a divider circuit, and is capable of generating clocks with a necessary frequency based on the AC voltage generated in the antenna 602, and supplying the clocks to each circuit. Note that the frequency of clocks generated in the clock generation circuit 612 is basically less than or equal to the frequency of electromagnetic waves used for communication between the reader/writer and the semiconductor device 601. Alternatively, the clock generation circuit 612 may include a ring oscillator, in which case it can generate clocks with an arbitrary frequency based on a voltage input from the power supply circuit 611.

The demodulation circuit 613 includes a filter and an amplifier circuit and is capable of demodulating a signal contained in the AC voltage generated in the antenna 602. Depending on the modulation method used for wireless communication, the demodulation circuit 613 may have a different configuration. The decoding circuit 615 decodes a signal demodulated by the demodulation circuit 613. This decoded signal corresponds to the signal transmitted from the reader/writer. The data determination circuit 617 includes a comparator circuit and the like, and is capable of determining whether or not the decoded signal is the right signal transmitted from the reader/writer. When the signal is determined to be the right signal, the data determination circuit 617 transmits a signal indicative of the right signal to each circuit (e.g., the memory control circuit 622, the arithmetic circuit 623, the structure control circuit 624, and the like) and then a circuit which has received the signal can perform a predetermined operation.

The encoding circuit 616 encodes data which is to be transmitted to the reader/writer from the semiconductor device 601. The modulation circuit 614 modulates the encoded data, and then transmits the data to the reader/writer through the antenna 602.

Data to be transmitted to the reader/writer is the data specific to the semiconductor device which is stored in the memory, or the data obtained by the function of the semiconductor device. The data specific to the semiconductor device is, for example, identification data or the like which is stored in a nonvolatile memory included in the semiconductor device. The data obtained by the function of the semiconductor device is, for example, data obtained by a microelectromechanical system or data obtained through arithmetic operation based on the data obtained by the microelectromechanical system.

The memory 621 may include either a volatile memory or a nonvolatile memory, and stores data specific to the semiconductor device 601, data obtained from the microelectromechanical system 603, and the like. Although only one memory 621 is shown in the drawing, more than one kind of memories can be provided depending on the kind of data to be stored or the function of the semiconductor device 601. The memory control circuit 622 controls the memory 621 in reading out data stored in the memory 621 or writing data into the memory 621. Specifically, the memory control circuit 622 can perform operation of generating writing signals, reading signals, memory selection signals, and the like, specifying a memory address, and the like.

The structure control circuit 624 can generate signals for controlling the microelectromechanical system 603. For example, when the microelectromechanical system 603 is controlled with an instruction from the reader/writer, the structure control circuit 624 generates signals for controlling the microelectromechanical system 603 based on the signal decoded by the decoding circuit 615. Meanwhile, when data on a program for controlling the operation of the microelectromechanical system 603 or the like is stored in the memory 621, the structure control circuit 624 generates signals for controlling the microelectromechanical system 603 based on the data read out from the memory 621. Further, the structure control circuit 624 may have a feedback function for generating signals for controlling the microelectromechanical system 603 based on the data in the memory 621, data from the reader/writer, and data obtained from the microelectromechanical system 603.

The arithmetic circuit 623 can process data obtained from the microelectromechanical system 603, for example. Further, the arithmetic circuit 623 can conduct data processing and the like in the case where the structure control circuit 624 has a feedback function. The A/D converter circuit 625 is a circuit for converting analog data to digital data, and is capable of transmitting control signals to the microelectromechanical system 603 as well as converting data from the microelectromechanical system 603 so as to transmit the data to each circuit. The signal amplifier circuit 626 can amplify weak signals obtained from the microelectromechanical system 603 and then transmit the signals to the A/D converter circuit 625.

With a semiconductor device having such a wireless transmission function, wireless communication can be enabled. A microelectromechanical system included in the semiconductor device can be manufactured by using a single photomask; therefore, manufacturing cost can be suppressed.

Additionally, since a film substrate can be used for a microelectromechanical system, reduction in weight and thickness as well as high flexibility of a semiconductor device can be achieved.

Embodiment Mode 10

In this embodiment mode, description is made of a case where a cantilever structure is used as a microstructure, and sacrificial layers for producing a first space and a second space are processed by utilizing the same photomask.

Figure 26A:
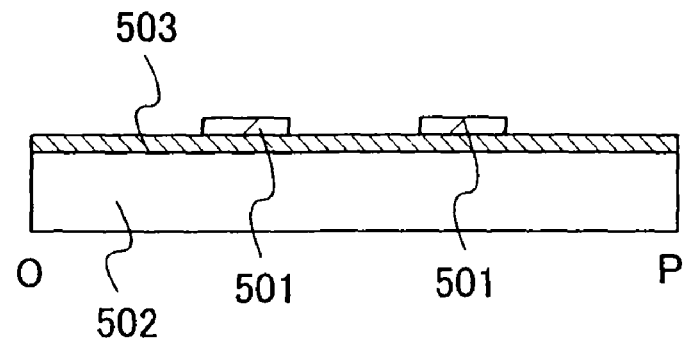
FIGS. 26A to 26C illustrate a manufacturing method of a microelectromechanical system of the invention.

As shown in FIG. 26A, conductive layers 501 are formed over a substrate 502. The conductive layers 501 can be formed directly over the substrate 502, or can be formed after forming a base film 503 over the substrate 502. FIG. 26 shows an example where the base film 503 is formed over the substrate 502, and then the conductive layers 501 are formed over the base film 503. The conductive layers 501 can be obtained through a process of forming a conductive layer, forming a resist mask thereover by photolithography, and etching the conductive film by using the resist mask, so that a pair of electrodes are formed. The method of etching may be either dry etching or wet etching. Such conductive layers 501 are formed as electrodes for pulling an upper layer of the cantilever, and is capable of controlling the drive of a switch.

Figure 26B:
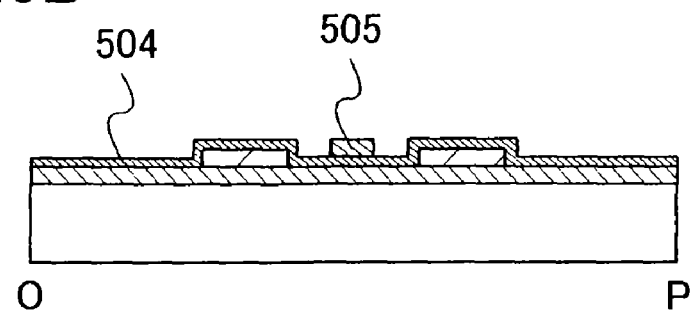

As shown in FIG. 26B, an insulating layer 504 is formed over the conductive layers 501 and then a conductive layer 505 is formed over the insulating layer 504. The insulating layer 504 can be formed by CVD, sputtering, or the like. The conductive layer 505 can be formed and processed in a similar manner to the conductive layers 501, and formed between a pair of the conductive layers 501. The conductive layer 505 formed herein functions as an electrical path of signals.

Figure 26C:
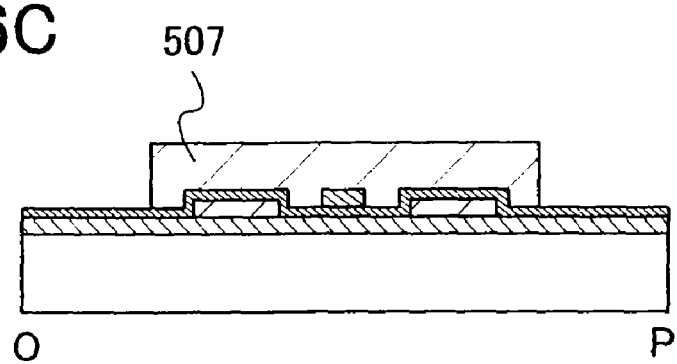

As shown in FIG. 26C, a first sacrificial layer 507 is formed over the conductive layer 505. The first sacrificial layer 507 can be obtained through a process of forming a resist mask by using a photomask A and then applying etching by using the resist mask. The method of etching may be either dry etching or wet etching. The first sacrificial layer 507 formed herein is removed later in the process of etching sacrificial layers, and thus a portion of the first sacrificial layer 507 becomes a first space.

Figure 27A:
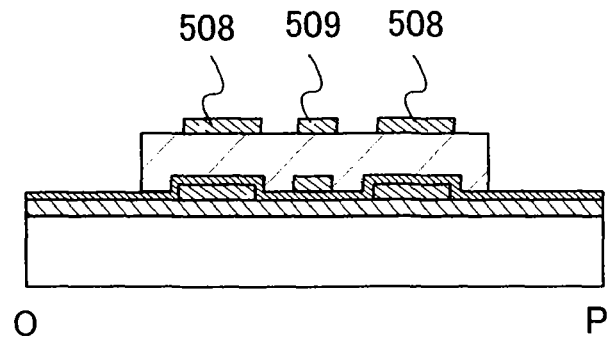
FIGS. 27A to 27C illustrate a manufacturing method of a microelectromechanical system of the invention.

As shown in FIG. 27A, conductive layers 508 and 509 are formed over the first sacrificial layer 507. The conductive layers 508 and 509 can be formed and processed in a similar manner to the conductive layers 501 and 505. Among the conductive layers 508 and 509 formed herein, the conductive layer 509 functions as a contact electrode to provide an electrical path when the conductive layer 509 contacts the conductive layer 505, while the conductive layers 508 each function as driving electrodes for driving a switch when a voltage is applied between the conductive layers 508 and the conductive layers 501. Therefore, the conductive layers 508 are disposed to face a pair of the conductive layers 501 with the first sacrificial layer 507 interposed therebetween, while the conductive layer 509 is disposed to face the conductive layer 505 with the first sacrificial layer 507 interposed therebetween.

Figure 27B:
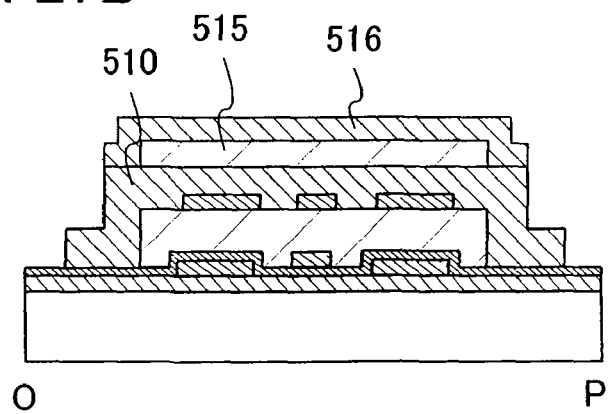

As shown in FIG. 27B, a first structural layer 510 is formed over the conductive layers 508 and 509. The first structural layer 510 can be formed by using an insulating material to have either a stacked structure or a single-layer structure. The first structural layer 510 forms a bridge structure and thus constitutes the main moving portion.

Next, as shown in FIG. 27B, a second sacrificial layer 515 is formed. The second sacrificial layer 515 can be obtained through a process of forming a resist mask by using the photomask A similarly to the first sacrificial layer 507, and then applying etching by using the resist mask. The method of etching may be either dry etching or wet etching. At this time, when the second sacrificial layer 515 is formed to have a different size from the first sacrificial layer 507, a process of reducing or increasing the size of the resist mask is conducted as shown in the aforementioned embodiment modes. As a result, a space produced after removing the second sacrificial layer can be varied from a space produced after removing the first sacrificial layer. In this manner, by forming sacrificial layers for producing stacked spaces by using the same photomask, the manufacturing cost can be reduced. After that, a second structural layer 516 is formed so as to cover the second sacrificial layer 515. The second structural layer 516 can be formed in a similar manner to the first structural layer 510. The second structural layer 516 constitutes a portion for protecting the bridge structure.

Figure 27C:
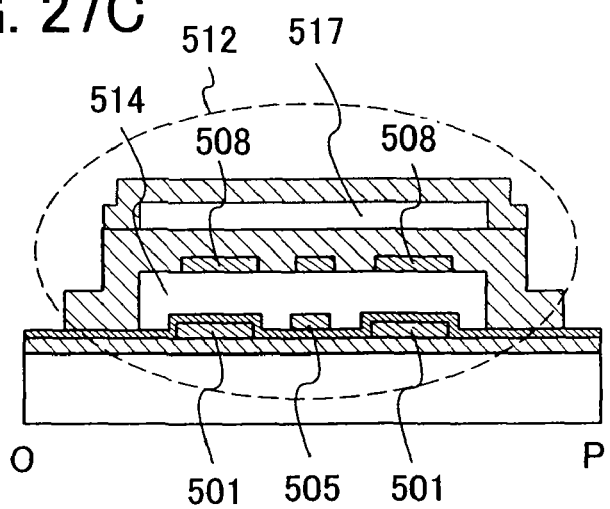

As shown in FIG. 27C, the first sacrificial layer 507 and the second sacrificial layer 515 are removed by etching. Then, a first space 514 and a second space 517 are produced. In such a state, the conductive layer 509 and the conductive layer 505 face each other with the first space 514 interposed therebetween, while the conductive layers 501 and the conductive layers 508 face each other with the first space 514 and the insulating layer 504 interposed therebetween. In addition, the first structural layer 510 and the second structural layer 516 face each other with the second space 517 interposed therebetween. In this manner, a structure 512 having the first space 514 and the second space 517 which are produced by removing the sacrificial layers, and the structural layer which can move within the spaces can be formed.

Operation of the structure manufactured by the aforementioned method is described now. The structure functions as a switch for controlling the signal transmission. The switch shown in FIG. 27C is in an off state. Here, the conductive layer 505 and the conductive layer 509 are not electrically connected to each other since no voltage is applied between the driving electrodes (i.e., between the conductive layers 501 and 508).

Figure 28:
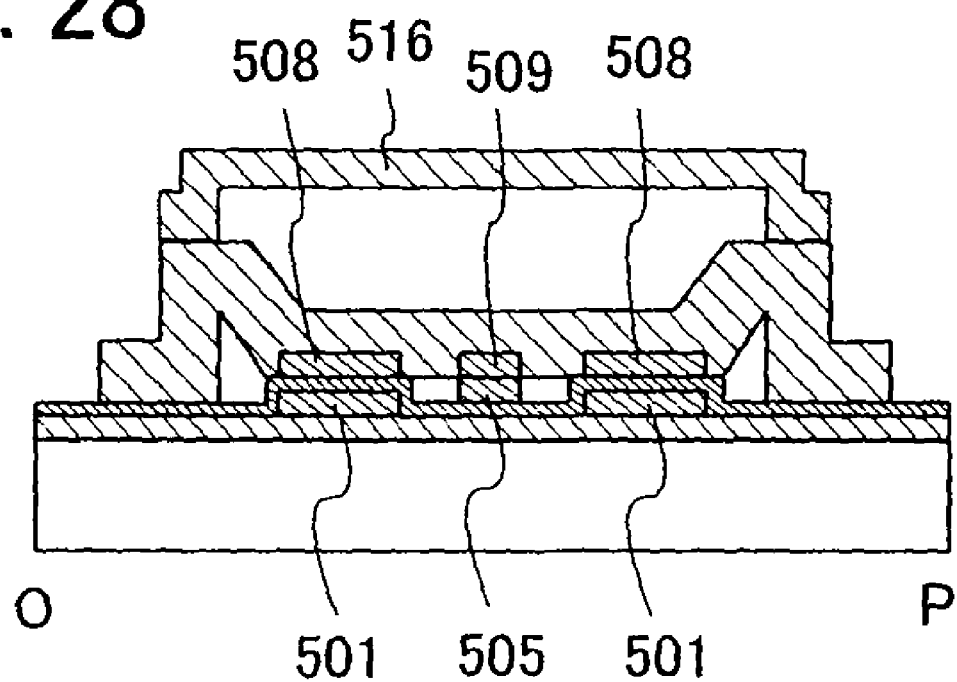
FIG. 28 illustrates a manufacturing method of a microelectromechanical system of the invention.

FIG. 28 shows a switch in an on state. Here, electromagnetic force is generated by generating a potential difference between the driving electrodes (i.e., between the conductive layers 501 and 508), thereby the first structural layer 510 is pulled downwards. By pulling the first structural layer 510 downwards to the level that the conductive layer 505 contacts the conductive layer 509, the conductive layers 505 and 509 are electrically connected to each other. Since the conductive layers 505 and the 509 are provided to interpose a space therebetween, switching operation can be conducted in this manner.

In this manner, the switch utilizing electrostatic attraction is driven by a balance between the electrostatic attraction generated between the driving electrodes (i.e., between the conductive layers 501 and 508) and the restoring force (spring constant×the amount of displacement) which is dependent on the material and the structure of the first structural layer 510. That is, the switch can be turned on by applying a voltage for generating electrostatic force which is stronger than the restoring force of the first structural layer 510 (see FIG. 28).

Figure 29A:
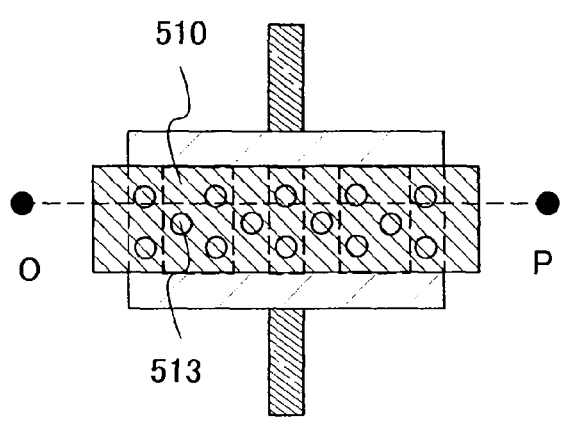
FIGS. 29A and 29B illustrate a manufacturing method of a microelectromechanical system of the invention.
Figure 29B:
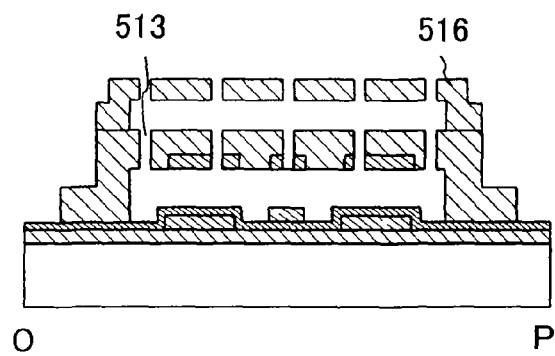

As shown in FIGS. 29A and 29B, it is also possible to provide holes 513 in the first structural layer 510 and the second structural layer 516. FIG. 29A shows a top view of such a structure, and FIG. 29B shows a cross-sectional view thereof along a line O-P.

The holes 513 can be formed by etching using a resist mask prior to the etching of the sacrificial layers. The method of etching may be either dry etching or wet etching.

When holes are provided in the structural layers as shown in FIGS. 29A and 29B, air resistance acting on the movable structural layer with a bridge structure can be reduced, thereby the switching speed can be increased. Additionally, the provision of holes will have an effect of reducing the residual stress inside the structural layers, thereby lowering the spring constant. Further, by reducing the weight of the structural layers, mechanical resonant frequency of the structural layers can be increased. In addition, even when the holes are provided to penetrate the conductive layers 508, electrostatic capacitance between the driving electrodes remains about the same as long as the diameter of each hole is less than or equal to three to four times as long as the distance between the conductive layers 501 and 508 functioning as the driving electrodes. This is because defects in electrostatic capacitance of the holes can be compensated by a fringing effect.

Although this embodiment mode has illustrated an example of a structure with a bridge shape, a structure with a cantilever shape, for example, can also be formed. In addition, this embodiment mode can be freely combined with the aforementioned embodiment modes.

Embodiment Mode 11

A microelectromechanical system of the invention can be applied to a memory device having microstructures as its memory elements. This embodiment mode illustrates an exemplary memory device formed by using microstructures in memory cells while using semiconductor elements and the like in peripheral circuits such as a decoder.

Figure 22:
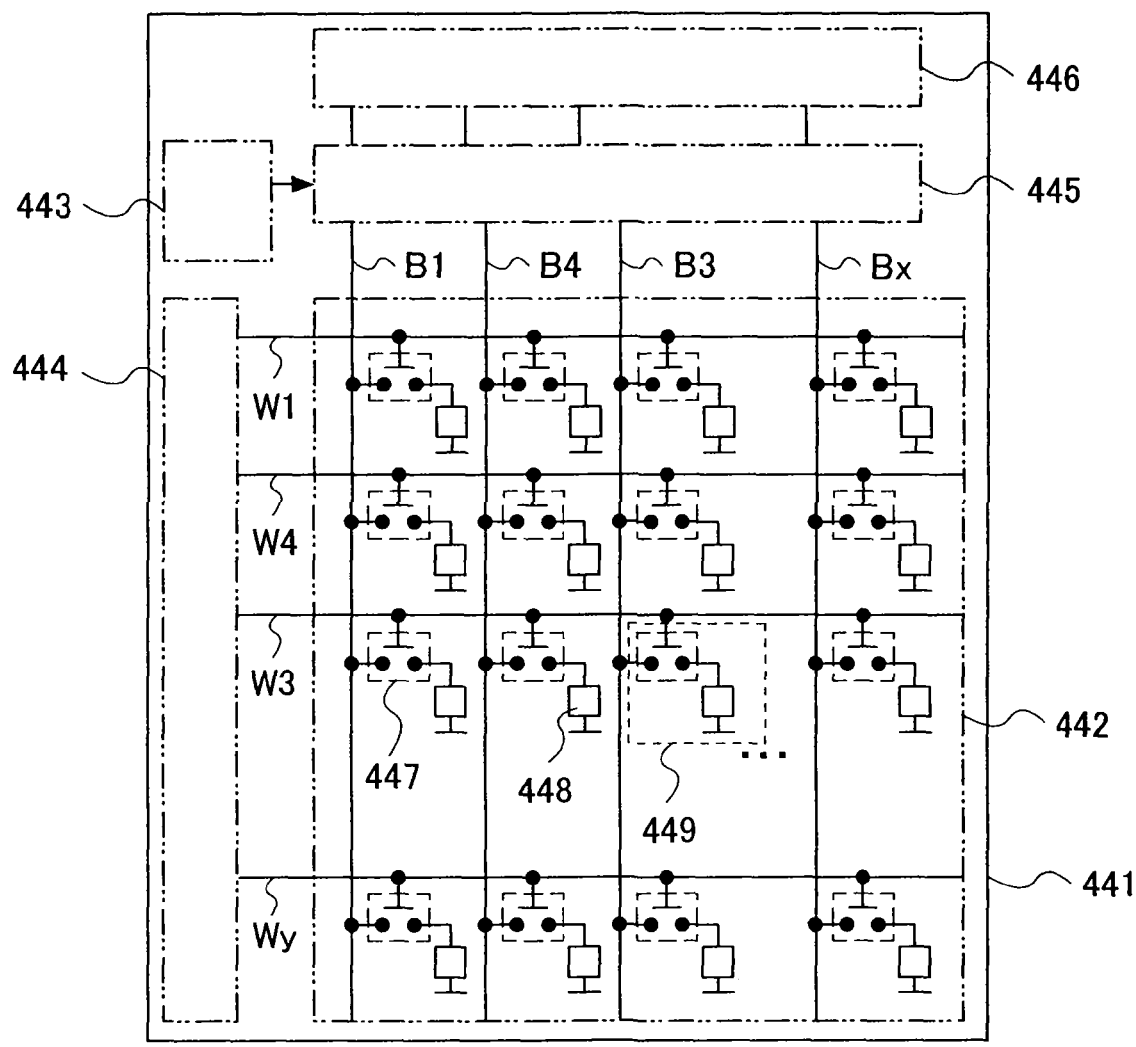
FIG. 22 illustrates one aspect of a semiconductor device of the invention.

FIG. 22 shows a structure of a memory device 441 which is one mode of a microelectromechanical system of the invention.

The memory device 441 includes a memory cell array 442, decoders 443 and 444, a selector 445, and a read/write circuit 446. The decoders 443 and 444 and the selector 445 may have known configurations.

Each memory cell 449 may include, for example, a memory element 448 and a switching element 447 for controlling the memory element 448. The memory device 441 in this embodiment mode may have any of the following structures: both of the switching element 447 and the memory element 448 are formed from microstructures, only the switching element 447 is formed from a microstructure, or only the memory element 448 is formed from a microstructure.

Figure 23:
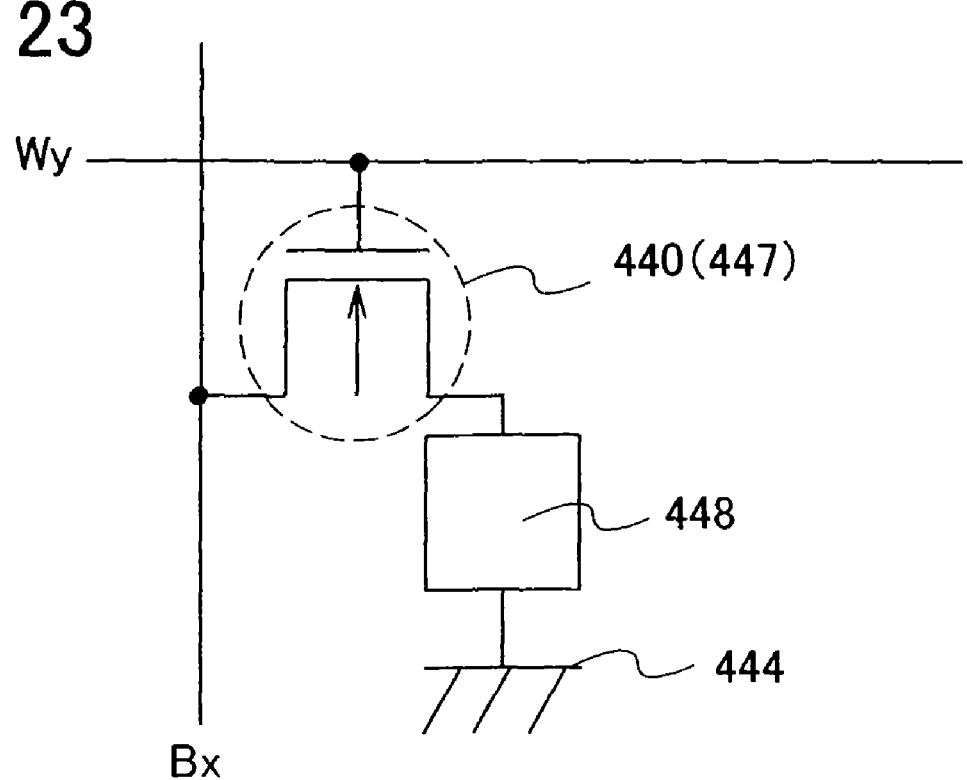
FIG. 23 illustrates one aspect of a semiconductor device of the invention.

FIG. 23 shows an exemplary configuration of the memory cell 449. FIG. 23 is a circuit diagram of the memory cell 449.

As shown in FIG. 23, the memory cell 449 includes the switching element 447 formed of a transistor 440, and the memory element 448 formed of a microstructure.

Such a memory cell can employ a microstructure shown in the aforementioned embodiment modes. The memory element 448 forms a capacitor having structural layers as its conductive layers. One of the conductive layers is connected to one of two high-concentration impurity regions of the transistor 440, while the other conductive layer is connected in common to the other memory elements 448 in all of the memory cells 449 included in the memory device 441. The latter conductive layer functions to supply a common potential to all of the memory elements at the time of reading data from or writing data to the memory device. Such a conductive layer is also referred to as a common electrode 444 in this specification.

The memory device with the aforementioned configuration can be used as a volatile memory, typically a DRAM (Dynamic Random Access Memory). In addition, the memory device can also be used as a mask ROM by changing the thickness of a dielectric layer of the capacitor in the manufacturing process. It can also be used as a write-once memory by destroying the memory element. The peripheral circuits of the memory device may have known configurations and can be driven by using known techniques.

Since the memory device can be manufactured by using the manufacturing method described in the aforementioned embodiment mode, the manufacturing cost can be suppressed.

Note that this embodiment mode can be freely combined with the aforementioned embodiment modes. For example, a memory device shown in this embodiment mode can be used as a memory included in the semiconductor device shown in the aforementioned embodiment mode.

Embodiment Mode 12

In this embodiment mode, description is made of a specific structure and an exemplary usage of a semiconductor device using a wireless communication technique which is described in the aforementioned embodiment modes, with reference to the drawings.

Figure 24A:
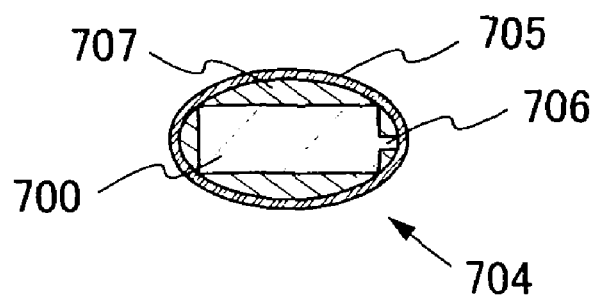
FIGS. 24A and 24B illustrate aspects of a semiconductor device of the invention.

Referring to a semiconductor device 704 shown in FIG. 24A, a microelectromechanical system 700 of this embodiment mode is incorporated in a capsule 705 coated with a protective layer. In addition, a flow path 706 connected to an outlet of the microelectromechanical system 700 is provided. Alternatively, a content of the capsule 705 can be exhausted to the outside of the capsule 705 directly from the outlet of the microelectromechanical system 700 without providing the flow path 706. A space between the capsule 705 and the microelectromechanical system 700 may be filled with a filling agent 707.

It is preferable that the protective film provided over the surface of the capsule contain diamond like carbon (DLC), silicon nitride, silicon oxide, silicon nitride oxide, silicon oxynitride, or carbon nitride. The capsule and the filling agent can be formed by using known materials as appropriate. By covering the capsule with a protective layer, the capsule or the semiconductor device can be prevented from being melted or deformed inside the human body.

Further, by forming the outmost surface of the capsule to be roundish such as an elliptical spherical shape, the semiconductor device 704 can be safely used without harming the human body.

The semiconductor device 704 in this embodiment mode can be put into the human body so that a diseased part of the body can be infused with a medicine. In addition, by providing the semiconductor device 704 with optional functions such as a sensor for detecting the functional data of a living organism through measurement of the physical quantity or chemical quantity (e.g., blood viscosity), or a sampler for sampling a cell of a diseased part, data obtained can be converted into a signal and processed with an electric circuit, so that it can be wirelessly transmitted to a reader/writer. Depending on the configuration of the electric circuit included in the semiconductor device, it is also possible to provide a sophisticated function of, for example, moving a semiconductor device inside the human body while searching diseased parts, and determining whether or not to infuse a medicine through observation of the diseased parts, based on the data obtained by the microelectromechanical system.

Figure 24B:
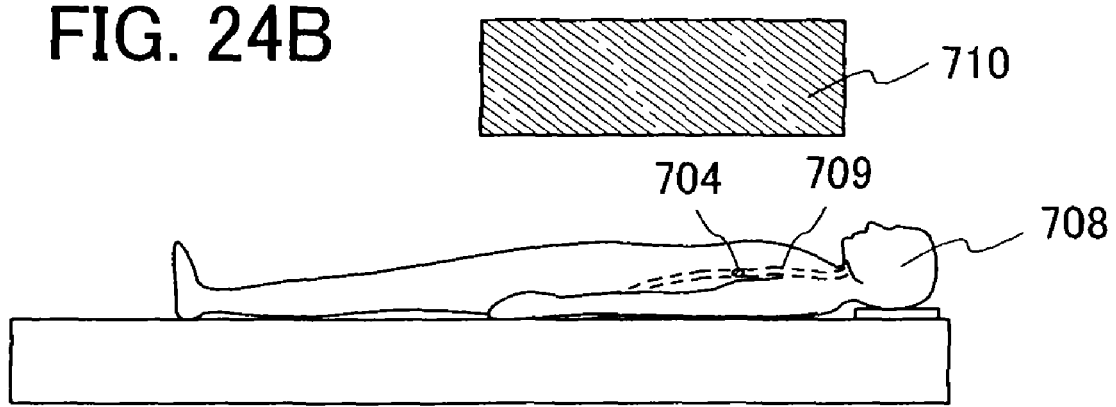

As shown in FIG. 24B, a human subject 708 is made swallow the semiconductor device 704 so that a medicine is made travel through a cavity 709 to a predetermined position which is to be infused with the medicine. A reader/writer 710 controls the semiconductor device 704, performs wireless communication, and ejects a medicine.

The semiconductor device 704 in this embodiment mode is not limited to use for medical purposes and, therefore, can be used for a wide range of applications as an ejection device capable of being controlled remotely. For example, when there is a risk for workers in working, for example such that a harmful gas might be generated or explosion may occur during an operation of a compounder, it is possible to compound chemicals by filling a tank in the microelectromechanical system 700 of the semiconductor device 704 in this embodiment mode with the chemicals and remotely controlling the device. Accordingly, the chemicals can be compounded by remote control, and thus the danger to the workers can be significantly reduced.

Embodiment Mode 13

In this embodiment mode, description is made of a specific structure and an exemplary usage of a semiconductor device using a wireless communication technique which is described in the aforementioned embodiment modes, with reference to the drawings.

Here, description is made of an exemplary semiconductor device which uses a microelectromechanical system as a pressure sensor.

Figure 25A:
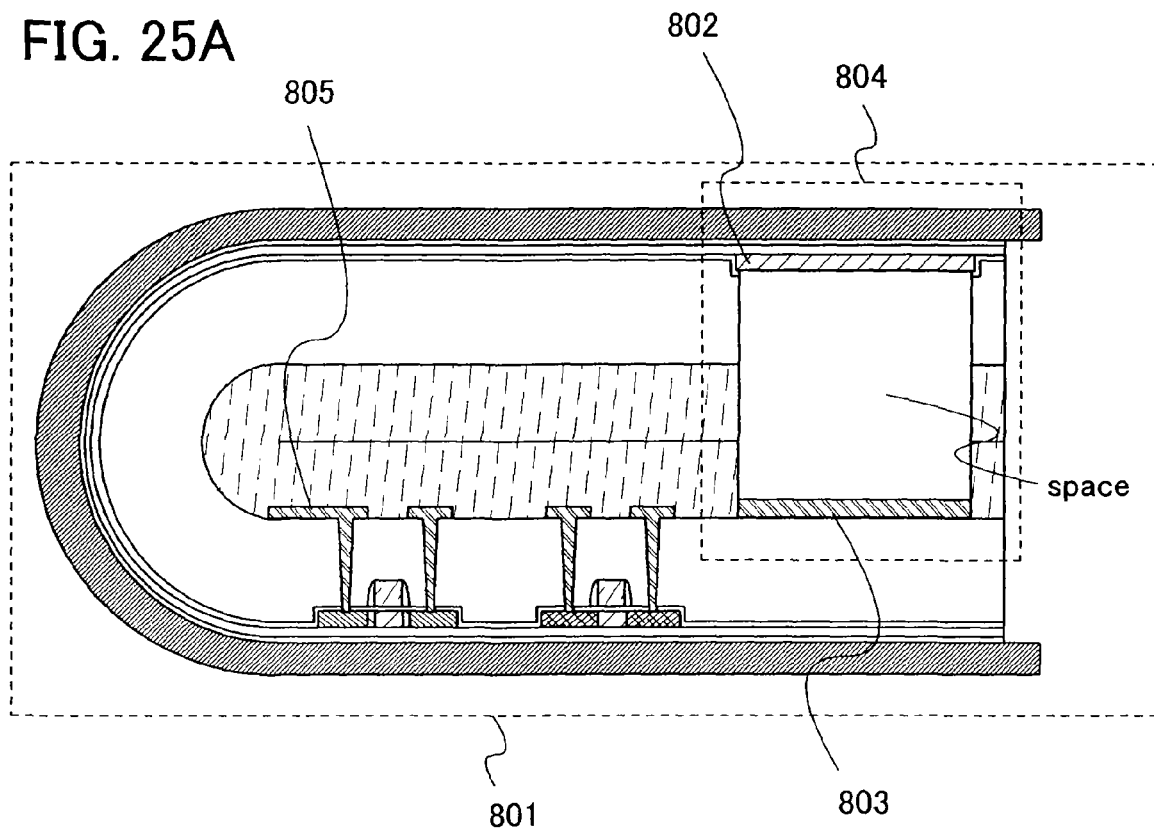
FIGS. 25A and 25B illustrate aspects of a semiconductor device of the invention.

As shown in FIG. 25A, a microelectromechanical system 801 of this embodiment mode includes a sensing element 804 having a first conductive layer 802 and a second conductive layer 803. The first conductive layer 802 moves upon receiving electromagnetic force, pressure, or the like; therefore, the sensing element 804 is a variable capacitor where the distance between the first conductive layer and the second conductive layer changes.

By utilizing such a structure, the sensing element 804 can be used as a pressure sensor whose first conductive layer 802 moves by pressure.

The microelectromechanical system 801 also includes an antenna 805 for conducting wireless communication with a reader/writer. The antenna 805 obtains driving power from electromagnetic waves which are emitted from the reader/writer, so that it can transmit data to and receive data from the reader/writer with electromagnetic waves.

Figure 25B:
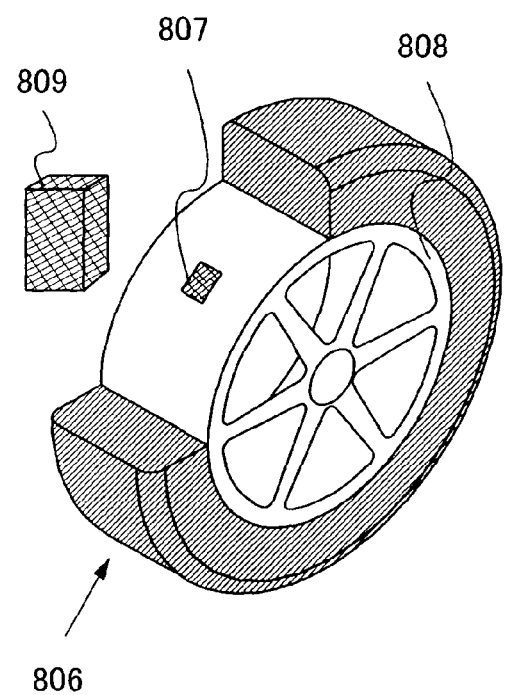

FIG. 25B shows a specific example of a case where the microelectromechanical system 801 is used as a pressure sensor. When a tire 806 of an automobile has a loss in air pressure, the deformation volume of the tire 806 is increased, which leads to an increase in resistance, decrease in mileage, and increase in the possibility of causing an accident. With the semiconductor device in this embodiment mode, a system which can monitor the air pressure of the tire 806 relatively easily on a daily basis can be provided.

As shown in FIG. 25B, a semiconductor device 807 whose microelectromechanical system 801 is coated with a protective layer is set on a wheel 808 portion of the tire 806.

Then, by conducting wireless communication by putting a reader/writer 809 close to the semiconductor device 807, data on the air pressure of the tire 806 can be obtained. The wireless communication technique and the like are similar to those in Embodiment Mode 10.

In accordance with this embodiment mode, the air pressure of a tire can be monitored relatively easily on a daily basis without going to an automobile maintenance shop such as gas stations.

The present application is based on Japanese Priority application No. 2005-327538 filed on Nov. 11, 2005 with the Japanese Patent Office, the entire contents of which are hereby incorporated by reference.

What is claimed is:

1. A manufacturing method of a microstructure, comprising the steps of:
    forming a first layer over an insulating substrate;
    forming a first resist mask over the first layer by using a photomask;
    processing the first layer by using the first resist mask to form a first sacrificial layer;
    forming a second layer over the first sacrificial layer;
    forming a second resist mask over the second layer by using the photomask;
    conducting a process for changing an external dimension of the second resist mask;
    processing the second layer by using the second resist mask to form a second sacrificial layer;
    forming an insulating layer so as to cover the second sacrificial layer;
    forming openings in the insulating layer; and
    introducing an etchant into the openings so that the first sacrificial layer and the second sacrificial layer are concurrently removed.

2. The manufacturing method of a microstructure according to claim 1, wherein the external dimension of the second resist mask is changed by reducing the external dimension of the second resist mask.

3. The manufacturing method of a microstructure according to claim 1, wherein the external dimension of the second resist mask is changed by increasing the external dimension of the second resist mask.

4. The manufacturing method of a microstructure according to claim 1, wherein the external dimension of the second resist mask is changed by reducing the external dimension of the second resist mask; and wherein oxygen plasma is used for the process for reducing the external dimension of the second resist mask.

5. The manufacturing method of a microstructure according to claim 1,
    wherein the external dimension of the second resist mask is changed by increasing the external dimension of the second resist mask; and
    wherein the external dimension of the second resist mask is increased by controlling a quantity of light for exposing a photoresist in a photolithography process for forming the second resist mask.

6. The manufacturing method of a microstructure according to claim 1,
    wherein the external dimension of the second resist mask is changed by increasing the external dimension of the second resist mask;
    wherein the second resist mask is formed of a positive resist mask; and
    wherein the external dimension of the second resist mask is increased by reducing a quantity of light for exposing a photoresist or reducing an exposure time in a photolithography process for forming the second resist mask.

7. The manufacturing method of a microstructure according to claim 1,
    wherein the external dimension of the second resist mask is changed by increasing the external dimension of the second resist mask;
    wherein the second resist mask is formed of a negative resist mask; and
    wherein the external dimension of the second resist mask is increased by increasing a quantity of light for exposing a photoresist or increasing an exposure time in a photolithography process for forming the second resist mask.

8. The manufacturing method of a microstructure according to claim 1, wherein the first sacrificial layer or the second sacrificial layer is formed to contain one or more of titanium, aluminum, molybdenum, tungsten, tantalum, and silicon.

9. A manufacturing method of a microelectromechanical system, comprising a microstructure manufactured by the method according to claim 1, and a transistor over an insulating substrate, wherein the microstructure and the transistor are electrically connected to each other.

10. A manufacturing method of a microstructure, comprising the steps of:
    forming a first layer over an insulating substrate;
    forming a first resist mask over the first layer by using a photomask;
    conducting a process for changing an external dimension of the first resist mask;
    processing the first layer by using the first resist mask to form a first sacrificial layer;
    forming a second layer over the first sacrificial layer;
    forming a second resist mask over the second layer by using the photomask;
    processing the second layer by using the second resist mask to form a second sacrificial layer;
    forming an insulating layer so as to cover the second sacrificial layer;
    forming openings in the insulating layer; and
    introducing an etchant into the openings so that the first sacrificial layer and the second sacrificial layer are concurrently removed.

11. The manufacturing method of a microstructure according to claim 10, wherein the external dimension of the first resist mask is changed by reducing the external dimension of the first resist mask.

12. The manufacturing method of a microstructure according to claim 10, wherein the external dimension of the first resist mask is changed by increasing the external dimension of the first resist mask.

13. The manufacturing method of a microstructure according to claim 10, wherein the external dimension of the first resist mask is changed by reducing the external dimension of the first resist mask; and wherein oxygen plasma is used for the process for reducing the external dimension of the first resist mask.

14. The manufacturing method of a microstructure according to claim 10,
wherein the external dimension of the first resist mask is changed by increasing the external dimension of the first resist mask; and
wherein the external dimension of the first resist mask is increased by controlling a quantity of light for exposing a photoresist in a photolithography process for forming the first resist mask.

15. The manufacturing method of a microstructure according to claim 10,
wherein the external dimension of the first resist mask is changed by increasing the external dimension of the first resist mask;
wherein the first resist mask is formed of a positive resist mask; and
wherein the external dimension of the first resist mask is increased by reducing a quantity of light for exposing a photoresist or reducing an exposure time in a photolithography process for forming the first resist mask.

16. The manufacturing method of a microstructure according to claim 10,
wherein the external dimension of the first resist mask is changed by increasing the external dimension of the first resist mask;
wherein the first resist mask is formed of a negative resist mask; and
wherein the external dimension of the first resist mask is increased by increasing a quantity of light for exposing a photoresist or increasing an exposure time in a photolithography process for forming the first resist mask.

17. The manufacturing method of a microstructure according to claim 10, wherein the first sacrificial layer or the second sacrificial layer is formed to contain one or more of titanium, aluminum, molybdenum, tungsten, tantalum, and silicon.

18. A manufacturing method of a microelectromechanical system, comprising a microstructure manufactured by the method according to claim 10, and a transistor over an insulating substrate, wherein the microstructure and the transistor are electrically connected to each other.

19. A manufacturing method of a microstructure, comprising the steps of:
forming a first layer over an insulating substrate;
forming a first resist mask over the first layer by using a photomask;
processing the first layer by using the first resist mask to form a first sacrificial layer;
forming a structural layer over the first sacrificial layer;
forming a second layer over the structural layer;
forming a second resist mask over the second layer by using the photomask;
conducting a process for changing an external dimension of the second resist mask;
processing the second layer by using the second resist mask to form a second sacrificial layer;
forming an insulating layer so as to cover the second sacrificial layer;
forming openings in the insulating layer; and
introducing an etchant into the openings so that the first sacrificial layer and the second sacrificial layer are concurrently removed.

20. The manufacturing method of a microstructure according to claim 19, wherein the external dimension of the second resist mask is changed by reducing the external dimension of the second resist mask.

21. The manufacturing method of a microstructure according to claim 19, wherein the external dimension of the second resist mask is changed by increasing the external dimension of the second resist mask.

22. The manufacturing method of a microstructure according to claim 19, wherein the structural layer is formed to contain one or more of titanium, aluminum, molybdenum, tungsten, tantalum, and silicon which have etching selectivity with respect to the first sacrificial layer and the second sacrificial layer.

23. The manufacturing method of a microstructure according to claim 19, wherein the external dimension of the second resist mask is changed by reducing the external dimension of the second resist mask; and wherein oxygen plasma is used for the process for reducing the external dimension of the second resist mask.

24. The manufacturing method of a microstructure according to claim 19,
wherein the external dimension of the second resist mask is changed by increasing the external dimension of the second resist mask; and
wherein the external dimension of the second resist mask is increased by controlling a quantity of light for exposing a photoresist in a photolithography process for forming the second resist mask.

25. The manufacturing method of a microstructure according to claim 19,
wherein the external dimension of the second resist mask is changed by increasing the external dimension of the second resist mask;
wherein the second resist mask is formed of a positive resist mask; and
wherein the external dimension of the second resist mask is increased by reducing a quantity of light for exposing a photoresist or reducing an exposure time in a photolithography process for forming the second resist mask.

26. The manufacturing method of a microstructure according to claim 19,
wherein the external dimension of the second resist mask is changed by increasing the external dimension of the second resist mask;
wherein the second resist mask is formed of a negative resist mask; and
wherein the external dimension of the second resist mask is increased by increasing a quantity of light for exposing a photoresist or increasing an exposure time in a photolithography process for forming the second resist mask.

27. The manufacturing method of a microstructure according to claim 19, wherein the first sacrificial layer or the second sacrificial layer is formed to contain one or more of titanium, aluminum, molybdenum, tungsten, tantalum, and silicon.

28. A manufacturing method of a microelectromechanical system, comprising a microstructure manufactured by the method according to claim 19, and a transistor over an insulating substrate, wherein the microstructure and the transistor are electrically connected to each other.

29. A manufacturing method of a microstructure, comprising the steps of:
forming a first layer over an insulating substrate;
forming a first resist mask over the first layer by using a photomask;
conducting a process for changing an external dimension of the first resist mask;
processing the first layer by using the first resist mask to form a first sacrificial layer;
forming a structural layer over the first sacrificial layer;
forming a second layer over the structural layer;
forming a second resist mask over the second layer by using the photomask;
processing the second layer by using the second resist mask to form a second sacrificial layer;
forming an insulating layer so as to cover the second sacrificial layer;
forming openings in the insulating layer; and
introducing an etchant into the openings so that the first sacrificial layer and the second sacrificial layer are concurrently removed.

30. The manufacturing method of a microstructure according to claim 29, wherein the external dimension of the first resist mask is changed by reducing the external dimension of the first resist mask.

31. The manufacturing method of a microstructure according to claim 29, wherein the external dimension of the first resist mask is changed by increasing the external dimension of the first resist mask.

32. The manufacturing method of a microstructure according to claim 29, wherein the structural layer is formed to contain one or more of titanium, aluminum, molybdenum, tungsten, tantalum, and silicon which have etching selectivity with respect to the first sacrificial layer and the second sacrificial layer.

33. The manufacturing method of a microstructure according to claim 29, wherein the external dimension of the first resist mask is changed by reducing the external dimension of the first resist mask; and wherein oxygen plasma is used for the process for reducing the external dimension of the first resist mask.

34. The manufacturing method of a microstructure according to claim 29,
wherein the external dimension of the first resist mask is changed by increasing the external dimension of the first resist mask; and
wherein the external dimension of the first resist mask is increased by controlling a quantity of light for exposing a photoresist in a photolithography process for forming the first resist mask.

35. The manufacturing method of a microstructure according to claim 29,
wherein the external dimension of the first resist mask is changed by increasing the external dimension of the first resist mask;
wherein the first resist mask is formed of a positive resist mask; and
wherein the external dimension of the first resist mask is increased by reducing a quantity of light for exposing a photoresist or reducing an exposure time in a photolithography process for forming the first resist mask.

36. The manufacturing method of a microstructure according to claim 29,
wherein the external dimension of the first resist mask is changed by increasing the external dimension of the first resist mask;
wherein the first resist mask is formed of a negative resist mask; and
wherein the external dimension of the first resist mask is increased by increasing a quantity of light for exposing a photoresist or increasing an exposure time in a photolithography process for forming the first resist mask.

37. The manufacturing method of a microstructure according to claim 29, wherein the first sacrificial layer or the second sacrificial layer is formed to contain one or more of titanium, aluminum, molybdenum, tungsten, tantalum, and silicon.

38. A manufacturing method of a microelectromechanical system, comprising a microstructure manufactured by the method according to claim 29, and a transistor over an insulating substrate, wherein the microstructure and the transistor are electrically connected to each other.

* * * * *